United States Patent
Lin et al.

(10) Patent No.: US 11,656,181 B2
(45) Date of Patent: May 23, 2023

(54) INSPECTION APPARATUS AND INSPECTION METHOD FOR INSPECTING LIGHT-EMITTING DIODES

(71) Applicant: Industrial Technology Research Institute, Hsinchu (TW)

(72) Inventors: Yan-Rung Lin, Hsinchu (TW); Chih-Hsiang Liu, Hsinchu County (TW); Chung-Lun Kuo, New Taipei (TW); Hsiang-Chun Wei, Hsinchu (TW); Yeou-Sung Lin, Changhua County (TW); Chieh-Yi Lo, Kaohsiung (TW)

(73) Assignee: Industrial Technology Research Institute, Hsinchu (TW)

( * ) Notice: Subject to any disclaimer, the term of this patent is extended or adjusted under 35 U.S.C. 154(b) by 325 days.

(21) Appl. No.: 17/135,874

(22) Filed: Dec. 28, 2020

(65) Prior Publication Data
US 2021/0231570 A1 Jul. 29, 2021

Related U.S. Application Data

(63) Continuation-in-part of application No. 16/231,607, filed on Dec. 24, 2018, now Pat. No. 11,002,783.

(30) Foreign Application Priority Data

Dec. 21, 2018 (TW) .................................. 107146378

(51) Int. Cl.
*G01N 21/66* (2006.01)
*G01N 21/88* (2006.01)

(52) U.S. Cl.
CPC ......... *G01N 21/66* (2013.01); *G01N 21/8806* (2013.01); *G01N 2201/062* (2013.01)

(58) Field of Classification Search
CPC ..... G01R 29/14; G01R 31/01; G01R 31/2635
See application file for complete search history.

(56) References Cited

U.S. PATENT DOCUMENTS

| | | | |
|---|---|---|---|
| 5,394,100 A | 2/1995 | Bohler et al. | |
| 2013/0027543 A1* | 1/2013 | Boeykens | G01R 31/2656 348/92 |

(Continued)

FOREIGN PATENT DOCUMENTS

| | | |
|---|---|---|
| CN | 104422817 | 3/2015 |
| CN | 109919908 | 6/2019 |

(Continued)

OTHER PUBLICATIONS

"Office Action of Taiwan Counterpart Application", dated Nov. 3, 2021, p. 1-p. 3.

*Primary Examiner* — Alvaro E Fortich
*Assistant Examiner* — Zannatul Ferdous
(74) *Attorney, Agent, or Firm* — JCIPRNET

(57) ABSTRACT

An inspection apparatus for inspecting a light-emitting diode wafer is provided. The inspection apparatus includes a Z-axis translation stage, a sensing probe, a height measurement module, a carrier, an illumination light source, and a processing device. The sensing probe is integrated with the Z-axis translation stage. The Z-axis translation stage is adapted to drive the sensing probe to move in a Z axis. The sensing probe includes a photoelectric sensor, a beam splitter, and a photoelectric sensing structure. One of the photoelectric sensor of the sensing probe and the height measurement module is adapted to receive a light beam penetrating the beam splitter, and the other one of the photoelectric sensor of the sensing probe and the height measurement module is adapted to receive a light beam reflected by the beam splitter. The carrier is configured to carry the light-emitting diode wafer. The illumination light (Continued)

source is configured to emit an illumination beam to irradiate the light-emitting diode wafer. An inspection method for inspecting light-emitting diodes is also provided.

24 Claims, 40 Drawing Sheets

(56) References Cited

U.S. PATENT DOCUMENTS

| | | | |
|---|---|---|---|
| 2015/0123667 A1 | 5/2015 | Solarz | |
| 2020/0335847 A1* | 10/2020 | Säily | ............. H01Q 21/205 |
| 2020/0371152 A1 | 11/2020 | Lin et al. | |

FOREIGN PATENT DOCUMENTS

| | | |
|---|---|---|
| TW | M385791 | 8/2010 |
| TW | M447988 | 3/2013 |
| TW | 201411123 | 3/2014 |
| TW | I437236 | 5/2014 |
| TW | I699846 | 7/2020 |
| TW | 202034553 | 9/2020 |

* cited by examiner the variation of the charge, the electric field or the voltage across the media layer the variation of the charge, the electric field or the voltage across the media layer

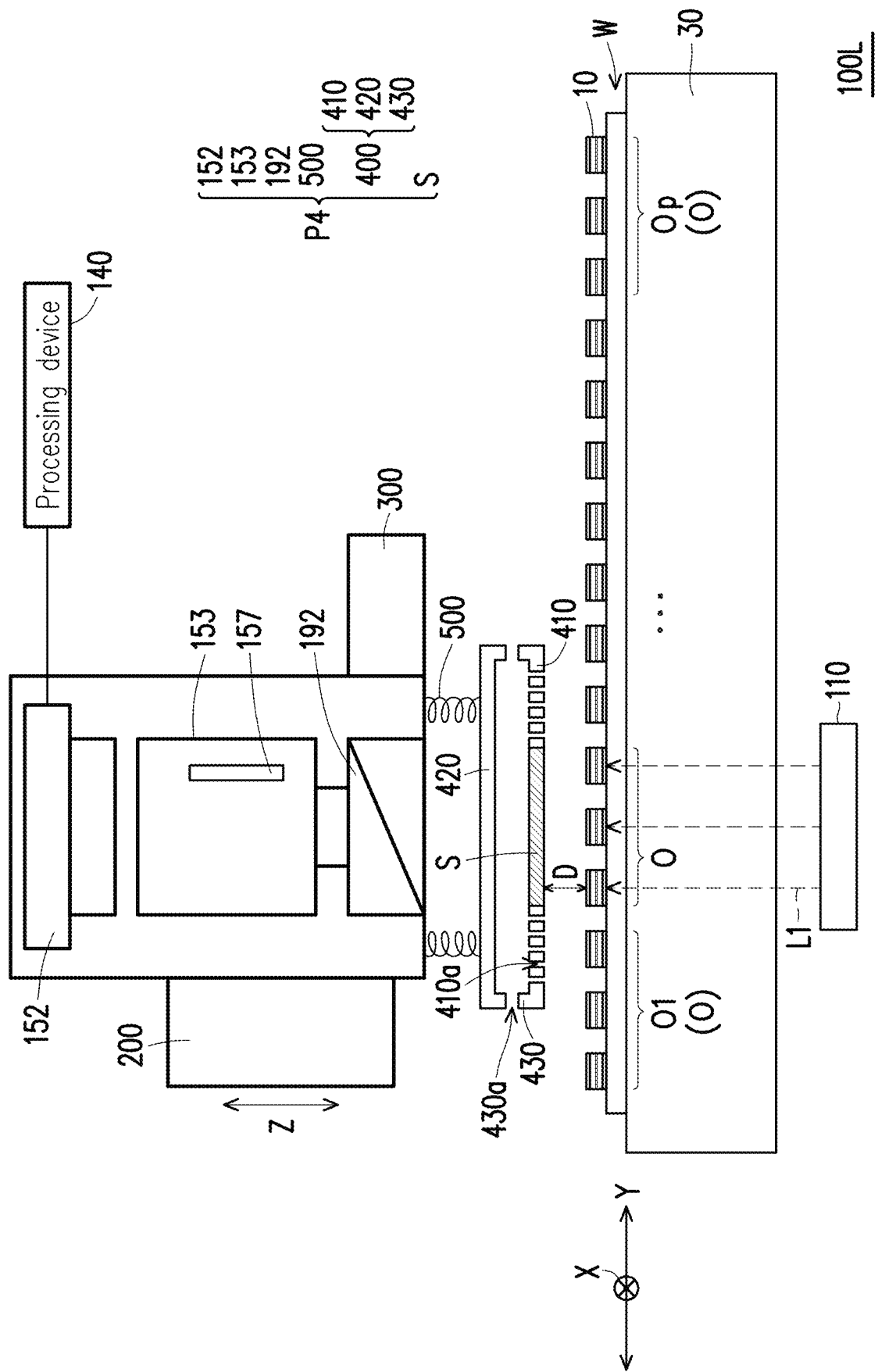

```
                                                                    ┌─S21
┌─────────────────────────────────────────────────────────────────────┐
│   performing a pre-scanning action to find relative height information of a  │
│ surface of a light-emitting diode wafer and respectively obtaining 1$^{st}$ relative │
│ height information to m$^{th}$ relative height information corresponding to a 1$^{st}$ │
│    scan region to a m$^{th}$ scan region of the light-emitting diode wafer    │
└─────────────────────────────────────────────────────────────────────┘
                                      │
                                      ▼                             ┌─S22
┌─────────────────────────────────────────────────────────────────────┐
│  measuring a to-be-inspected region: allowing a height measurement module │
│ to measure a 1$^{st}$ real-time distance between a photoelectric sensing structure │
│  of a sensing probe and the to-be-inspected region of the light-emitting diode │
│   wafer; allowing a Z-axis translation stage to adjust a distance between the │
│    photoelectric sensing structure of the sensing probe and the to-be-inspected │
│ region of the light-emitting diode wafer to a target distance according to the 1$^{st}$ │
│    real-time distance; and allowing the sensing probe to measure the to-be │
│  -inspected region of the light-emitting diode wafer when the target distance │
│  between the photoelectric sensing structure of the sensing probe and the to-be │
│         -inspected region of the light-emitting diode wafer is kept          │
└─────────────────────────────────────────────────────────────────────┘
                                      │
                                      ▼                             ┌─S23
┌─────────────────────────────────────────────────────────────────────┐
│    allowing the target distance to be reached between the photoelectric sensing │
│      structure of the sensing probe and a next to-be-inspected region of the │
│    light-emitting diode wafer: allowing the Z-axis translation stage to adjust a │
│    distance between the photoelectric sensing structure of the sensing probe and │
│ the next to-be-inspected region of the light-emitting diode wafer to the target │
│ distance according to at least two of the 1$^{st}$ relative height information to the │
│                        m$^{th}$ relative height information                        │
└─────────────────────────────────────────────────────────────────────┘
                                      │
                                      ▼                             ┌─S24
┌─────────────────────────────────────────────────────────────────────┐
│    allowing the sensing probe to measure the next to-be-inspected region of the │
│    light-emitting diode wafer when the target distance between the photoelectric │
│   sensing structure of the sensing probe and the next to-be-inspected region │
│                   of the light-emitting diode wafer is kept                   │
└─────────────────────────────────────────────────────────────────────┘
```

FIG. 29

S31 — measuring a 1$^{st}$ to-be-inspected region: allowing a height measurement module to measure a 1$^{st}$ real-time distance between a photoelectric sensing structure of a sensing probe and the 1$^{st}$ to-be-inspected region of a light-emitting diode wafer; allowing a Z-axis translation stage to adjust a distance between the photoelectric sensing structure of the sensing probe and the 1$^{st}$ to-be-inspected region of the light-emitting diode wafer to a target distance according to the 1$^{st}$ real-time distance; and allowing the sensing probe to measure the 1$^{st}$ to-be-inspected region of the light-emitting diode wafer when the target distance between the photoelectric sensing structure of the sensing probe and the 1$^{st}$ to-be-inspected region of the light-emitting diode wafer is kept S32 — allowing the target distance to be reached between the photoelectric sensing structure of the sensing probe and a next to-be-inspected region of the light-emitting diode wafer: allowing a height measurement module to measure a real-time distance between the photoelectric sensing structure of the sensing probe and the next to-be-inspected region of the light-emitting diode wafer, and allowing a Z-axis translation stage to adjust a distance between the photoelectric sensing structure of the sensing probe and the next to-be-inspected egion of the light-emitting diode wafer to the target distance according to the real-time distance S33 — allowing the sensing probe to measure the next to-be-inspected region of the light-emitting diode wafer when the target distance between the photoelectric sensing structure of the sensing probe and the next to-be-inspected region of the light-emitting diode wafer is kept

FIG. 31

INSPECTION APPARATUS AND INSPECTION METHOD FOR INSPECTING LIGHT-EMITTING DIODES

CROSS-REFERENCE TO RELATED APPLICATION

This application is a continuation-in-part application of and claims the priority benefit of a prior application Ser. No. 16/231,607, filed on Dec. 24, 2018, now pending, which claims the priority benefit of Taiwan application serial no. 107146378, filed on Dec. 21, 2018. The entirety of each of the above-mentioned patent applications is hereby incorporated by reference herein and made a part of this specification.

BACKGROUND

Technical Field

The disclosure relates to an inspection apparatus and an inspection method for inspecting light-emitting diodes.

Description of Related Art

With the development of the light-emitting diode display technology, the size of the light-emitting diode die has been gradually reduced to micrometers (Lim). In case of transferring a significant amount of the light-emitting diodes, high yields of the light-emitting diodes must be ensured to avoid subsequent repair of the back-end products. If the size of the light-emitting diode dies is extremely small, it is almost unlikely to perform the repairing action, which causes defects in the display, affects the process yield, and further poses a negative impact on costs. Therefore, how to screen out the normal function dies, or further screen out the light-emitting diode dies into groups according to a specified criterion is an important inspection technology.

As the overall size of the light-emitting diodes is reduced, the size of the electrodes of the light-emitting diodes is also reduced. Therefore, when detecting the light-emitting diodes, the probe of the inspection apparatus is not easily aligned with the electrodes of the light-emitting diodes, and the tip of the probe needs to have a very small size so as to match the size of the electrodes of the light-emitting diodes. It is not easy to manufacture the probe with a very small tip, and the tip of the probe needs to be in contact with the electrodes of the light-emitting diodes during the inspection process; therefore, the probe is very likely to be damaged. In addition, in a general inspection method, the probe is required to be sequentially in contact with the electrodes of the light-emitting diodes, and thus the inspection process takes time and labor.

SUMMARY

The disclosure provides an inspection apparatus capable of rapidly and accurately inspect a plurality of light-emitting diodes.

An embodiment of the disclosure provides an inspection method for inspecting light-emitting diodes, and the method includes the following steps. A light-emitting diode wafer including a plurality of scan regions is provided. Each of the scan regions has a plurality of light-emitting diodes, the scan regions include m scan regions, the m scan regions include a $1^{st}$ scan region to a $m^{th}$ scan region, and m is a positive integer greater than or equal to 2. The $1^{st}$ scan region to the $m^{th}$ scan region of the light-emitting diode wafer are scanned to respectively obtain $1^{st}$ relative height information to $m^{th}$ relative height information corresponding to the $1^{st}$ scan region to the $m^{th}$ scan region. The light-emitting diode wafer includes a plurality of to-be-inspected regions, each of the to-be-inspected regions includes a plurality of light-emitting diodes, a $1^{st}$ real-time distance between a photoelectric sensing structure of a sensing probe and one of the to-be-inspected regions of the light-emitting diode wafer is measured, and a distance between the photoelectric sensing structure of the sensing probe and the to-be-inspected region of the light-emitting diode wafer is adjusted to a target distance according to the $1^{st}$ real-time distance. An illumination beam is allowed to simultaneously irradiate the light-emitting diodes of the to-be-inspected region to generate a charge distribution, an electric field distribution, or a voltage distribution on the light-emitting diodes of the to-be-inspected region due to a photovoltaic effect caused by the illumination beam. The sensing probe is used to measure the charge distribution, the electric field distribution, or the voltage distribution on the light-emitting diodes of the to-be-inspected region to determine a plurality of electro-optical characteristics of the light-emitting diodes of the to-be-inspected region when the target distance between the photoelectric sensing structure of the sensing probe and the to-be-inspected region of the light-emitting diode wafer is kept. A distance between the photoelectric sensing structure of the sensing probe and a next to-be-inspected region of the light-emitting diode wafer is adjusted to the target distance according to at least two of the $1^{st}$ relative height information to the $m^{th}$ relative height information. The illumination beam is allowed to simultaneously irradiate the light-emitting diodes of the next to-be-inspected region to generate a charge distribution, an electric field distribution, or a voltage distribution on the light-emitting diodes of the next to-be-inspected region due to the photovoltaic effect caused by the illumination beam. The sensing probe is used to measure the charge distribution, the electric field distribution, or the voltage distribution on the light-emitting diodes of the next to-be-inspected region to determine a plurality of electro-optical characteristics of the light-emitting diodes of the next to-be-inspected region when the target distance between the photoelectric sensing structure of the sensing probe and the next to-be-inspected region of the light-emitting diode wafer is kept.

An embodiment of the disclosure further provides an inspection apparatus for inspecting a light-emitting diode wafer. The inspection apparatus includes a Z-axis translation stage, a sensing probe, a height measurement module, a carrier, an illumination light source, and a processing device. The sensing probe is integrated with the Z-axis translation stage, the Z-axis translation stage is adapted to drive the sensing probe to move in a Z axis, and the sensing probe includes a photoelectric sensor, a beam splitter, and a photoelectric sensing structure. One of the photoelectric sensor of the sensing probe and the height measurement module is adapted to receive a light beam penetrating the beam splitter, and the other one of the photoelectric sensor of the sensing probe and the height measurement module is adapted to receive a light beam reflected by the beam splitter. The carrier is configured to carry the light-emitting diode wafer and may move on a plane, an X axis and a Y axis are located on the plane, and the X axis, the Y axis, and the Z axis are perpendicular to one another. The illumination light source is configured to emit an illumination beam to irradiate the light-emitting diode wafer. The light-emitting diode wafer includes a plurality of scan regions, each of the scan regions has a plurality of light-emitting diodes, the scan regions include m scan regions, the m scan regions include a $1^{st}$ scan region to a $m^{th}$ scan region, and m is a positive integer greater than or equal to 2. The height measurement module scans the $1^{st}$ scan region to the $m^{th}$ scan region of the light-emitting diode wafer to respectively obtain $1^{st}$ relative height information to $m^{th}$ relative height information corresponding to the $1^{st}$ scan region to the $m^{th}$ scan region. The light-emitting diode wafer includes a plurality of to-be-inspected regions, and each of the to-be-inspected regions includes a plurality of light-emitting diodes. The height measurement module or the sensing probe measures a $1^{st}$ real-time distance between the photoelectric sensing structure of the sensing probe and one of the to-be-inspected regions of the light-emitting diode wafer, and the Z-axis translation stage adjusts a distance between the photoelectric sensing structure of the sensing probe and the to-be-inspected region of the light-emitting diode wafer to a target distance according to the $1^{st}$ real-time distance. The illumination beam simultaneously irradiates the light-emitting diodes of the to-be-inspected region to generate a charge distribution, an electric field distribution, or a voltage distribution on the light-emitting diodes of the to-be-inspected region due to a photovoltaic effect caused by the illumination beam. The sensing probe measures the charge distribution, the electric field distribution, or the voltage distribution on the light-emitting diodes of the to-be-inspected region when the target distance between the photoelectric sensing structure of the sensing probe and the to-be-inspected region of the light-emitting diode wafer is kept. The processing device determines a plurality of electro-optical characteristics of the light-emitting diodes of the to-be-inspected region according to the charge distribution, the electric field distribution, or the voltage distribution on the light-emitting diodes of the to-be-inspected region measured by the sensing probe. The Z-axis translation stage adjusts a distance between the photoelectric sensing structure of the sensing probe and a next to-be-inspected region of the light-emitting diode wafer to the target distance according to at least two of the $1^{st}$ relative height information to the $m^{th}$ relative height information. The illumination beam simultaneously irradiates the light-emitting diodes of the next to-be-inspected region to generate a charge distribution, an electric field distribution, or a voltage distribution on the light-emitting diodes of the next to-be-inspected region due to the photovoltaic effect caused by the illumination beam. The sensing probe measures the charge distribution, the electric field distribution, or the voltage distribution on the light-emitting diodes of the next to-be-inspected region when the target distance between the photoelectric sensing structure of the sensing probe and the next to-be-inspected region of the light-emitting diode wafer is kept. The processing device determines a plurality of electro-optical characteristics of the light-emitting diodes of the next to-be-inspected region according to the charge distribution, the electric field distribution, or the voltage distribution on the light-emitting diodes of the next to-be-inspected region measured by the sensing probe.

An embodiment of the disclosure further provides an inspection method for inspecting light-emitting diodes, and the method includes the following steps. A light-emitting diode wafer including a plurality of to-be-inspected regions is provided, and each of the to-be-inspected regions has a plurality of light-emitting diodes. A height measurement module is used to measure a $1^{st}$ real-time distance between a photoelectric sensing structure of a sensing probe and one of the to-be-inspected regions of the light-emitting diode wafer, and a distance between the photoelectric sensing structure of the sensing probe and the to-be-inspected region of the light-emitting diode wafer is adjusted to a target distance according to the $1^{st}$ real-time distance. An illumination beam is allowed to simultaneously irradiate the light-emitting diodes of the to-be-inspected region to generate a charge distribution, an electric field distribution, or a voltage distribution on the light-emitting diodes of the to-be-inspected region due to a photovoltaic effect caused by the illumination beam. The sensing probe is used to measure the charge distribution, the electric field distribution, or the voltage distribution on the light-emitting diodes of the to-be-inspected region to determine a plurality of electro-optical characteristics of the light-emitting diodes of the to-be-inspected region when the target distance between the photoelectric sensing structure of the sensing probe and the to-be-inspected region of the light-emitting diode wafer is kept. The height measurement module is used to measure a $n^{th}$ real-time distance between the photoelectric sensing structure of the sensing probe and a next to-be-inspected region of the light-emitting diode wafer, a distance between the photoelectric sensing structure of the sensing probe and the next to-be-inspected region of the light-emitting diode wafer are adjusted to a target distance according to the $n^{th}$ real-time distance. The illumination beam is allowed to simultaneously irradiate the light-emitting diodes of the next to-be-inspected region to generate a charge distribution, an electric field distribution, or a voltage distribution on the light-emitting diodes of the next to-be-inspected region due to the photovoltaic effect caused by the illumination beam. The sensing probe is used to measure the charge distribution, the electric field distribution, or the voltage distribution on the light-emitting diodes of the next to-be-inspected region to determine a plurality of electro-optical characteristics of the light-emitting diodes of the next to-be-inspected region when the target distance between the photoelectric sensing structure of the sensing probe and the next to-be-inspected region of the light-emitting diode wafer is kept.

An embodiment of the disclosure further provides an inspection apparatus for inspecting a light-emitting diode wafer. The inspection apparatus includes a Z-axis translation stage, a sensing probe, a height measurement module, a carrier, an illumination light source, and a processing device. The sensing probe is integrated with the Z-axis translation stage, the Z-axis translation stage is adapted to drive the sensing probe to move in a Z axis, and the sensing probe includes a photoelectric sensor, a beam splitter, and a photoelectric sensing structure. One of the photoelectric sensor of the sensing probe and the height measurement module is adapted to receive a light beam penetrating the beam splitter, and the other one of the photoelectric sensor of the sensing probe and the height measurement module is adapted to receive a light beam reflected by the beam splitter. The carrier is configured to carry the light-emitting diode wafer and may move on a plane, an X axis and a Y axis are located on the plane, and the X axis, the Y axis, and the Z axis are perpendicular to one another. The illumination light source is configured to emit an illumination beam to irradiate the light-emitting diode wafer. The light-emitting diode wafer includes a plurality of to-be-inspected regions, and each of the to-be-inspected regions includes a plurality of light-emitting diodes. The height measurement module measures a $1^{st}$ real-time distance between the photoelectric sensing structure of the sensing probe and one of the to-be-inspected regions of the light-emitting diode wafer, and the Z-axis translation stage adjusts a distance between the photoelectric sensing structure of the sensing probe and the to-be-inspected region of the light-emitting diode wafer to a target distance according to the $1^{st}$ real-time distance. The illumination beam simultaneously irradiates the light-emitting diodes of the to-be-inspected region to generate a charge distribution, an electric field distribution, or a voltage distribution on the light-emitting diodes of the to-be-inspected region due to a photovoltaic effect caused by the illumination beam. The sensing probe measures the charge distribution, the electric field distribution, or the voltage distribution on the light-emitting diodes of the to-be-inspected region when the target distance between the sensing probe and the to-be-inspected region of the light-emitting diode wafer is kept. The processing device determines a plurality of electro-optical characteristics of the light-emitting diodes of the to-be-inspected region according to the charge distribution, the electric field distribution, or the voltage distribution on the light-emitting diodes of the to-be-inspected region measured by the sensing probe. The height measurement module measures a $n^{th}$ real-time distance between the photoelectric sensing structure of the sensing probe and a next to-be-inspected region of the light-emitting diode wafer, and the Z-axis translation stage adjusts a distance between the photoelectric sensing structure of the sensing probe and the next to-be-inspected region of the light-emitting diode wafer to the target distance according to the $n^{th}$ real-time distance. The illumination beam simultaneously irradiates the light-emitting diodes of the next to-be-inspected region to generate a charge distribution, an electric field distribution, or a voltage distribution on the light-emitting diodes of the next to-be-inspected region due to the photovoltaic effect caused by the illumination beam. The sensing probe measures the charge distribution, the electric field distribution, or the voltage distribution on the light-emitting diodes of the next to-be-inspected region when the target distance between the photoelectric sensing structure of the sensing probe and the next to-be-inspected region of the light-emitting diode wafer is kept. The processing device determines a plurality of electro-optical characteristics of the light-emitting diodes of the next to-be-inspected region according to the charge distribution, the electric field distribution, or the voltage distribution on the light-emitting diodes of the next to-be-inspected region measured by the sensing probe.

BRIEF DESCRIPTION OF THE DRAWINGS

FIG. 26A to FIG. 26C illustrate an inspection apparatus 100L and a process for inspecting a light-emitting diode wafer W according to an embodiment of the disclosure.

FIG. 29 is a schematic flow chart of an inspection method for inspecting the light-emitting diodes 10 according to an embodiment of the disclosure.

FIG. 31 is a schematic flow chart of an inspection method for inspecting the light-emitting diodes 10 according to an embodiment of the disclosure.

DESCRIPTION OF THE EMBODIMENTS

Figure 1:
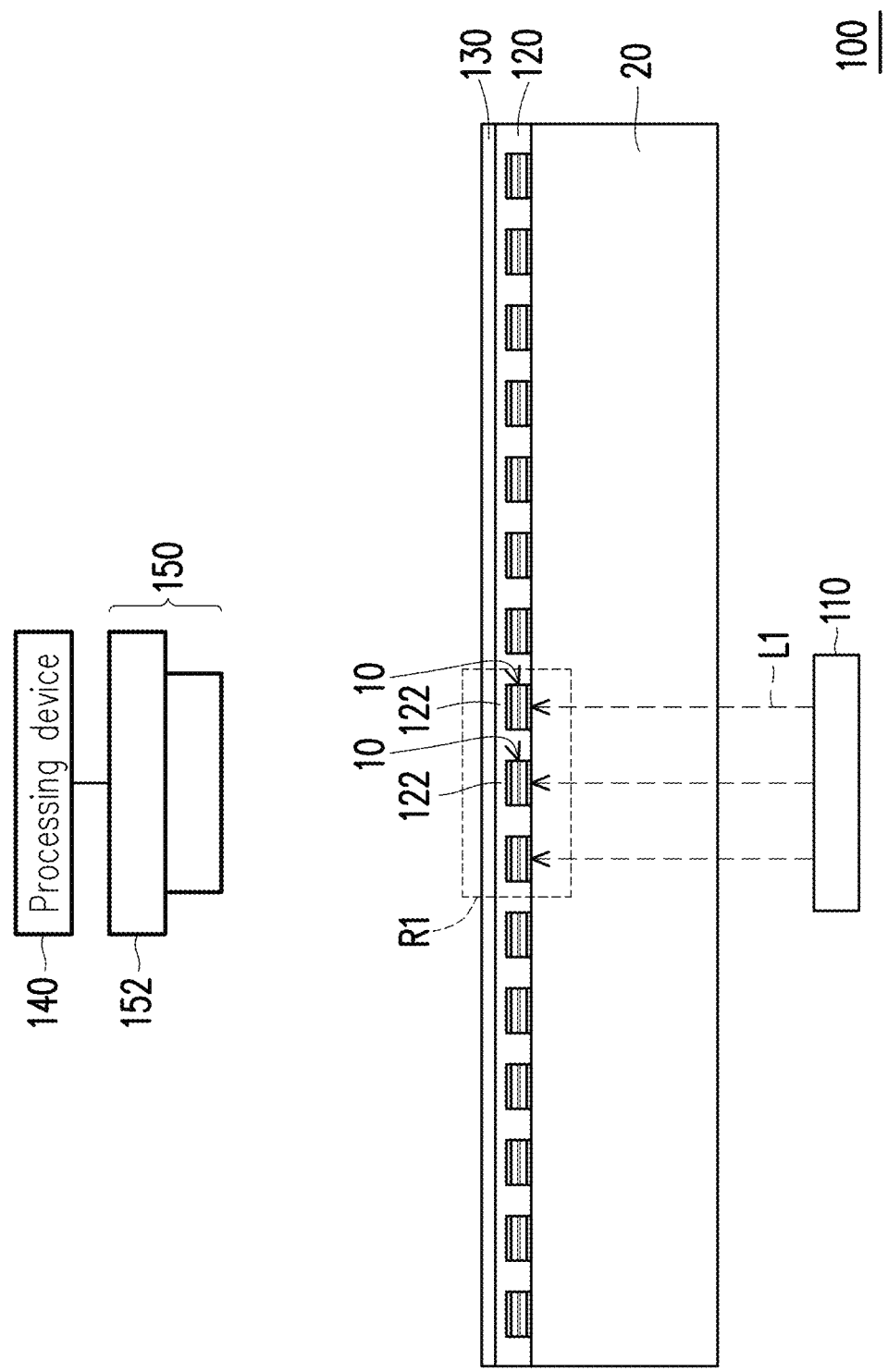
FIG. 1 is a schematic view of an inspection apparatus 100 according to an embodiment of the disclosure.

Descriptions provided in the disclosure are given with reference to the exemplary embodiments illustrated with accompanied drawings, wherein same or similar parts are denoted with same reference numerals. Wherever possible, the same reference numbers are used in the drawings and the description to refer to the same or like parts.

Figure 2:
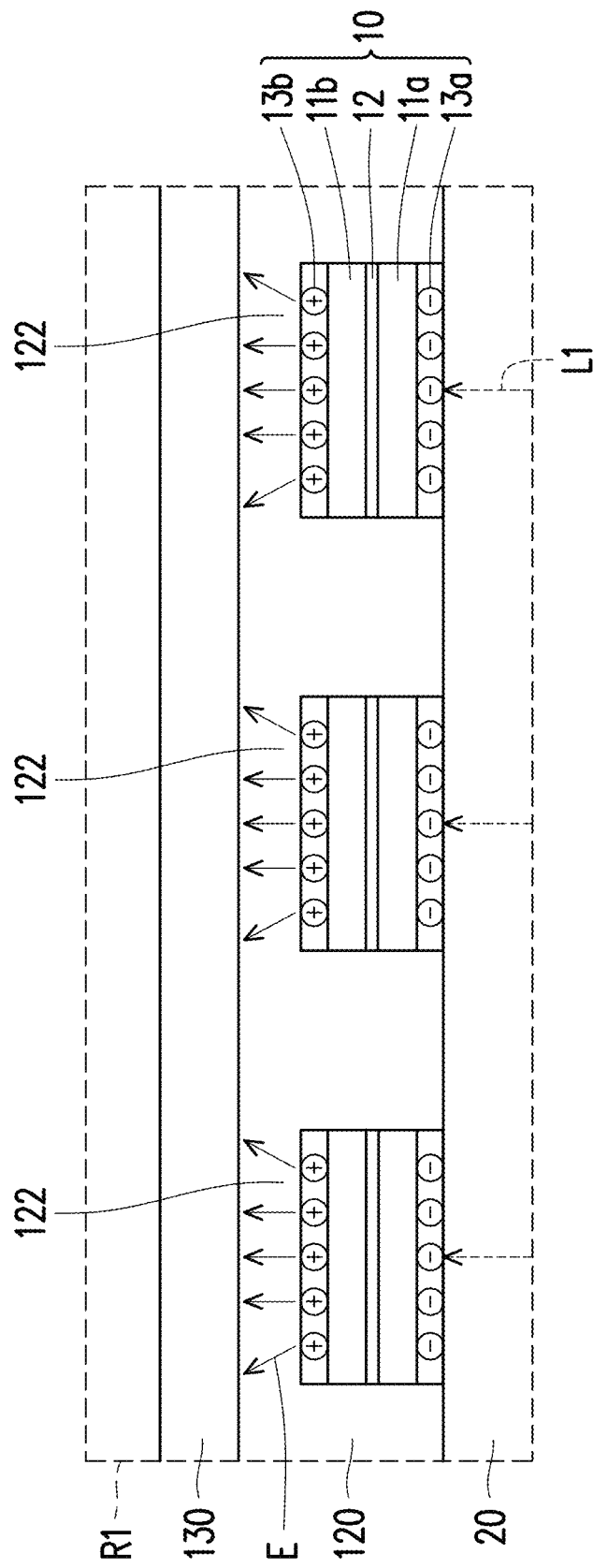
FIG. 2 is a schematic enlarged view of a partial region R1 depicted in FIG. 1.

FIG. 1 is a schematic view of an inspection apparatus 100 according to an embodiment of the disclosure. FIG. 2 is a schematic enlarged view of a partial region R1 depicted in FIG. 1.

With reference to FIG. 1, the inspection apparatus 100 is configured to inspect a plurality of light-emitting diodes 10. The light-emitting diodes 10 may be micro light-emitting diodes (micro LEDs), mini light-emitting diodes (mini LEDs), or light-emitting diodes of other sizes. In the present embodiment, the to-be-inspected light-emitting diodes 10 may be selectively disposed on a carrier 20. For instance, the carrier 20 may be a wafer, which should however not be construed as a limitation in the disclosure.

With reference to FIG. 2, the light-emitting diode 10 includes a first-type semiconductor layer 11a, a second-type semiconductor layer 11b, an active layer 12 disposed between the first-type semiconductor layer 11a and the second-type semiconductor layer 11b, an electrode 13a adjacent to the first-type semiconductor layer 11a, and an electrode 13b adjacent to the second-type semiconductor layer 11b. For instance, in the present embodiment, the two electrodes 13a and 13b of the light-emitting diode 10 may be respectively disposed on two opposite sides of the first-type semiconductor layer 11a. That is, in the present embodiment, the light-emitting diode 10 is a vertical light-emitting diode, for instance. This should not be construed as a limitation in the disclosure; according to other embodiments, the light-emitting diode 10 may also be a horizontal light-emitting diode, a flip-chip light-emitting diode, or a light-emitting diode of other types.

With reference to FIG. 1 and FIG. 2, in the present embodiment, the inspection apparatus 100 may selectively include a medium layer 120. The medium layer 120 is adapted to be affected by an electric field E (shown in FIG. 2), a charge, or a voltage to induce a corresponding optical property change. The medium layer 120 is disposed on or over the light-emitting diodes 10. The medium layer 120 adjoins the light-emitting diodes 10 and has a plurality of inspection regions 122 respectively corresponding to the light-emitting diodes 10. For instance, each inspection region 122 may refer to a portion of the medium layer 120 overlapped with a corresponding light-emitting diode 10. Alternatively, in the present embodiment, the medium layer 120 may be directly disposed on the light-emitting diodes 10. The medium layer 120 is, for instance, formed on the light-emitting diodes 10 through coating. Namely, the medium layer 120 can selectively be in contact with the light-emitting diodes 10. This should however not be construed as a limitation in the disclosure; according to other embodiments, the medium layer 120 may also be formed on the light-emitting diodes in another manner, and it is also likely for the medium layer 120 not to be direct contact with the light-emitting diodes. In brief, the medium layer 120 should be disposed at a location where can be affected by the electric field E, the charge, or the voltage to induce the corresponding optical property change.

In the present embodiment, the inspection apparatus 100 may selectively include a conductive layer 130. The conductive layer 130 is disposed on the medium layer 120, and the medium layer 120 is located between the conductive layer 130 and the light-emitting diodes 10. In the present embodiment, the conductive layer 130 is transparent and is selectively connected to electrodes 13a of the light-emitting diode 10, which should however not be construed as a limitation in the disclosure.

The inspection apparatus 100 includes an illumination light source 110. The illumination light source 110 is configured to emit an illumination beam L1, so as to simultaneously irradiate the light-emitting diodes 10. The wavelength of the illumination beam L1 is less than or equal to a light-emitting wavelength of the light-emitting diodes 10. The illumination beam L1 can induce photovoltaic effects of the light-emitting diodes 10. In the present embodiment, the illumination beam L1 may selectively have uniform light intensity. Namely, the irradiated amount of each light-emitting diode 10 simultaneously irradiated by the illumination beam L1 is substantially the same, which should however not be construed as a limitation in the disclosure.

In the present embodiment, the illumination light source 110 may be selectively disposed below the light-emitting diodes 10, and the illumination beam L1 can irradiate the light-emitting diodes 10 from the surfaces of the light-emitting diodes 10, which face the illumination light source 110. This should however not be construed as a limitation in the disclosure; according to other embodiments, the illumination light source 110 can also be disposed at another proper location, and the illumination beam L1 may also irradiate the light-emitting diodes 10 from the front surface, the side surfaces, or both of the light-emitting diodes 10.

In the present embodiment, the inspection apparatus 100 may also include a processing device 140 and an optical image capturing portion 150. The optical image capturing portion 150 at least includes an optical-electro sensor 152 and an image capturing light source 154 (shown in at least one of FIG. 6A to FIG. 8B), wherein the image capturing light source 154 emits an image capturing beam L2 (shown in at least one of FIG. 6A to FIG. 8B) to irradiate the medium layer 120. The optical-electro sensor 152 and the processing device 140 are electrically connected. For instance, in the present embodiment, the optical image capturing portion 150 may include a camera and an image capturing lens assembly, and the processing device 140 may be a computer, which should however not be construed as a limitation in the disclosure.

The processing device 140 determines a plurality of electro-optical characteristics of the light-emitting diodes 10 through the charge distribution, the electric field distribution, or the voltage distribution on the light-emitting diodes 10 simultaneously irradiated by the illumination beam L1. For instance, in the present embodiment, when the illumination beam L1 simultaneously irradiate the light-emitting diodes 10, charges are accumulated on the electrode 13b of at least one of the light-emitting diodes 10, and the accumulated charges induce the electric field E and the voltage. The medium layer 120 is affected by the electric field E, the charge, or the voltage and thus induces physical or chemical changes, which leads to the corresponding optical property change to the medium layer 120. The optical-electro sensor 152 obtains an image of inspection regions 122 of the medium layer 120 corresponding to the light-emitting diodes 10 when the illumination beam L1 simultaneously irradiates the light-emitting diodes 10. The processing device 140 determines electro-optical characteristics of the light-emitting diodes 10 according to the image.

For instance, if the light-emitting diode 10 is operated normally, due to the photovoltaic effect, a voltage difference is generated between the two electrodes 13a and 13b of the functional light-emitting diode 10, and the electric field E may be generated between the electrode 13b of the light-emitting diode 10 and the conductive layer 130 located on the medium layer 120; affected by the electric field E, the charge, or the voltage, a portion of the image of the inspection regions 122 of the medium layer 120 corresponding to the functional light-emitting diode 10 is a portion of a predicted image (e.g., bright zone). By contrast, if the light-emitting diode 10 cannot work, no voltage can be generated between the electrodes 13a and 13b of the non-functional light-emitting diode 10, and no electric field E, charge, or voltage is generated between the electrode 13b of the non-functional light-emitting diode 10 and the conductive layer 130 located on the medium layer 120. At this time, a portion of the image of the inspection regions 122 of the medium layer 120 corresponding to the non-functional light-emitting diode 10 is a portion of an unpredicted image (e.g., dark zone). Thereby, it can be determined whether the light-emitting diode 10 is functional.

It should be mentioned that in the aforesaid inspection method, the illumination light source 110 simultaneously irradiates a plurality of light-emitting diodes 10, and the optical-electro sensor 152 simultaneously obtains the image of the inspection regions 122 of the medium layer 120. Unlike the normal inspection apparatus, the inspection apparatus 100 need not have the probe sequentially contacted with the electrodes 13b of the light-emitting diodes 10. Accordingly, a significant amount of light-emitting diodes 10 can be rapidly inspected. Moreover, in said inspection method, the steps of irradiating the light-emitting diodes 10 and obtaining the image of the inspection regions 122 do not require the actual contact with the light-emitting diodes 10; therefore, the possibility of damaging the light-emitting diodes 10 during the inspection can be reduced. Besides, the probe used when applying the normal inspection method is required to be aligned to the electrodes of the light-emitting diodes, and thus the tip of the probe may be worn. Said issue can be prevented in the disclosure.

Figure 3:
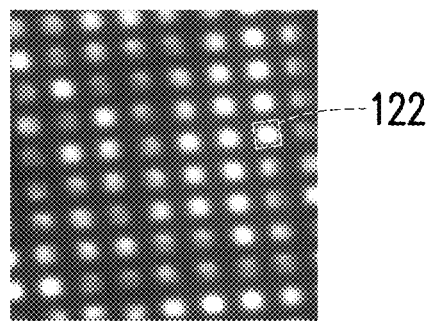
FIG. 3 is an image of a medium layer 120 according to an embodiment of the disclosure.

FIG. 3 shows an image of the medium layer 120 according to an embodiment of the disclosure. With reference to FIG. 2 and FIG. 3, in this embodiment, during the inspection process of the light-emitting diodes 10, the medium layer 120 may be pixelated by the electrodes 13b of the plurality of light-emitting diodes 10. In other words, the plurality of inspection regions 122 of the medium layer 120 can be regarded as a plurality of pixels that can indicate the electro-optical characteristics of the plurality of light-emitting diodes 10, respectively.

Note that the method of inspecting the light-emitting diodes 10 and the inspection apparatus 100 not only can inspect whether the light-emitting diodes 10 normally function but also can be applied to inspect the electro-optical characteristics of the light-emitting diodes 10. For instance, due to the manufacturing variations, the electro-optical characteristics of the light-emitting diodes 10 are different; at this time, when the illumination beam L1 with the same intensity is applied to irradiate the light-emitting diodes 10, the electric fields, the charges, or the voltages generated by the light-emitting diodes 10 are different, and thus the changes of optical properties of the medium layer 120 are in different degrees; as such, the brightness or the colors of portions of the image of the inspection regions 122 respectively corresponding to the light-emitting diodes 10 are different. Thereby, whether the electro-optical characteristics of the light-emitting diodes 10 are good or not, and the light-emitting diodes 10 may then be classified.

Figure 4:
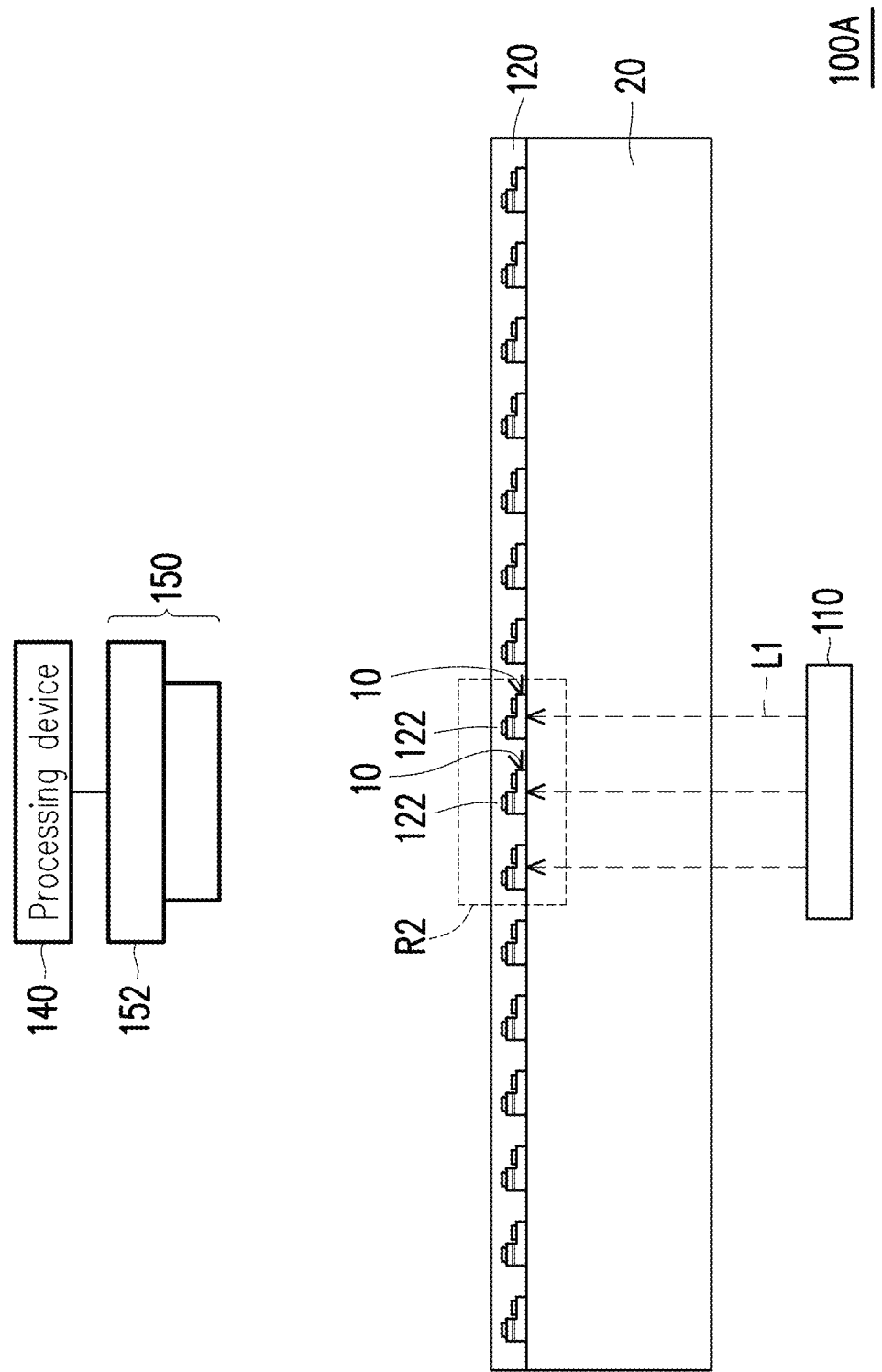
FIG. 4 is a schematic view of an inspection apparatus 100A according to another embodiment of the disclosure.
Figure 5:
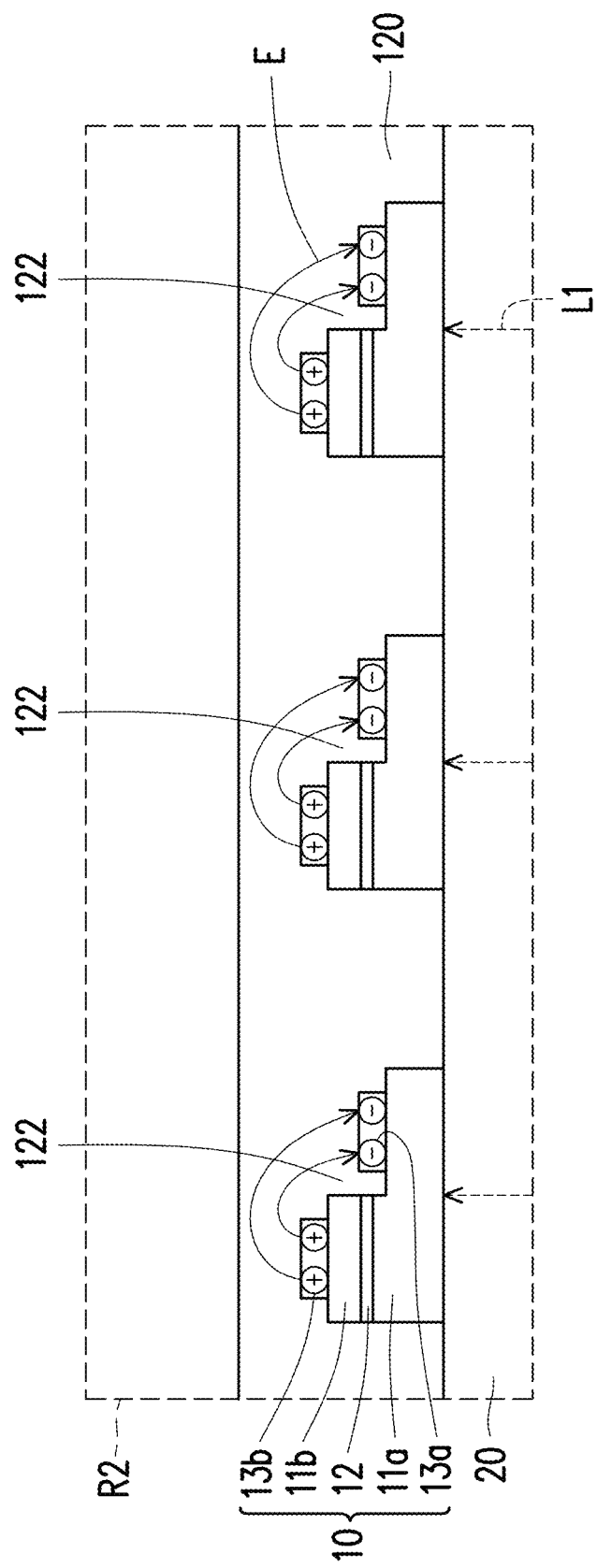
FIG. 5 is a schematic enlarged view of a partial region R2 depicted in FIG. 4.

FIG. 4 is a schematic view of an inspection apparatus 100A according to another embodiment of the disclosure. FIG. 5 is a schematic enlarged view of the partial region R2 depicted in FIG. 4. The inspection apparatus 100A and a method for inspecting the same provided in the present embodiment are similar to the inspection apparatus 100 and the method for inspecting the same, while the difference therebetween lies in that the inspection apparatus 100A is adapted to inspect the horizontal light-emitting diodes 10. The two electrodes 13a and 13b of the horizontal light-emitting diode 10 are located on the same side of the first-type semiconductor layer 11a. In the present embodiment, the medium layer 120 may be affected by the electric field E, the charge, or the voltage generated by the two electrodes 13a and 13b of the horizontal light-emitting diode 10, and there may be no conductive layer 130 on the medium layer 120. According to the embodiment depicted in FIG. 4, the optical image capturing portion 150 of the inspection apparatus 100A also includes an image capturing light source 154 (shown in at least one of FIG. 6A to FIG. 8B), wherein the image capturing light source 154 emits the image capturing beam L2 (depicted in at least one of FIG. 6A to FIG. 8B) to irradiate the medium layer 120.

The medium layer 120 provided in any of the previous embodiments may be a film layer capable of affecting by the electric field E, the charge, or the voltage to experience the physical or chemical changes, which induces the corresponding optical property change. For instance, the medium layer 120 may be a liquid crystal (LC) layer, an electrochromic (EC) layer, an electro-wetting layer, a suspended particle device (SPD) layer, voltage-sensing nanoparticles, or a voltage sensitive dye, a quantum dot material or other materials. Here, the LC layer may be a polymer dispersed liquid crystal (PDLC) layer, a twisted nematic liquid crystal (TNLC) layer, a super twisted nematic (STN) liquid crystal layer, a vertical alignment (VA) liquid crystal layer, or a liquid crystal layer in another form.

The inspection method is elaborated hereinafter, given that the medium layer 120A is an LC layer, and the medium layer 120B is an electrochromic layer or a voltage sensitive dye, for instance.

Figure 6A:
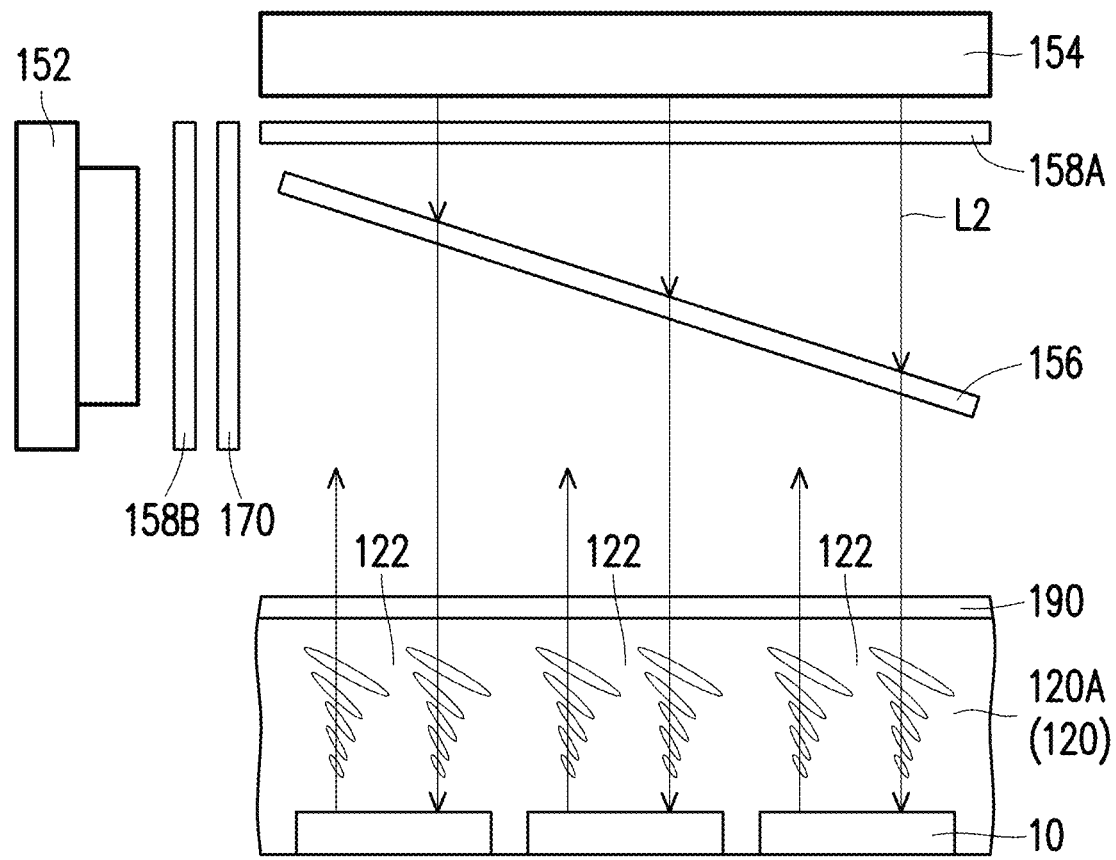
FIG. 6A is a schematic view of a plurality of light-emitting diodes 10, a medium layer 120A, and an optical image capturing portion 150 according to an embodiment of the disclosure.
Figure 6B:
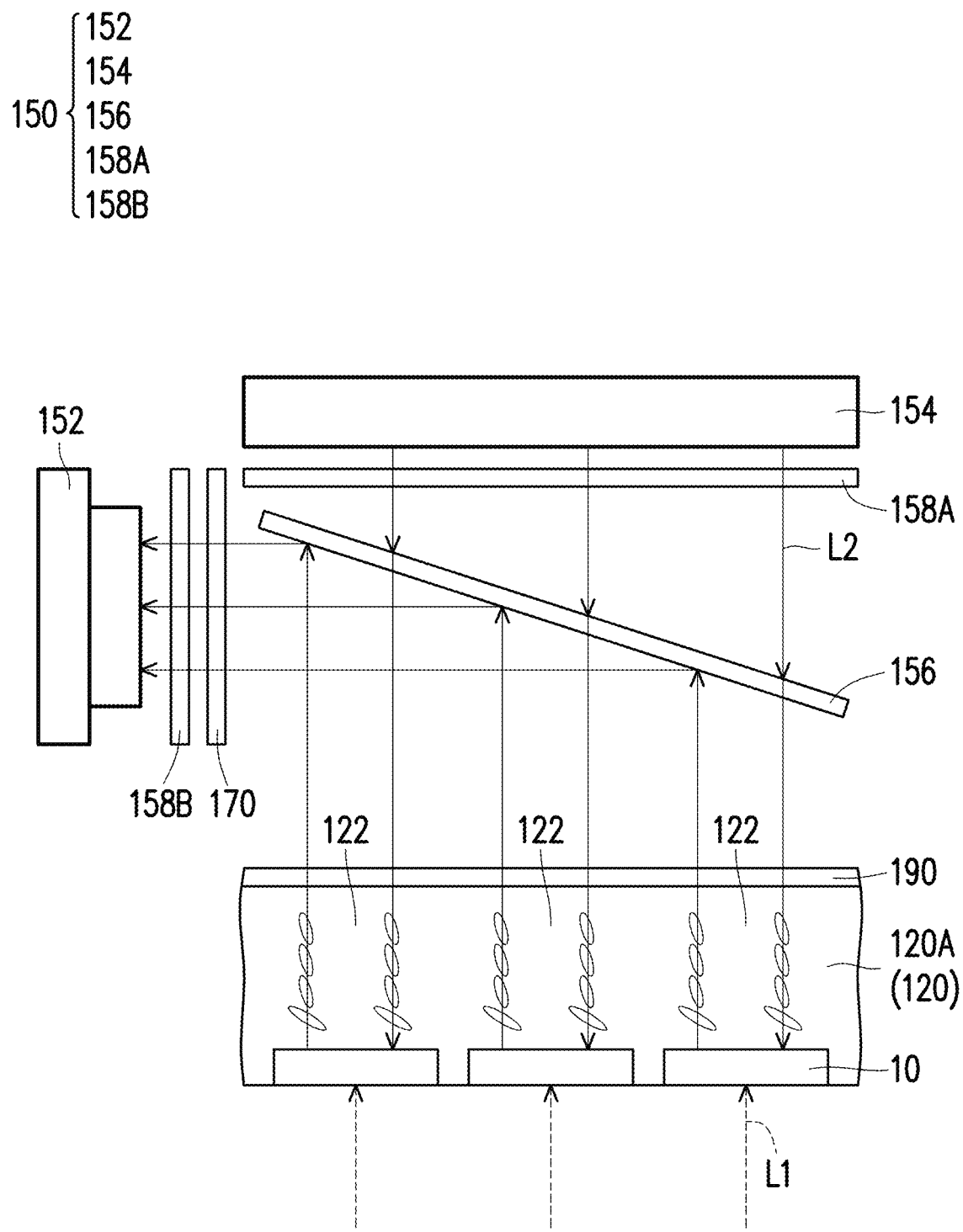
FIG. 6B is a schematic view of the light-emitting diodes 10, the medium layer 120A, and the optical image capturing portion 150 according to an embodiment of the disclosure.

FIG. 6A and FIG. 6B are schematic views of the light-emitting diodes 10, the medium layer 120A, and the optical image capturing portion 150 according to an embodiment of the disclosure, where the light-emitting diodes 10 depicted in FIG. 6A are not irradiated by the illumination beam L1, and the light-emitting diodes 10 depicted in FIG. 6B are irradiated by the illumination beam L1.

With reference to FIG. 6A and FIG. 6B, in the present embodiment, the medium layer 120A is a liquid crystal layer (including but not limited to twisted nematic liquid crystal). The optical image capturing portion 150 not only includes the optical-electro sensor 152 and an imaging lens but also selectively includes an image capturing light source 154, a first polarizing devices 158A and a second polarizing device 158B. The image capturing light source 154 is configured to emit the image capturing beam L2. The first polarizing device 158A is used to control the polarization direction of the image capturing light beam L2 emitting by the image capturing light source 154, and the second polarizing device 158B is used to control the polarization direction of the image capturing light beam L2 accepted by the optical-electro sensor 152. A transmission axis of the first polarizing devices 158A and a transmission axis of the second polarizing devices 158B are perpendicular to each other. The first polarizing device 158A is disposed on the medium layer 120A. The medium layer 120A is located between the first polarizing device 158A and the light-emitting diodes 10.

After the light-emitting diodes 10 are irradiated by the illumination beam L1, due to the photovoltaic effect, charges are accumulated on the electrodes of the light-emitting diodes 10 (not shown in FIG. 6A and FIG. 6B), thus inducing the electric field (not shown in FIG. 6A and FIG. 6B) and allowing liquid crystal molecules in the liquid crystal layer (i.e., the medium layer 120A) to reorient. The image capturing light source 154 emits the image capturing beam L2. The image capturing beam L2 passes through the first polarizing device 158A in front of the image capturing light source 154, above the medium layer 120A and is polarized. The polarized image capturing beam L2 sequentially passes through the liquid crystal layer (i.e., the medium layer 120A), is reflected by the light-emitting diodes 10 or other components (e.g., an upper electrode), and is transmitted to the second polarizing device 158B. The first polarizing device 158A and the second polarizing device 158B can be crossed. Their transmission axes are oriented perpendicular to each other. An alignment layer 190 is dispose beside the liquid crystal layer, and there is a specific angle between the transmission axis of the first polarizing device 158A and a rubbing direction of the alignment layer 190. For example, the specific angle may be 45 degree. If the optical image capturing portion 150 can be response to the illumination beam L1, in order to enhance the quality of the optical image, the image capturing beam L2 will pass through a long pass filter 170 before accepting by the optical image capturing portion 150. The long pass filter 170 is disposed in a transmission path of the image capturing beam L2 between the medium layer 120 and the optical-electro sensor 152. For example, in this embodiment, the long pass filter 170 may be disposed between the optical-electro sensor 152 and the beam splitter 156, which is not limited in the disclosure. In another embodiment, the long pass filter 170 may be disposed between the beam splitter 156 and the medium layer 120. Due to the manufacturing variations, the electro-optical characteristics of the light-emitting diodes 10 are different; at this time, the electric fields generated by the light-emitting diodes 10 irradiated by the illumination beam L1 with the same intensity are different, so that the liquid crystal molecules in the inspection regions 122 of the medium layer 120A are reoriented in different levels. That is, the phases of the image capturing beam L2 changed by the inspection regions 122 of the medium layer 120A are different. Hence, when the image capturing beam L2 is again transmitted to the second polarizing device 158B, the intensity distribution of image capturing beam L2 passing through the second polarizing device 158B may be changed. Thereby, the brightness distribution of the image of the inspection regions 122 obtained by the optical-electro sensor 152 may be different, so as to deduce the difference in the electro-optical characteristics of the light-emitting diodes 10 from the image; alternatively, whether the light-emitting diodes 10 are functional and operated normally can be deduced from the image of the inspection regions 122 obtained by the optical-electro sensor 152.

In the present embodiment, the image capturing beam L2 may irradiate the medium layer 120A from the top of the light-emitting diodes 10, and the optical image capturing portion 150 may selectively include a beam splitter 156. The beam splitter 156 is disposed between the image capturing light source 154 and the first polarizing device 158A. The beam splitter 156 can reflect the image capturing beam L2 passing through the medium layer 120A and then passing through the second polarizing device 158B, and the optical-electro sensor 152 can be disposed on the upper-left side or the upper-right side of the light-emitting diodes 10, so as to receive the image capturing beam L2. This should however not be construed as a limitation in the disclosure; according to other embodiments, the image capturing beam L2 may also irradiate the medium layer 120A from the side of the light-emitting diodes 10, and the optical-electro sensor 152 can also be disposed above the light-emitting diodes 10.

Figure 7A:
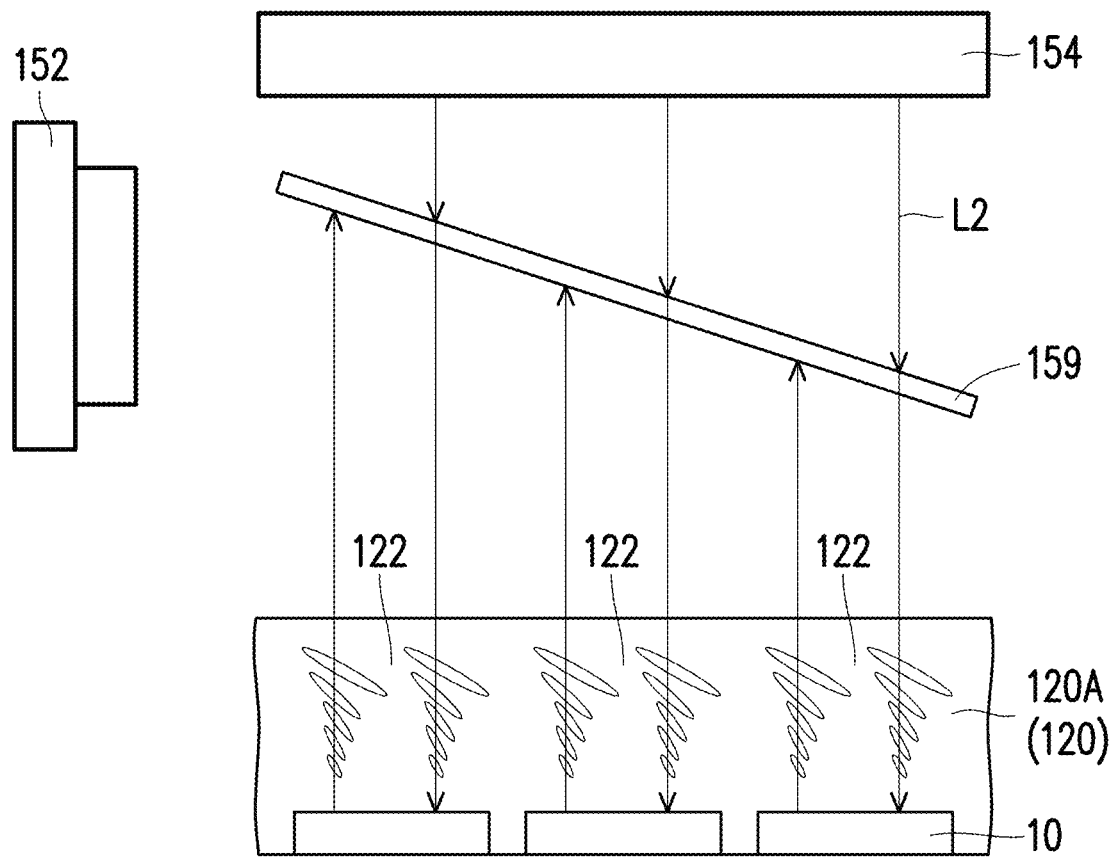
FIG. 7A is a schematic view of the light-emitting diodes 10, the medium layer 120A, and the optical image capturing portion 150 according to another embodiment of the disclosure.
Figure 7B:
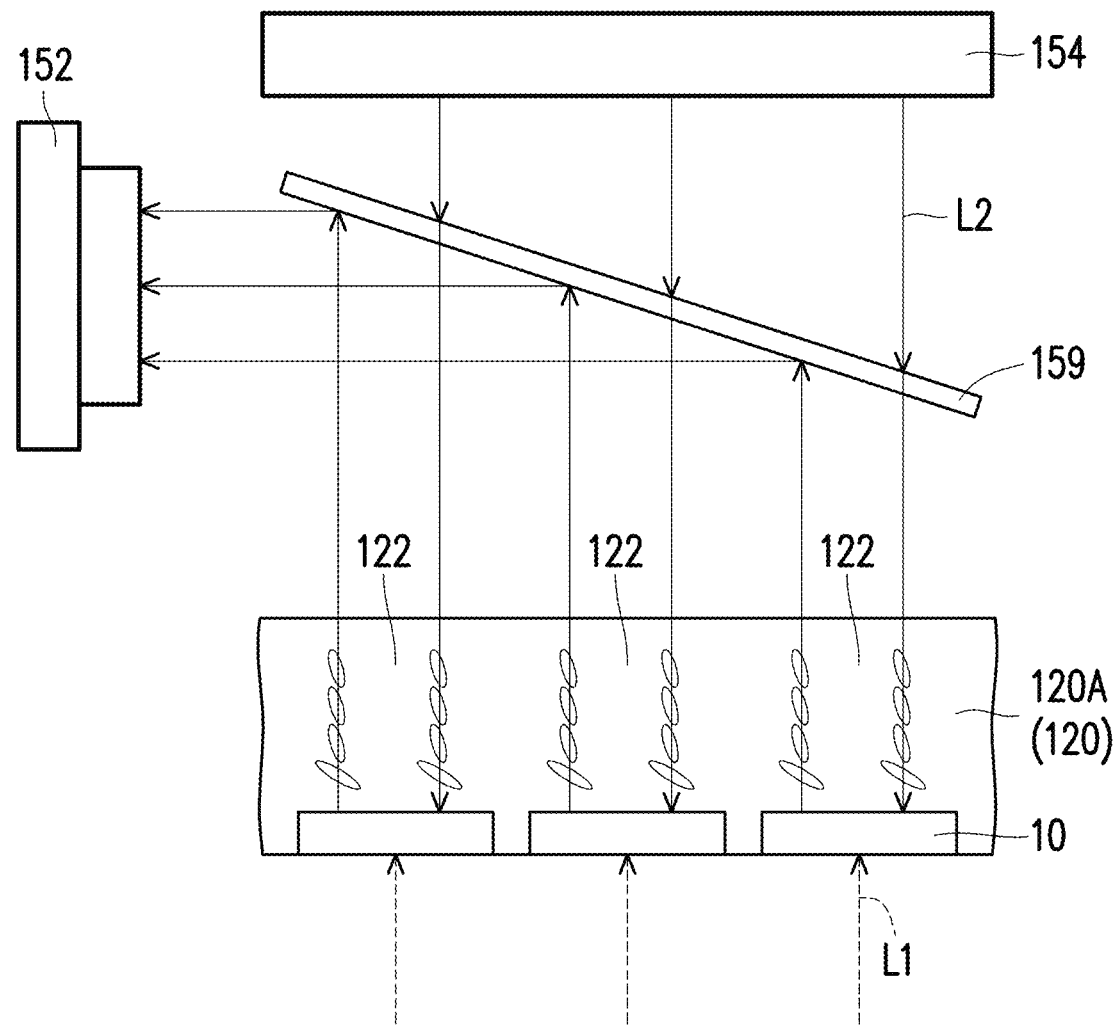
FIG. 7B is a schematic view of a plurality of light-emitting diodes 10, a medium layer 120A, and an optical image capturing portion 150 according to another embodiment of the disclosure.

FIG. 7A and FIG. 7B are schematic views of the light-emitting diodes 10, the medium layer 120A, and the optical image capturing portion 150 according to another embodiment of the disclosure, where the light-emitting diodes 10 depicted in FIG. 7A are not irradiated by the illumination beam L1, and the light-emitting diodes 10 depicted in FIG. 7B are irradiated by the illumination beam L1. The difference between the embodiment depicted in FIG. 7A and FIG. 7B and the embodiment depicted in FIG. 6A and FIG. 6B is in that the optical image capturing portion 150 depicted in FIG. 7A and FIG. 7B includes a polarizing beam splitter 159 which can replace the beam splitter 156, the first polarizing device 158A and the second polarizing device 158B depicted in FIG. 6A and FIG. 6B.

With reference to FIG. 7A and FIG. 7B, specifically, after the light-emitting diodes 10 are irradiated by the illumination beam L1, due to the photovoltaic effect, charges are accumulated on the electrodes of the light-emitting diodes 10 (not shown in FIG. 7A and FIG. 7B), thus inducing the electric field and allowing liquid crystal molecules of the liquid crystal layer (i.e., the medium layer 120A) to reorient. The image capturing light source 154 emits the image capturing beam L2. The image capturing beam L2 passes through the polarizing beam splitter 159 above the medium layer 120A and is polarized. The polarized image capturing beam L2 sequentially passes through the liquid crystal layer (i.e., the medium layer 120A), is reflected by the light-emitting diodes 10 or other components (e.g., an upper electrode), and is again reflected by the polarizing beam splitter 159. Then the polarized image capturing beam L2 is accepted by the optical image capturing portion 150. If the optical image capturing portion 150 can be response to the illumination beam L1, in order to enhance the quality of the image optical image, the image capturing beam L2 will pass through a long pass filter 170 (not shown in FIG. 7A and FIG. 7B) before accepting by the optical image capturing portion 150. Due to the manufacturing variations, the electro-optical characteristics of the light-emitting diodes 10 are different; at this time, the electric fields generated by the light-emitting diodes 10 irradiated by the illumination beam L1 with the same intensity are different, so that the liquid crystal molecules in the inspection regions 122 of the medium layer 120A are reoriented in different levels. That is, the phases of the image capturing beam L2 changed by the inspection regions 122 of the medium layer 120A are different. Hence, when the image capturing beam L2 is again reflected by the polarizing beam splitter 159, the intensity distribution of the image capturing beam L2 reflected by the polarizing beam splitter 159 may be changed. Thereby, the brightness distribution of the image of the inspection regions 122 obtained by the optical-electro sensor 152 may be different, so as to deduce the difference in the electro-optical characteristics of the light-emitting diodes 10 from the image; alternatively, whether the light-emitting diodes 10 are functional and operated normally can be deduced from the image of the inspection regions 122 obtained by the optical-electro sensor 152.

In the present embodiment, the polarizing beam splitter 159 can reflect the image capturing beam L2 passing through the medium layer 120A and again transmitted to the polarizing beam splitter 159, and the optical-electro sensor 152 can be disposed on the upper-left side or the upper-right side of the light-emitting diodes 10, so as to receive the image capturing beam L2 reflected by the polarizing beam splitter 159. This should however not be construed as a limitation in the disclosure; according to other embodiments, the image capturing beam L2 may also irradiate the medium layer 120A from the side of the light-emitting diodes 10, and the optical-electro sensor 152 can also be disposed above the light-emitting diodes 10.

Figure 8A:
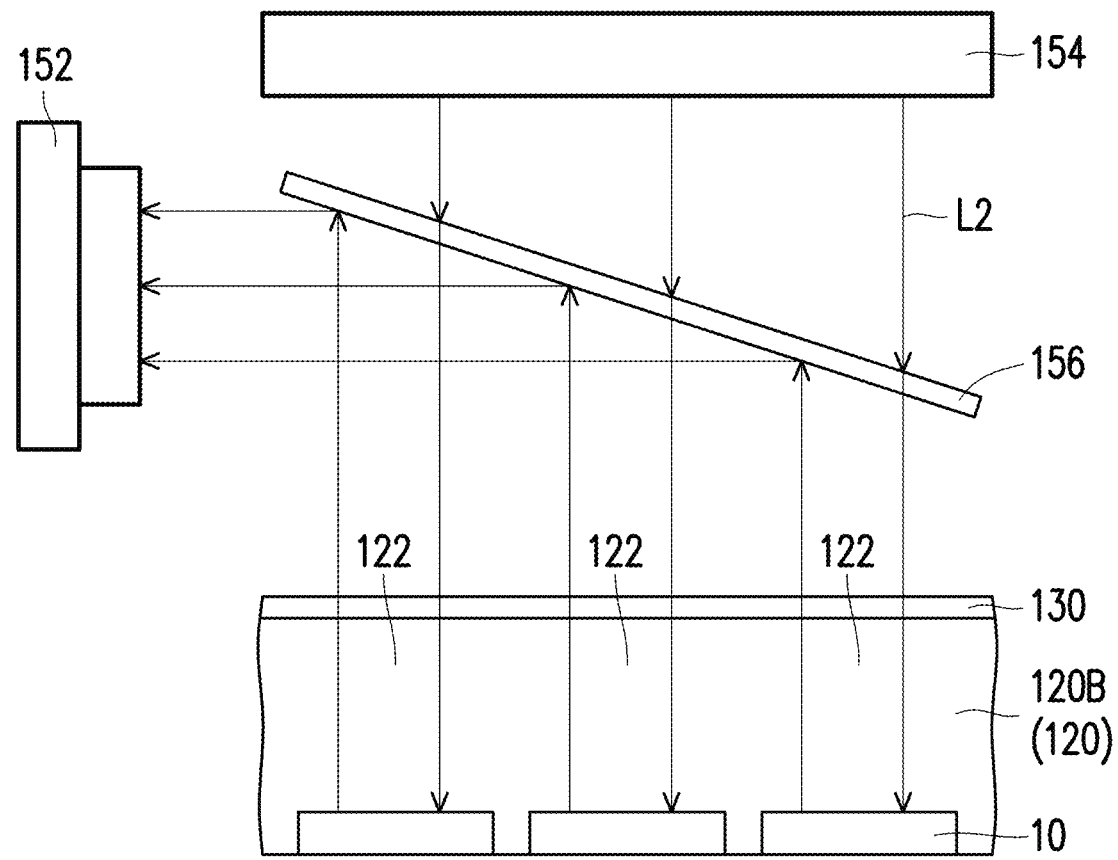
FIG. 8A is a schematic view of the light-emitting diodes 10, the medium layer 120A, and the optical image capturing portion 150 according to still another embodiment of the disclosure.
Figure 8B:
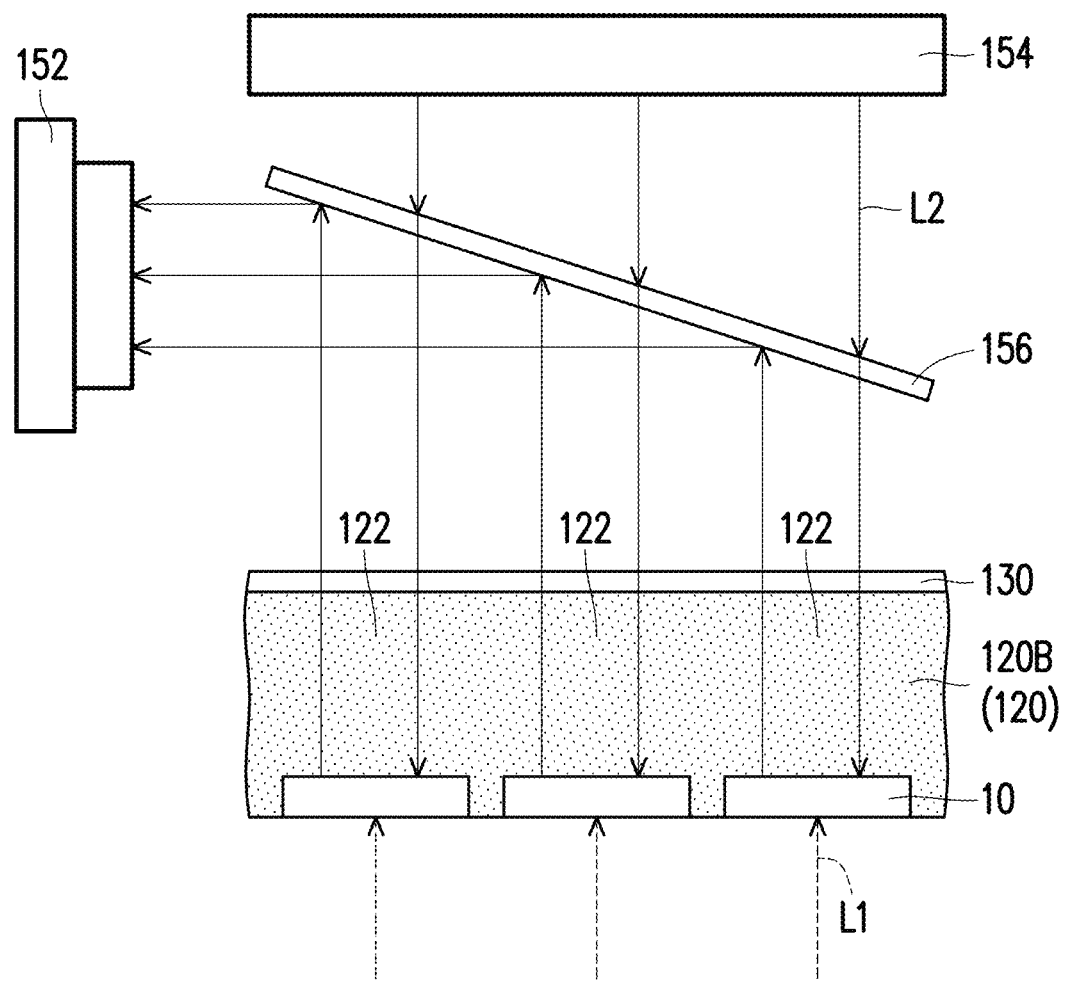
FIG. 8B is a schematic view of the light-emitting diodes 10, the medium layer 120A, and the optical image capturing portion 150 according to still another embodiment of the disclosure.

FIG. 8A and FIG. 8B are schematic views of the light-emitting diodes 10, the medium layer 120B, and the optical image capturing portion 150 according to still another embodiment of the disclosure, wherein the light-emitting diodes 10 depicted in FIG. 8A are not irradiated by the illumination beam L1, and the light-emitting diodes 10 depicted in FIG. 8B are irradiated by the illumination beam L1. The difference between the embodiment depicted in FIG. 8A and FIG. 8B and the embodiment depicted in FIG. 6A and FIG. 6B is in that the medium layer 120B shown in FIG. 8A and FIG. 8B is an electrochromic (EC) layer or a voltage sensitive dye, while the optical image capturing portion 150 depicted in FIG. 8A and FIG. 8B may also include the image capturing light source 154 but may not include the first polarizing device 158A and the second polarizing device 158B.

With reference to FIG. 8A and FIG. 8B, after the light-emitting diodes 10 are irradiated by the illumination beam L1, due to the photovoltaic effect, charges are accumulated on the electrodes of the light-emitting diodes 10 (not shown in FIG. 8A and FIG. 8B), thus inducing the electric field (not shown in FIG. 8A and FIG. 8B) or the voltage, which results in the color change of the EC layer or the voltage sensitive dye (i.e., the medium layer 120B). The image capturing light source 154 emits the image capturing beam L2, so that the optical-electro sensor 152 is allowed to read the color change of the EC layer or the voltage sensitive dye (i.e., the medium layer 120B). Due to the manufacturing variations, the electro-optical characteristics of the light-emitting diodes 10 are different; at this time, the electric fields generated by the light-emitting diodes 10 irradiated by the illumination beam L1 with the same intensity are different, so that the color changes in the inspection regions 122 of the medium layer 120B are in different degrees. The difference in the electro-optical characteristics of the light-emitting diodes 10 and whether the light-emitting diodes 10 normally function and do not fail can be deduced from the color distribution of the light obtained through the optical-electro sensor 152, or the light-emitting diodes 10 can be classified according to the color distribution of the light obtained through the optical-electro sensor 152. If the optical image capturing portion 150 can be response to the illumination beam L1, in order to enhance the quality of the optical image, the image capturing beam L2 will pass through a long pass filter 170 (not shown in FIG. 8A and FIG. 8B) before accepting by the optical image capturing portion 150. In the present embodiment, the optical image capturing portion 150 not only can be a camera but also can be a color analyzer or an image spectrum reading probe that is able to directly read a color coordinate (or a light spectrum).

Figure 9:
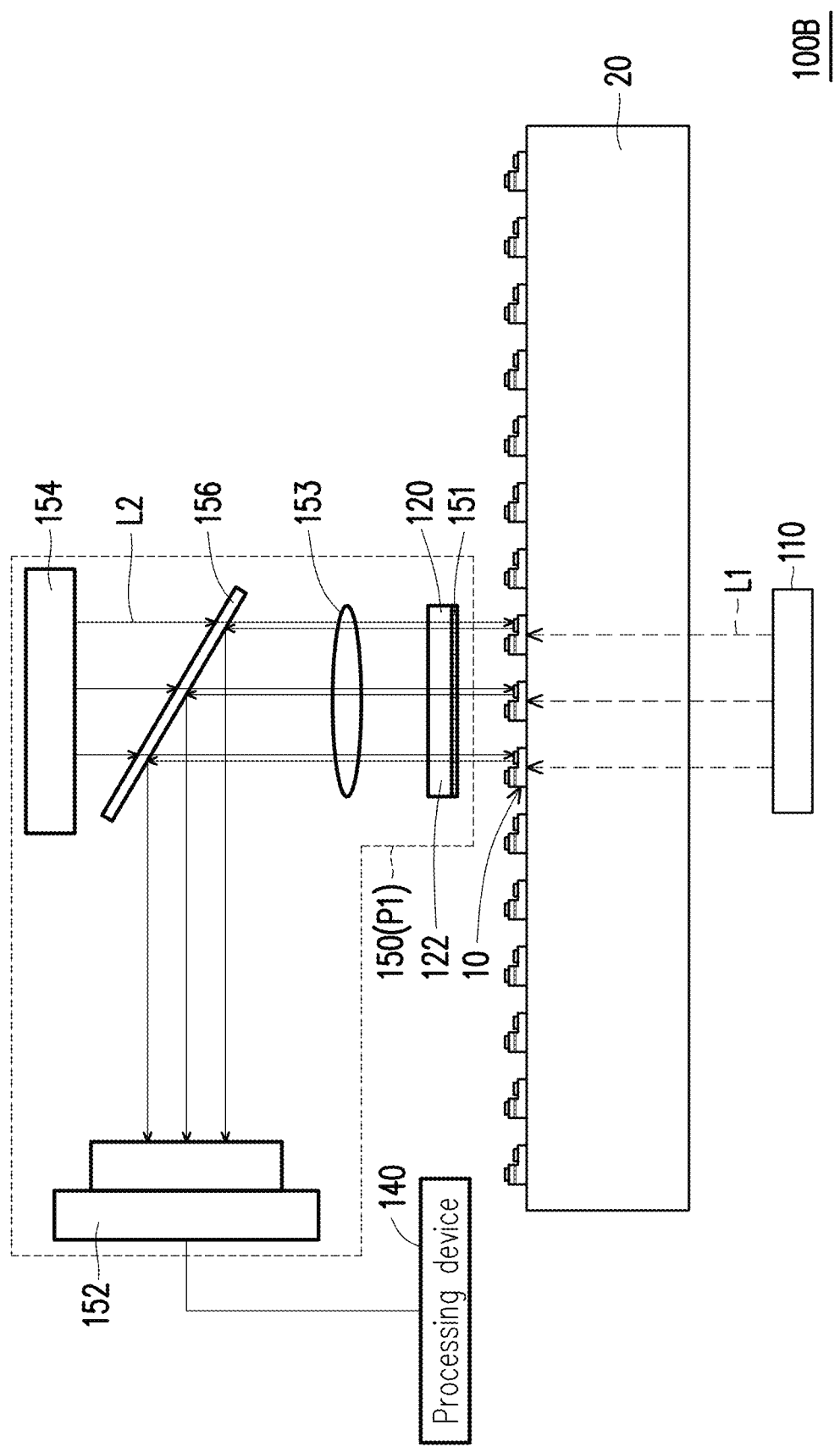
FIG. 9 is a schematic view of an inspection apparatus 100B according to still another embodiment of the disclosure.

FIG. 9 is a schematic view of an inspection apparatus 100B according to another embodiment of the disclosure. The inspection apparatus 100B is similar to the aforesaid inspection apparatus 100, while the difference therebetween is in that the medium layer 120 and the optical image capturing portion 150 can be integrated to form a sensing probe P1 according to the embodiment shown in FIG. 9. While the light-emitting diodes 10 are being inspected, the medium layer 120 of the sensing probe P1 may be arranged to be very close to the light-emitting diodes 10 (i.e., the medium layer 120 is disposed above the light-emitting diodes 10, wherein the medium layer 120 is separated from the light-emitting diodes 10), or the medium layer 120 of the sensing probe P1 is arranged to touch the light-emitting diodes 10. The sensing probe P1 can alternatively include the reflective layer 151 disposed below the medium layer 120. The reflectance of the reflective layer 151 is high. The reflectance is preferably larger than 90% or 99%. The reflective layer 151 can reflect the image capturing beam L2 (passing through the medium layer 120) to the optical-electro sensor 152. The sensing probe P1 can alternatively include the transmitted layer (not shown FIG. 9) disposed below the medium layer 120 to replace the reflective layer 151. The transmittance of the transmitted layer is high. For example, the transmittance of the transmitted layer is preferably larger than 90% or 99%. The image capturing beam L2 can pass through medium layer 120 and the transmitted layer, be reflected by the electrodes of the light-emitting diodes 10 and arrive at the optical-electro sensor 152 in sequence. Moreover, the sensing probe P1 may further include a lens 153 disposed above the medium layer 120, which should however not be construed as a limitation in the disclosure.

Figure 10:
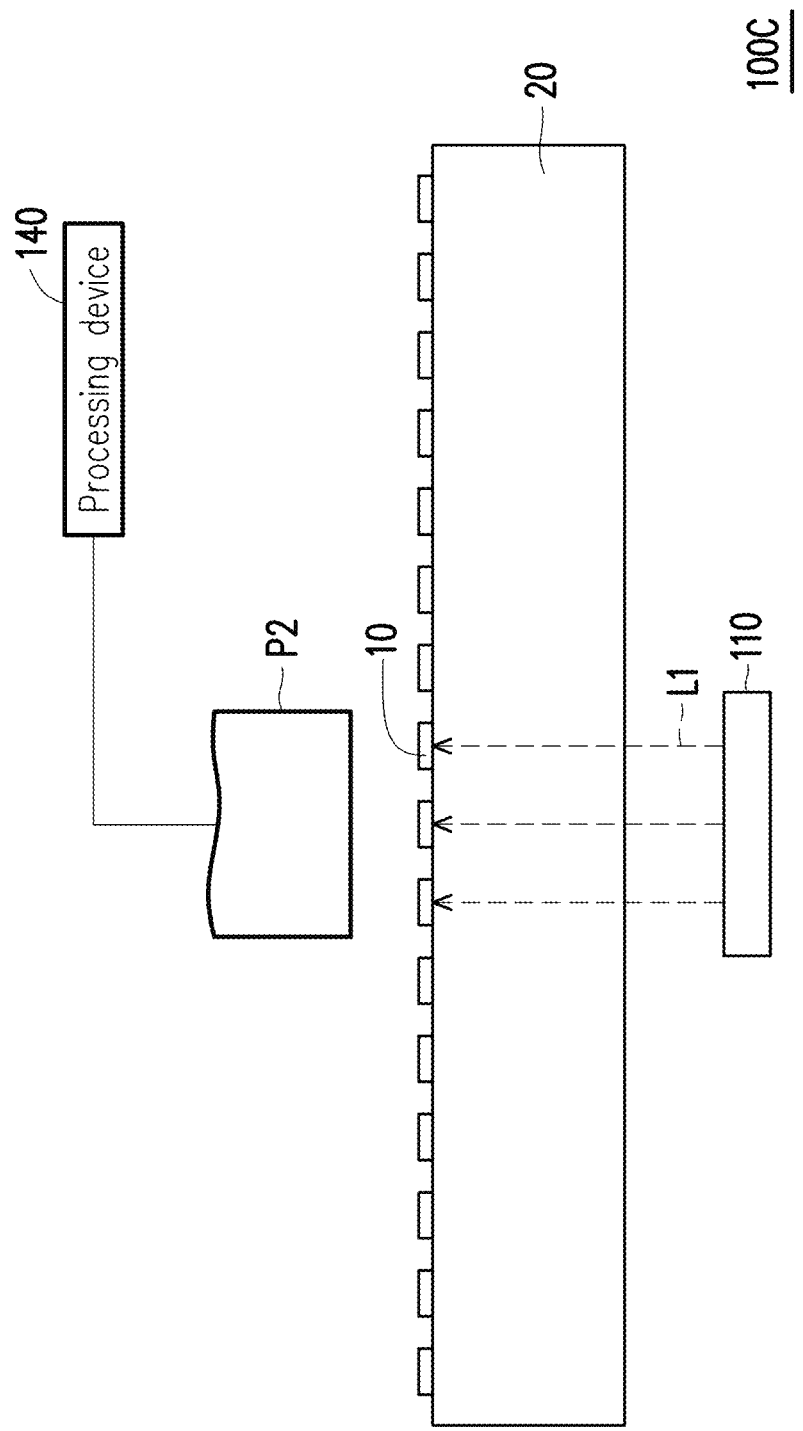
FIG. 10 is a schematic view of an inspection apparatus 100C according to still another embodiment of the disclosure.

FIG. 10 is a schematic view of an inspection apparatus 100C according to another embodiment of the disclosure. The inspection apparatus 100C is similar to the inspection apparatus 100 described above, and the difference therebetween lies in that the inspection apparatus 100C depicted in FIG. 10 may include a sensing probe P2 configured to measure a charge distribution, an electric field distribution, or a voltage distribution on the light-emitting diodes 10 simultaneously irradiated by the illumination beam L1. For instance, if the light-emitting diodes 10 may be vertical light-emitting diodes or horizontal light-emitting diodes, the sensing probe P2 may be a charge probe or an electric field or voltage measuring probe. Since the light-emitting diodes 10 described below are arranged in an array, the sensing probe P2 may be composed of a number of small charge probes or small electric field or voltage measuring probes. The inspection apparatus 100C need not include the medium layer 120 and the optical image capturing portion 150.

Note that the medium layer 120, 120A, or 120B described in some of the previous embodiments (e.g., the embodiments depicted in FIG. 1, FIG. 4, FIG. 6A, FIG. 7A, and FIG. 8A) is directly disposed on the light-emitting diodes 10. However, for easy inspection, the medium layer 120 or 120A described in some of the previous embodiments can be integrated into the sensing probe, which is exemplified in FIG. 11.

Figure 11:
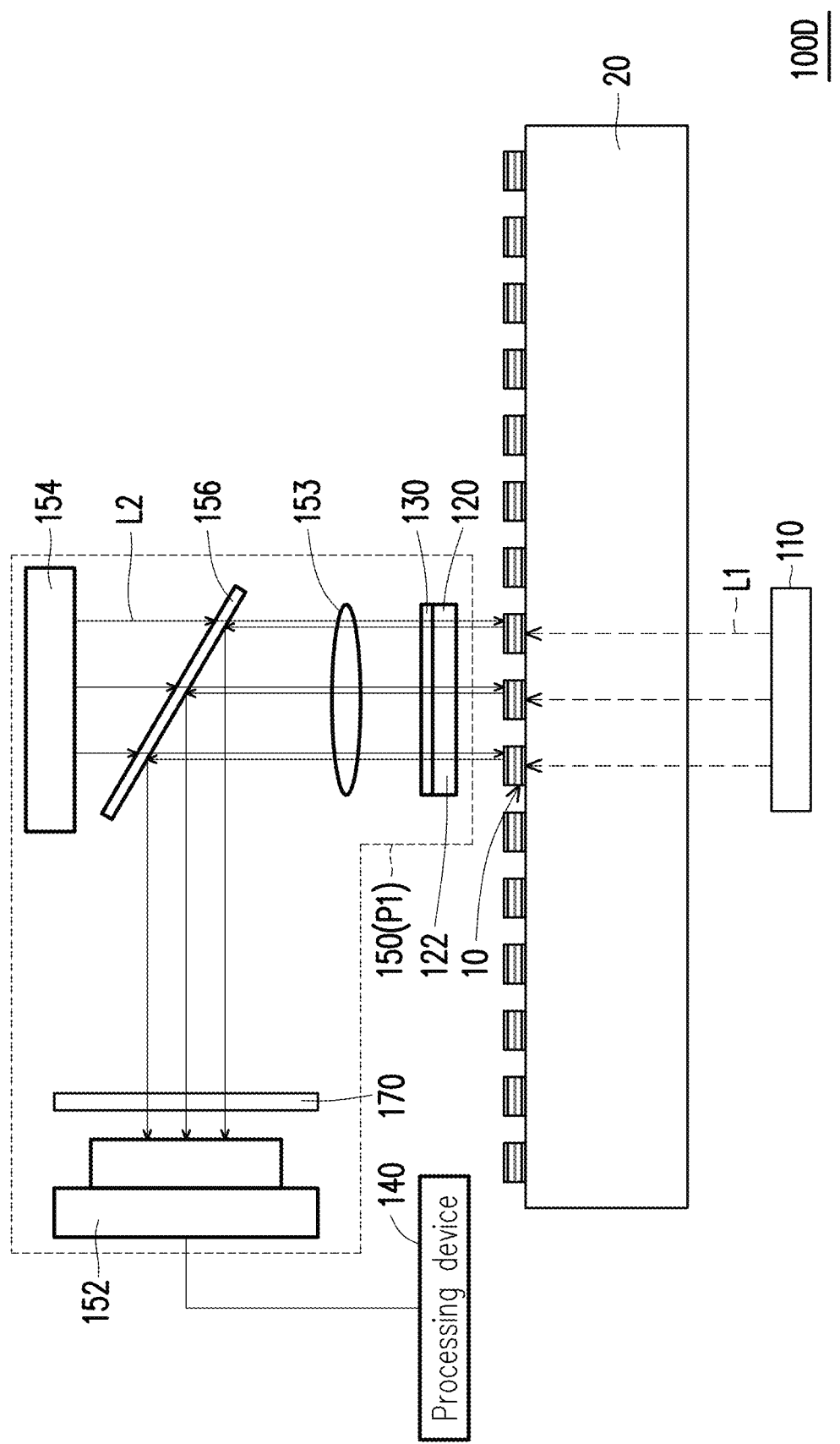
FIG. 11 is a schematic view of an inspection apparatus 100D according to an embodiment of the disclosure.

FIG. 11 is a schematic view of an inspection apparatus 100D according to an embodiment of the disclosure. The inspection apparatus 100D depicted in FIG. 11 is similar to the inspection apparatus 100A depicted in FIG. 4, while the main difference therebetween is in that the inspection apparatus 100D depicted in FIG. 11 can also integrate the medium layer 120 into the sensing probe P1, while the other components in the sensing probe P1 of the inspection apparatus 100D have been described in the previous paragraphs and thus will not be further explained. Moreover, the inspection apparatus 100D may selectively include a long pass filter 170. In this embodiment, the long pass filter 170 may be disposed between the optical-electro sensor 152 and the beam splitter 156, which is not limited in the disclosure. In another embodiment, the long pass filter 170 may be disposed between the beam splitter 156 and the medium layer 120.

In the embodiment of inspecting the horizontal light-emitting diodes (e.g., the embodiments depicted in FIG. 4 and FIG. 9), note that two upper surfaces of the electrodes 13a and 13b of each of the horizontal light-emitting diodes 10 are not coplanar. This should however not be construed as a limitation in the disclosure; the horizontal light-emitting diodes 10 can be inspected no matter whether the two upper surfaces of the electrodes 13a and 13b of each of the horizontal light-emitting diodes 10 are coplanar, which will be exemplarily explained below with reference to FIG. 12.

Figure 12:
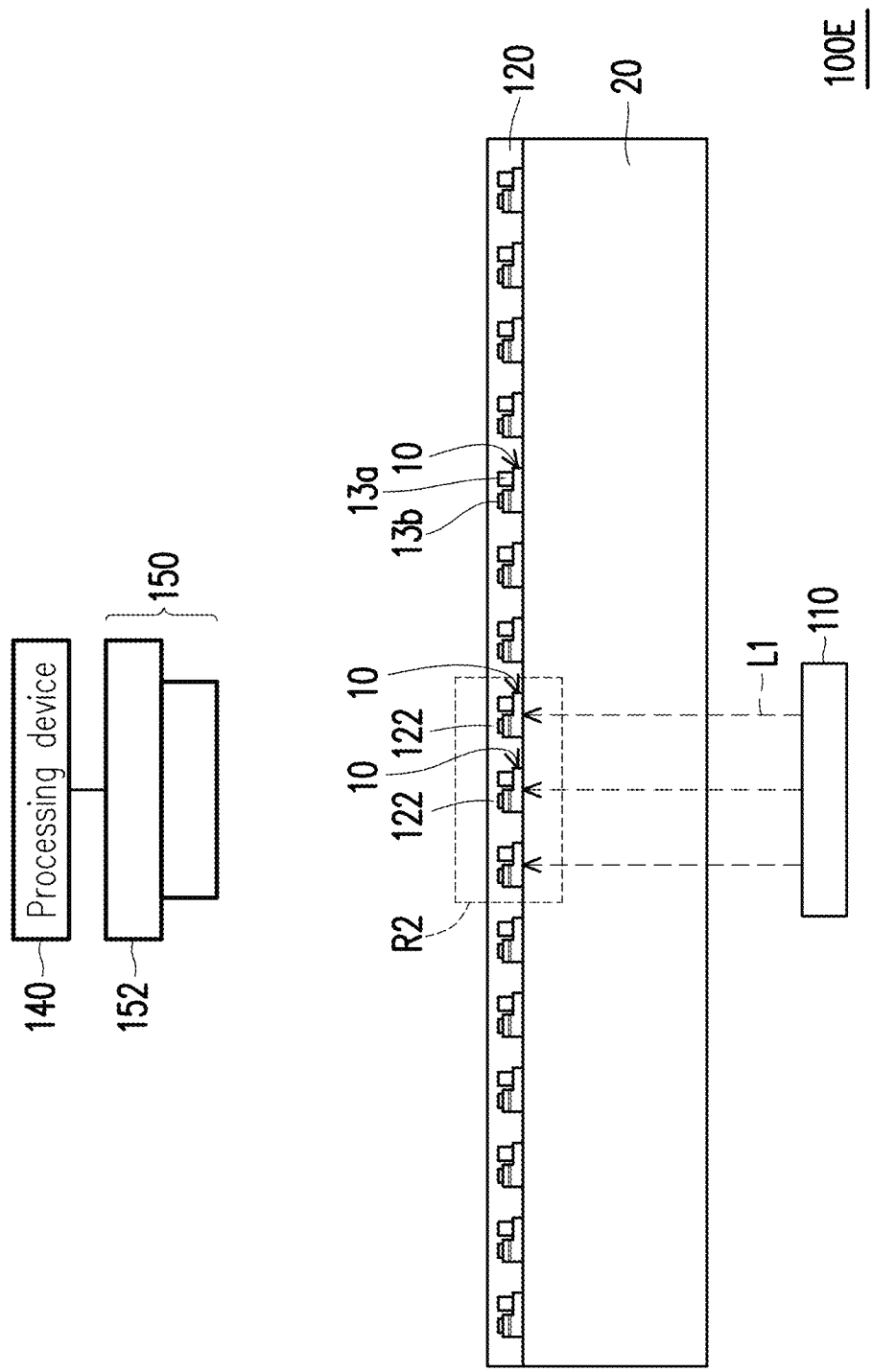
FIG. 12 is a schematic view of an inspection apparatus 100E according to another embodiment of the disclosure.

FIG. 12 is a schematic view of an inspection apparatus 100E according to another embodiment of the disclosure. The inspection apparatus 100E depicted in FIG. 12 is similar to the inspection apparatus 100A depicted in FIG. 4, while the main difference therebetween is in that the two upper surfaces of the electrodes 13a and 13b of each of the light-emitting diodes 10 inspected by the inspection apparatus 100E shown in FIG. 12 can be coplanar.

Figure 13:
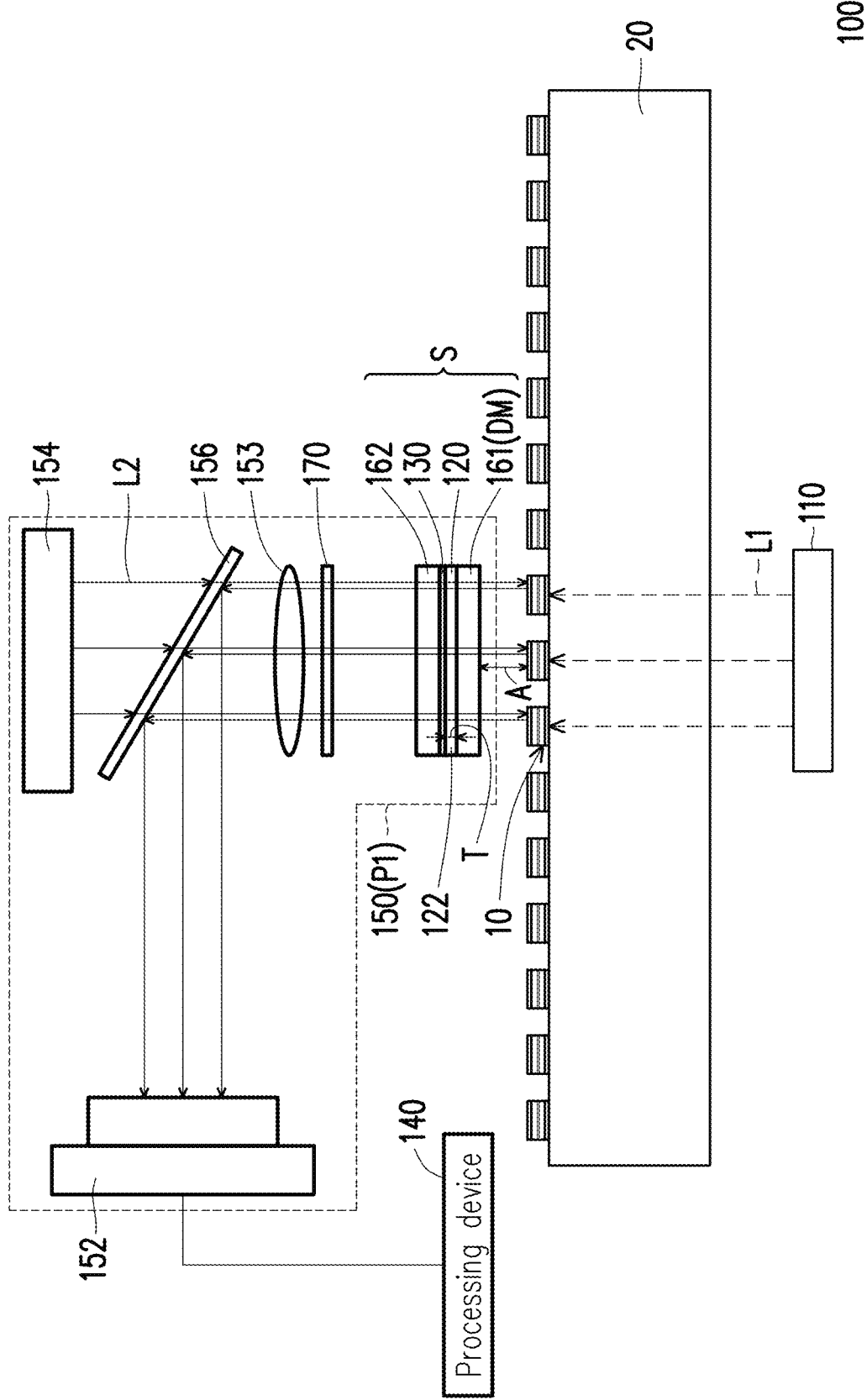
FIG. 13 is a schematic view of an inspection apparatus 100F according to an embodiment of the disclosure.

FIG. 13 is a schematic view of an inspection apparatus 100F according to an embodiment of the disclosure. The inspection apparatus 100F of FIG. 13 is similar to the inspection apparatus 100D of FIG. 11. The following describes the differences between the inspection apparatus 100F of FIG. 13 and the inspection apparatus 100D of FIG. 11.

Referring to FIG. 13, in this embodiment, the illumination beam L1 has sufficient light intensity. When the illumination light beam L1 with sufficient light intensity simultaneously illuminates a plurality of light-emitting diodes 10, a charge distribution close to a saturation charge distribution, an electric field distribution close to a saturation electric field distribution or a saturation voltage distribution close to a saturation voltage distribution on the plurality of light-emitting diodes 10.

Figure 14:
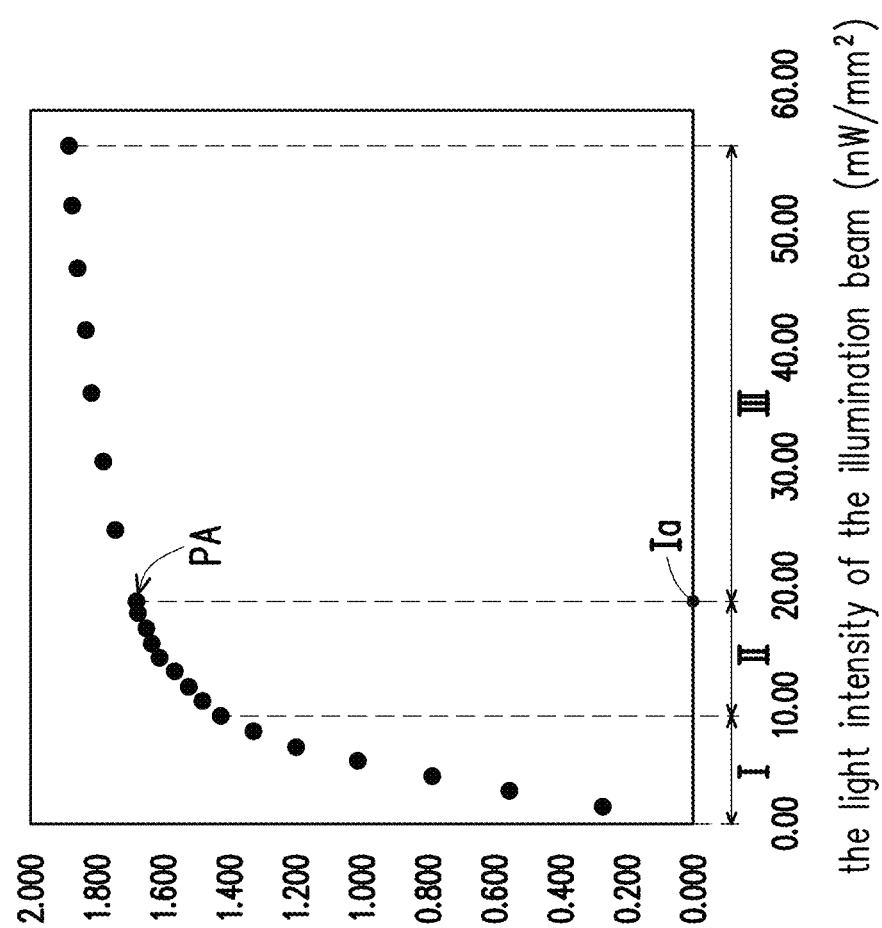
FIG. 14 is a relationship between a light intensity of an illumination beam L1 and a voltage on the light-emitting diode 10 according to an embodiment of the disclosure.

FIG. 14 shows a relationship between a light intensity of an illumination beam L1 and a voltage on the light-emitting diode 10 according to an embodiment of the disclosure, wherein the voltage on the light-emitting diode 10 is generated due to the photovoltaic effect caused by the illumination beam L1.

In the experimental process of obtaining FIG. 14, the light intensity of the illumination light beam L1 can be gradually increased, and voltages on the two electrodes 13a, 13b (depicted in FIG. 2) of the light-emitting diode 10 irradiated by the illumination beams with various light intensities are recorded, so as to obtain the relationship between the light intensity of the illumination beam L1 and the voltage on the light-emitting diode 10.

As shown in FIG. 14, in the beginning of the curve, the region I, voltage on the two electrodes 13a, 13b of the light-emitting diode 10 increases efficiently with the intensity of the illumination beam L1, and the voltage on the two electrodes 13a, 13b of the light-emitting diode 10 and the light intensity of the illumination beam L1 have a linear relationship with the largest slope in the curve. In the region II, a slope of a point in this region change from the larger one to the smaller one with the increasing of the intensity of the illumination beam. In the region III, voltage on the two electrodes 13a, 13b of the light-emitting diode 10 changes very slowly with the intensity of the illumination beam L1, and a slope of one point (i.e., the last point) in the region III is the smallest one in the whole curve. The slope of the one point (i.e., the last point) in the region III is close to a saturation value (i.e., 0). One point of the curve on a junction of the region II and the region III is called a turning point PA. The turning point PA of the curve changes from a large derivative of the curve to a smallest derivative. The light intensity of the turning point PA is Ia. The illumination light beam L1 whose light intensity is greater than Ia or equal to Ia is the above-mentioned illumination light beam L1 having sufficient light intensity. The preferred sufficient light intensity may be ≥5*Ia.

Referring to FIG. 13, in the condition where the illumination light beam L1 with sufficient light intensity simultaneously illuminates the plurality of light-emitting diodes 10, the sensing probe P1 measures the charge distribution close to the saturation charge distribution, the electric field distribution close to the saturation electric field distribution or the voltage distribution close to the saturation voltage distribution. The processing device 140 can determine luminous energies of the plurality of light-emitting diodes 10 operated under constant currents according the charge distribution close to the saturation charge distribution, the electric field distribution close to the saturation electric field distribution or the voltage distribution close to the saturation voltage distribution on the plurality of light-emitting diodes 10 measured by the sensing probe P1.

A following table. 1 shows correlation coefficients C between various voltages Voc-100% Voc-40% and Voc-10% generated by the light-emitting diode 10 due to the photovoltaic effect induced by the illumination light beam L1 with different light intensity I and luminous energies of the light-emitting diode 10 operated under various constant currents (i.e., 10 µA, 50 µA, 200 µA, and 300 µA). The voltage Voc-100% is a voltage due to the photovoltaic effect when the light-emitting diode 10 is irradiated by the illumination light beam L1 with 100% of our available illumination light beam. The voltage Voc-40% is a voltage due to the photovoltaic effect when the light-emitting diode 10 is irradiated by the illumination light beam L1 with 40% of our available illumination light beam. The voltage Voc-10% is a voltage due to the photovoltaic effect when the light-emitting diode 10 is irradiated by the illumination light beam L1 with 10% of our available illumination light beam A light intensity of our available illumination light beam is equal to or greater than the light intensity Ia of the turning point PA.

TABLE 1 voltages generated by the light-emitting diode 10
due to the photovoltaic effect by the
illumination light beam

| | | LI with different light intensity I | | |
|---|---|---|---|---|
| | | Voc-100% | Voc-40% | Voc-10% |
| luminous energies of the light-emitting diode 10 operated under various constant currents | constant current = 10 μA | C = 0.88 | C = 0.82 | C = 0.09 |
| | constant current = 50 μA | C = 0.85 | C = 0.82 | C = 0.13 |
| | constant current = 200 μA | C = 0.81 | C = 0.79 | C = 0.15 |
| | constant current = 300 μA | C = 0.77 | C = −0.11 | C = 0.13 |

From the experimental data in the above Table 1, it can be known that correlation coefficients C between the voltage Voc-100% and luminous energies of the light-emitting diode 10 operated under various constant currents (i.e., 10 μA, 50 μA, 200 μA, and 300 μA) are high. In other words, the charge distribution close to the saturation charge distribution, the electric field distribution close to the saturation electric field distribution or the voltage distribution close to the saturation voltage distribution generated by the plurality of light-emitting diodes 10 irradiated by the illumination light beam L1 with sufficient light intensity I can accurately represent the electro-optical characteristics of the plurality of light-emitting diodes 10 (for example, luminous energies of the light-emitting diode 10 operated under various constant currents).

Figure 15:
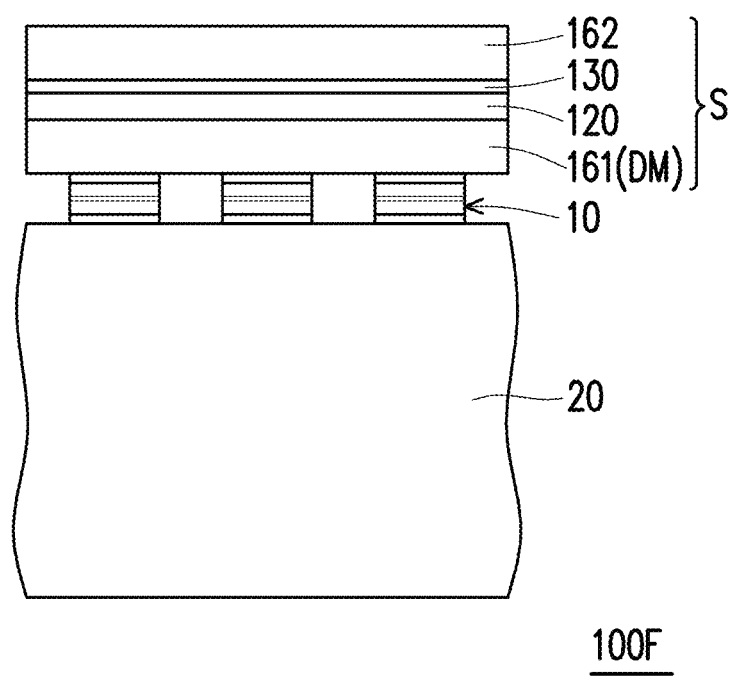
FIG. 15 is a partially enlarged schematic view of an inspection apparatus 100F according to an embodiment of the disclosure.

FIG. 15 is a partially enlarged schematic view of an inspection apparatus 100F according to an embodiment of the disclosure.

Referring to FIG. 13 and FIG. 15, in this embodiment, the medium layer 120 and the conductive layer 130 may be sandwiched between the first substrate 161 and the second substrate 162. The medium layer 120 is disposed between the conductive layer 130 and the first substrate 161. The conductive layer 130 is disposed between the second substrate 162 and the medium layer 120. The first substrate 161, the medium layer 120, the conductive layer 130 and the second substrate 162 constitute a photoelectric sensing structure S. When the inspection apparatus 100F uses the photoelectric sensing structure S of the sensing probe P1 to inspect the plurality of light-emitting diodes 10, the first substrate 161 is closer to the plurality of light-emitting diodes 10 than the second substrate 162.

In this embodiment, when the inspection apparatus 100F inspects the plurality of light-emitting diodes 10, the first substrate 161 of the photoelectric sensing structure S can be used as a dielectric material DM between the medium layer 120 and the plurality of light-emitting diodes 10. Furthermore, we may deposit a liquid with a high dielectric constant between the first substrate 161 and the plurality of light-emitting diodes 10, or it is on the plurality of light-emitting diodes 10. For example, the dielectric constant of the dielectric material DM and the liquid is larger than that of the air. A relative permittivity of the dielectric material DM and the liquid may be larger than 30. The relative permittivity of the dielectric material DM and the liquid is preferably larger than 100 or 1000. So that the large ratio of the saturation charge distribution close to the saturation charge distribution, the large ratio of the electric field distribution close to the saturation electric field distribution or the large ratio of the voltage distribution close to the saturation voltage distribution on the plurality of light-emitting diodes 10 can be efficiently sensed by the medium layer 120. For example, in this embodiment, the material of the first substrate 161 may be conjugated polymers, Calcium copper titanate, ferroelectric materials or ceramics, which is not limited in the disclosure. For example, in this embodiment, a liquid with a high dielectric constant may be deionization water, which is not limited in the disclosure.

In addition, in this embodiment, if the medium layer 120 is a liquid crystal layer, two alignment layers (not shown) may be disposed on two opposite sides of the medium layer 120, one of the two alignment layers may be disposed between the conductive layer 130 and the medium layer 120, and the other of the two alignment layers may be disposed between the conductive layer 130 and the first substrate 161. Alignment layers are used orientate the LC molecules with a specific pretilt angle.

Figure 16:
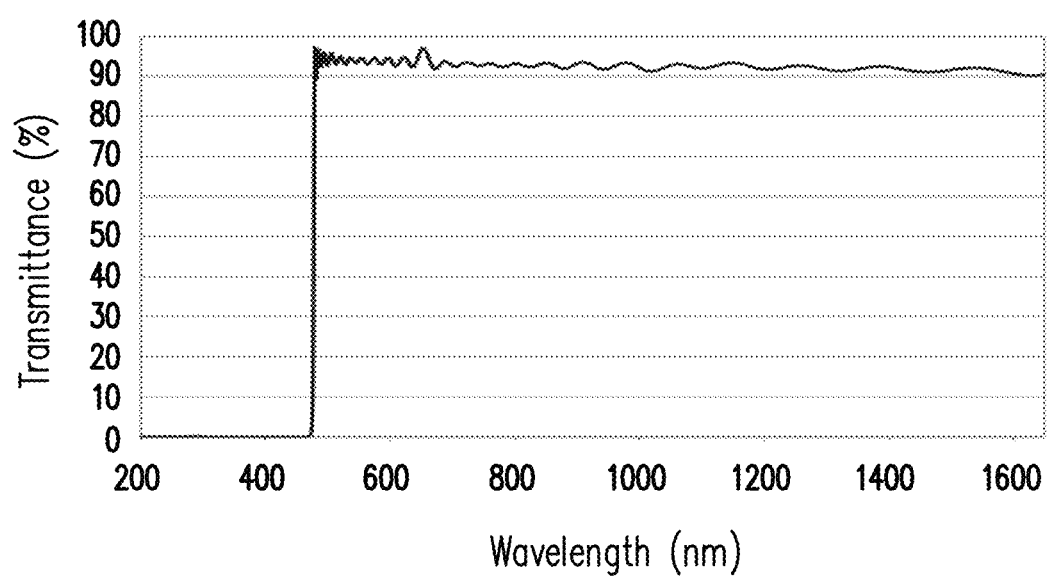
FIG. 16 is a transmittance spectrum of a long pass filter 170 according to an embodiment of the disclosure.

Referring to FIG. 13, in this embodiment, the sensing probe P1 may further include a long pass filter 170, disposed between the medium layer 120 and the optical-electro sensor 152. For example, in this embodiment, the long pass filter 170 may be disposed between the beam splitter 156 and the medium layer 120, which is not limited in the disclosure. In another embodiment, the long pass filter 170 may be disposed between the optical-electro sensor 152 and the beam splitter 156. FIG. 16 shows a transmittance spectrum of a long pass filter 170 according to an embodiment of the disclosure. Referring to FIG. 13 and FIG. 16, the long pass filter 170 is used to block at least one of the illumination light beam L1 and a light beam (not shown) generated by the plurality of light-emitting diodes 10 due to the photoluminescence effect, and the imaging beam L2 can pass through the long pass filter 170.

For example, in this embodiment, the center wavelength of the illumination light beam L1 may be less than 400 nm, and the light beam emitted by the plurality of light-emitting diodes 10 due to the photoluminescence effect caused by the illumination light beam L1 may be an ultraviolet light, and the long pass filter 170 having the transmittance spectrum shown in FIG. 16 can block the illumination light beam L1 and the light beam emitted by the plurality of light-emitting diodes 10 due to the photoluminescence effect caused by the illumination light beam L1. In addition, in this embodiment, the image capturing light source 154 emitting the image capturing beam L2 is a monochromatic light source. For example, the image capturing light source 154 is a monochromatic light-emitting diode light source. A wavelength range of the image capturing beam L2 emitted by the image capturing light source 154, a wavelength range of the illumination light beam L1 and a wavelength range of the light beam emitted by the plurality of light-emitting diodes 10 due to the photoluminescence effect are different. In accordance with the above requirements for the wavelength range of the image capturing beam L2, in order to increase the resolution of the image, the wavelength range of the image capturing beam L2 is preferably a short wavelength range, which is not limited in the disclosure.

Figure 17:
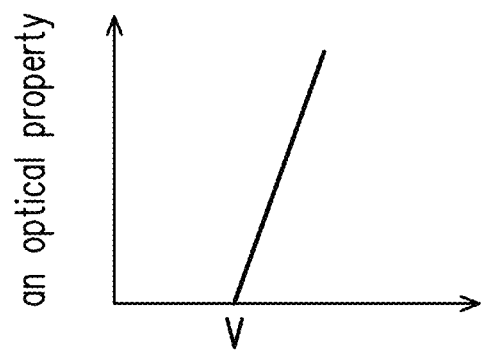
FIG. 17 is a relationship between a charge, an electric field, or a voltage and an optical property of a medium layer induced by the charge, the electric field, or the voltage.

FIG. 17 shows a relationship between the optical properties of a medium layer 120 and the variation of the charge, the electric field or the voltage across the media layer 120.

Figure 18:
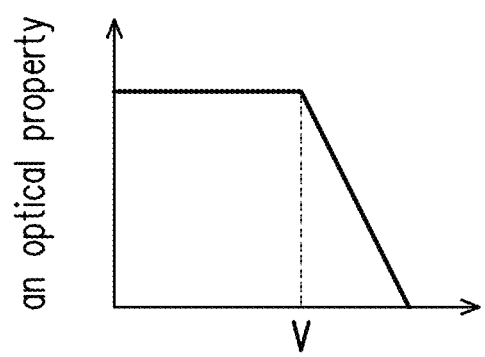
FIG. 18 is a relationship between a charge, the electric field, or the voltage and an optical property of another medium layer induced by a charge, an electric field, or a voltage.

FIG. 18 shows a relationship between the optical properties of a medium layer 120 and the variation of the charge, the electric field or the voltage across the media layer.

Referring to FIG. 13, FIG. 17, and FIG. 18, in this embodiment, the optical property change due to the effect of charge, the electric field, or the voltage of the medium layer 120 may have a threshold value V. For example, the relationship between the charge, the electric field, or the voltage and the optical property change due to the effect of charge, the electric field or the voltage of the medium layer 120 may be the relationship shown in FIG. 17 or FIG. 18.

In this embodiment, the processing device 140 determines whether a light-emitting diode 10 corresponding to an inspection region 122 is normal according to whether the corresponding optical property change occurs in the inspection region 122 (i.e., whether the electric field, the charge, or the voltage caused by the light-emitting diode 10 exceeds the threshold value V).

Further, if the electric field, the charge or the voltage caused by the light-emitting diode 10 has exceeded the threshold value V and the inspection region 122 corresponding to the light-emitting diode 10 of the medium layer 120 has an optical property change. The processing device 140 can classify the light-emitting diode 10 according to an amount of the optical property change.

In this embodiment, the threshold V can be adjusted by changing at least one of the distance A between the light-emitting diode 10 and a photoelectric sensing structure S, the dielectric constant of an object disposed between the light-emitting diode 10 and photoelectric sensing structure S, the thickness of the first substrate 161 between the medium layer 120 and the light-emitting diode 10, the dielectric constant of the first substrate 161 between the medium layer 120 and the light-emitting diode 10, the thickness T of the medium layer 120 and the dielectric constant of the medium layer 120, which is not limited in the disclosure.

Furthermore, referring to FIG. 13, the inspection region 122 corresponding to the light-emitting diode 10 of the medium layer 120 has an optical property change. The processing device 140 can classify the light-emitting diode 10 in groups according to an amount of the optical property change based on the application requirements of the end products.

Figure 19:
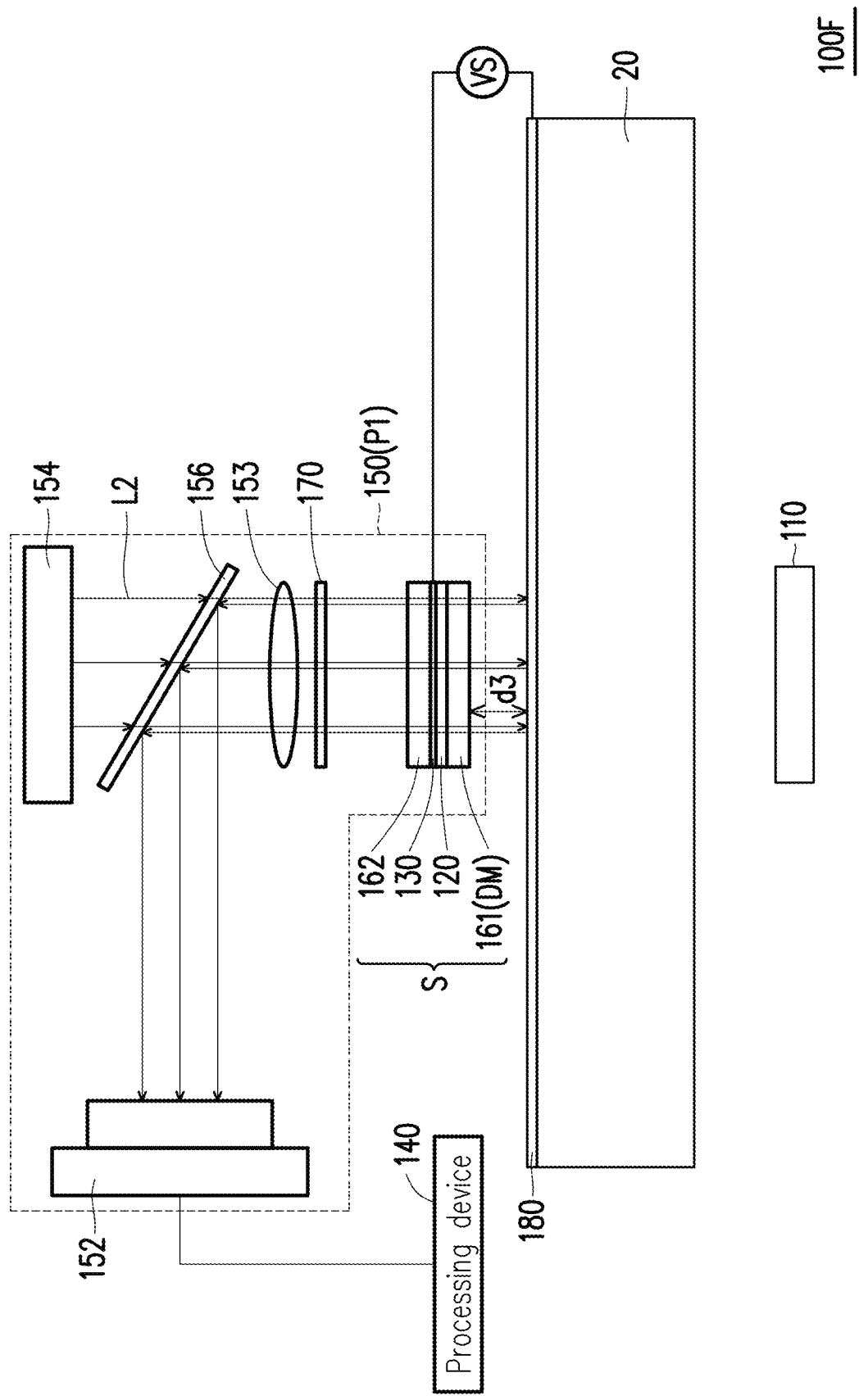
FIG. 19 is a calibration process of an inspection apparatus 100F according to an embodiment of the disclosure.

FIG. 19 shows a calibration process of an inspection apparatus 100F according to an embodiment of the disclosure. The inspection apparatus 100F can perform steps of a method for inspecting the light-emitting diodes 10.

Referring to FIG. 19, in this embodiment, the inspection apparatus 100F further includes a calibration sheet 180. The calibration sheet 180 and the sensing probe P1 keep a fixed distance d3, the calibration sheet 180 is used to generate a set of controllable correction charge distributions, a set of controllable correction electric field distributions, or a set of controllable correction voltage distributions. In the embodiment, the calibration sheet 180 and the sensing probe P1 keep a fixed distance d3, the sensing probe P1 measures the optical property changes of the medium layer 120 in the photoelectric sensing structure S under the controllable correction charge distributions, the controllable correction electric field distributions, or the controllable correction voltage distributions, wherein the controllable correction charge distributions are different from each other, the controllable correction electric field distributions are different from each other, and the controllable correction voltage distributions are different from each other. The processing device 140 obtains a set of calibration parameters according the set of the controllable correction charge distributions, the set of the controllable correction electric field distribution or the set of the controllable correction voltage distribution measured by the sensing probe P1. The processing device 140 corrects the charge distribution, the electric field distribution, or the voltage distribution on the plurality of light-emitting diodes 10 measured by the sensing probe according to the set of the calibration parameters. This can eliminate a measurement error introduced by the inspection apparatus 100F itself, such as but not limited to: an error introduced by the uneven thickness T of the medium layer 120.

For example, in this embodiment, the calibration sheet 180 may be a complete electrode sheet. The voltage source VS can be electrically connected to the calibration sheet 180 and the conductive layer 130 of the photoelectric sensing structure S, so that the calibration voltage distribution is generated, which is not limited in the disclosure.

Figure 20:
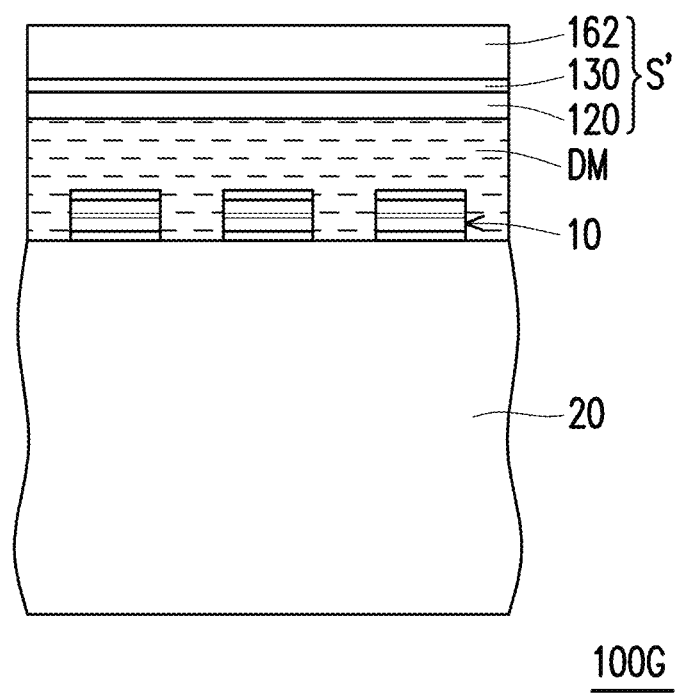
FIG. 20 is a partially enlarged schematic view of an inspection apparatus 100G according to an embodiment of the disclosure.

FIG. 20 is a partially enlarged schematic view of an inspection apparatus 100G according to an embodiment of the disclosure. The inspection apparatus 100G of FIG. 20 is similar to the aforementioned inspection apparatus 100F of FIG. 13, and the difference between the two is that: in the embodiment of FIG. 20, the photoelectric sensing structure S' may not have the first substrate 161. The medium layer 120 can be replace by the medium layer 120' (not shown). The medium layer 120' is the mixture of the polymer and electro-optical material, which may be a film layer capable of changing optical property affecting by the electric field E, the charge, or the voltage. Furthermore, when the inspection apparatus 100G inspects by the photoelectric sensing structure S', the dielectric material DM disposed between photoelectric sensing structure S' and the plurality of light-emitting diodes 10, or on the plurality of light-emitting diodes 10, may be a liquid with a high dielectric constant, such as but not limited to: deionization water.

Figure 21A:
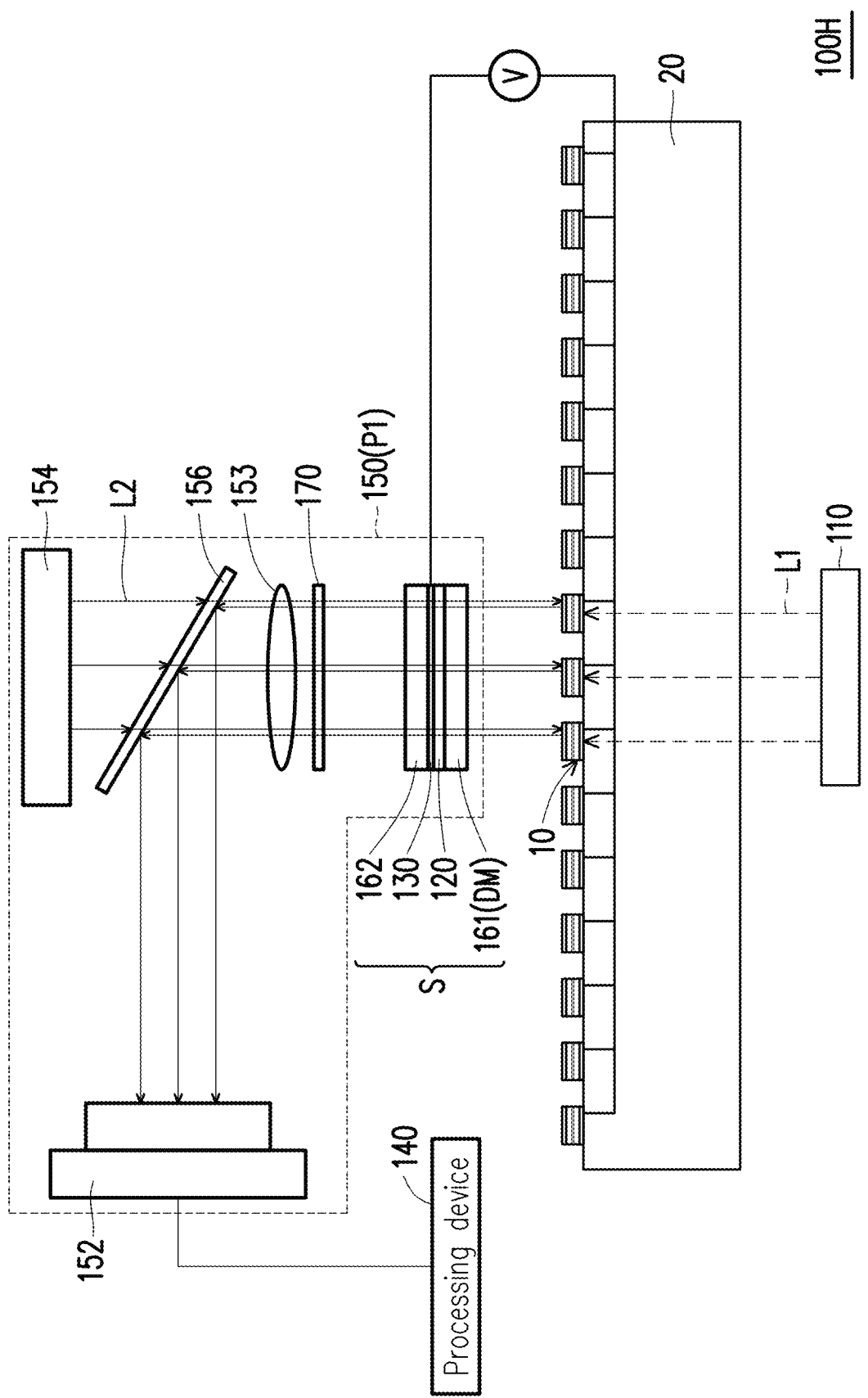
FIG. 21A is a schematic view of an inspection apparatus 100H according to an embodiment of the disclosure.

FIG. 21A is a schematic view of an inspection apparatus 100H according to an embodiment of the disclosure. The inspection apparatus 100H of FIG. 21A is similar to the aforementioned inspection apparatus 100F of FIG. 13, and the difference between the two is that: in the embodiment of FIG. 13, a voltage supplier V is connected to the conductive layer 130 and a plurality of electrodes 13a (referring to FIG. 2) of the plurality of light-emitting diodes 10. The voltage supplier V provides a DC bias voltage or an AC square wave bias voltage. In the embodiment, the two electrodes 13a and 13b of the light-emitting diode 10 can be respectively disposed on two opposite sides. It is vertical structure. A plurality of electrodes 13a may be connected together by groups. Some pads or electrodes for one group will be deposited on the surface of the carrier 20 and can be electrically connected to the outside points. In the embodiment of FIG. 21A, it exists a voltage supplier V to provide a bias voltage between the conductive layer 130 and a plurality of electrodes 13a of the plurality of light-emitting diodes 10. In the embodiment, the medium layer 120 with high operation voltage, the bias voltage can help the medium layer 120 to operate in workable region and sensing the voltage or electric field changes of the plurality of light-emitting diodes 10.

Figure 21B:
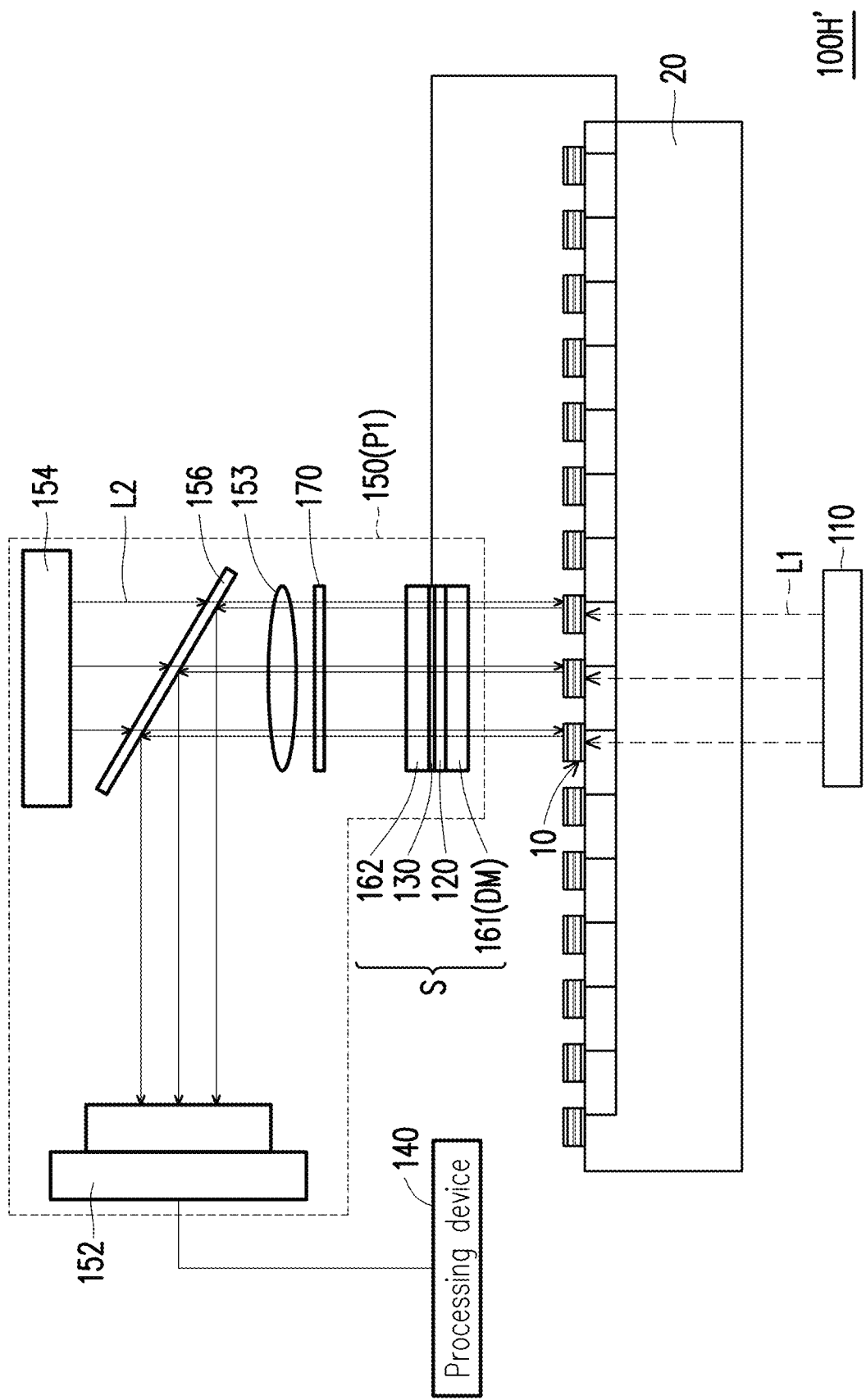
FIG. 21B is a schematic view of an inspection apparatus 100H' according to an embodiment of the disclosure.

FIG. 21B is a schematic view of an inspection apparatus 100H' according to an embodiment of the disclosure. The inspection apparatus 100H' of FIG. 21B is similar to the aforementioned inspection apparatus 100H of FIG. 21A, and the difference between the two is that: in the embodiment of FIG. 21B, the conductive layer 130 and a plurality of electrodes 13a of the plurality of light-emitting diodes 10 are connected together and they are in the same electric potential.

Figure 22:
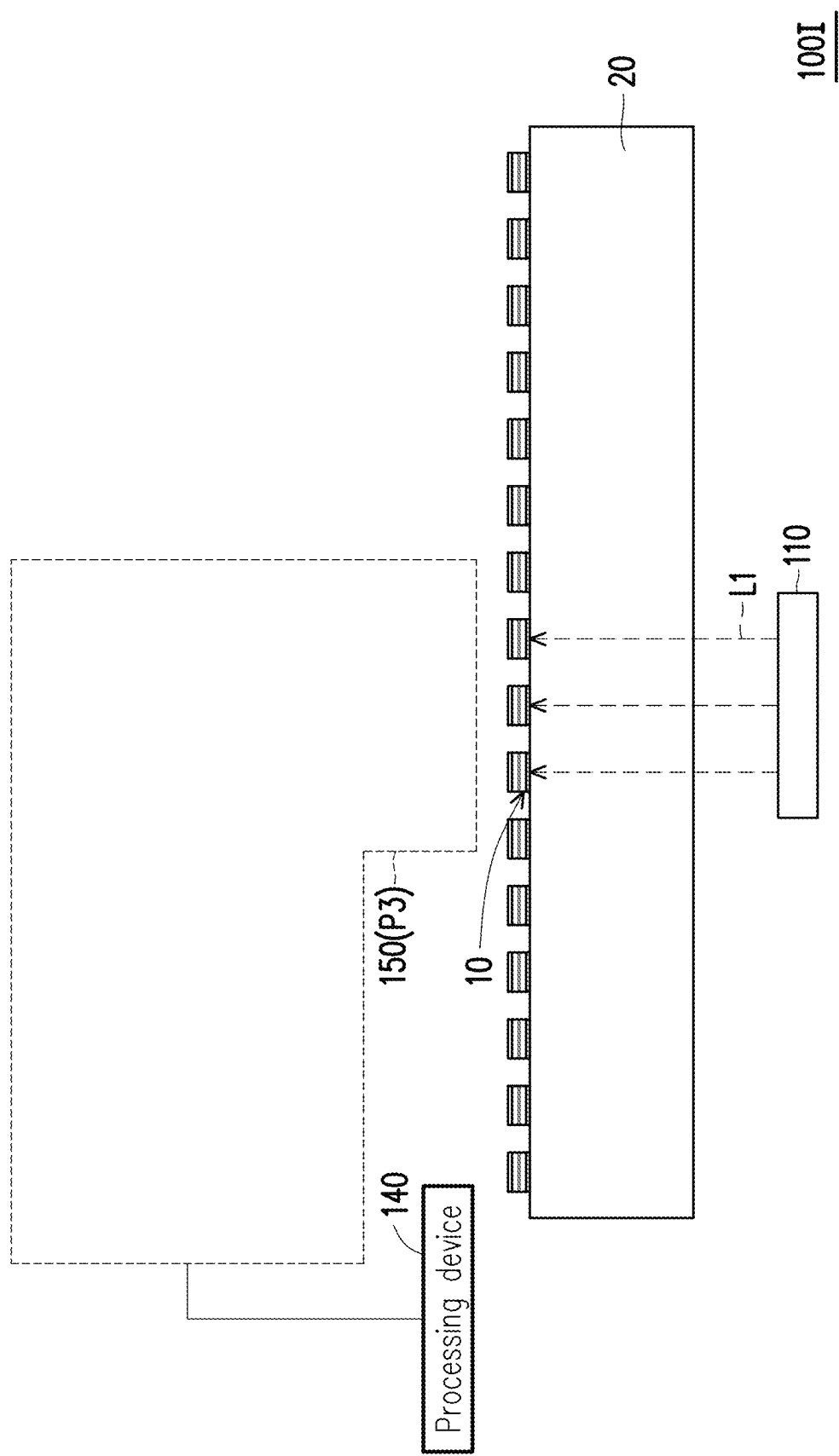
FIG. 22 is a schematic view of an inspection apparatus 100I according to an embodiment of the disclosure.

FIG. 22 is a schematic view of an inspection apparatus 100I according to an embodiment of the disclosure. The inspection apparatus 100I of FIG. 22 is similar to the inspection apparatus 100F of FIG. 13, and the differences between the two are described below. The two are the same or similar, please refer to the previous description, and will not be repeated here.

Figure 23:
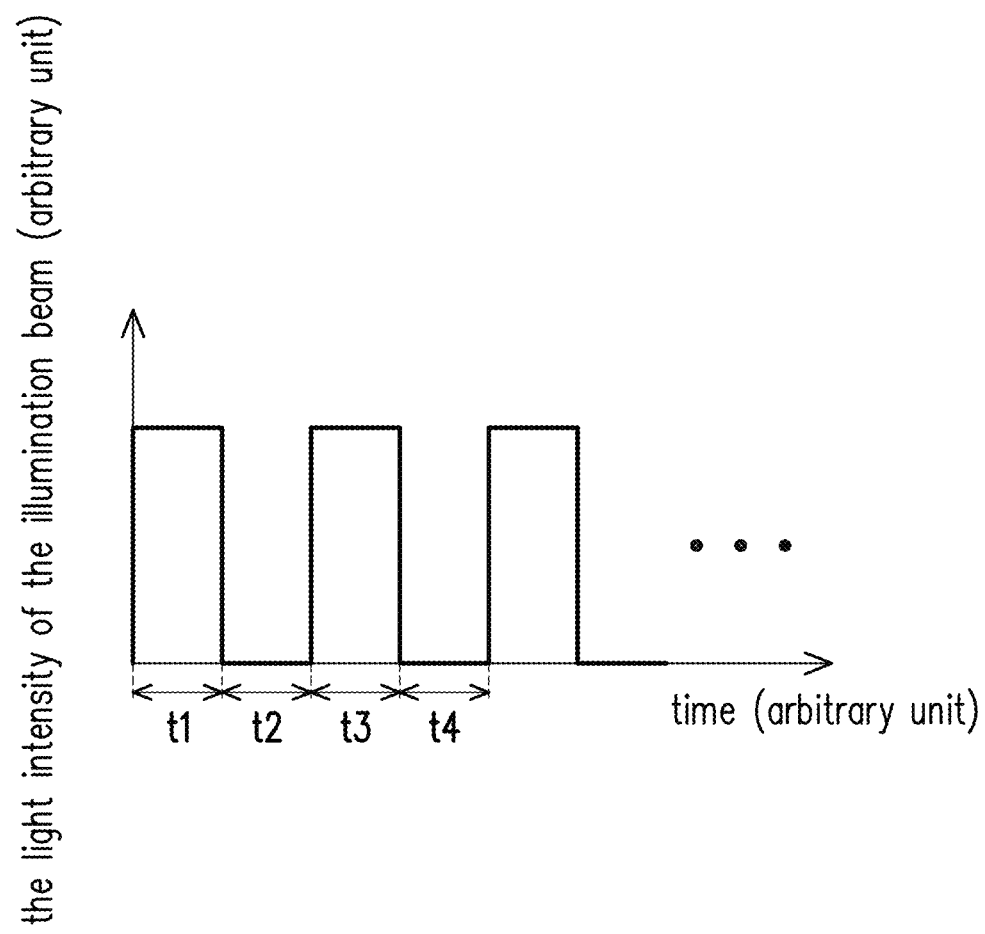
FIG. 23 is a relationship between a light intensity of an illumination beam L1 of the inspection apparatus 100I and a time according to an embodiment of the disclosure.

FIG. 23 shows a relationship between a light intensity of an illumination beam L1 of the inspection apparatus 100I and a time according to an embodiment of the disclosure.

Referring to FIG. 22 and FIG. 23, in this embodiment, the light intensity of the illumination beam L1 will change with time. For example, the illumination light source 110 configured to emit the illumination beam L1 can be turned on or off over time (i.e., the illumination light source 110 configured to emit the illumination beam L1 can be turned on in a first period t1, turned off in a second period t2 following the first period t1, turned on in a third period t3 following the second period t2, and turned off in a fourth period t4 following the period t3, so on.)

Since the light intensity of the illumination beam L1 changes with time, the charge distribution, electric field distribution, or voltage distribution on the plurality of light-emitting diodes 10 simultaneously illuminated by the illumination beam L1 also changes with time. The charge distribution, the electric field distribution or the voltage distribution changing with time on the plurality of light-emitting diodes 10 causes a magnetic field distribution. The sensing probe P3 can measure the magnetic field distribution. The processing device 140 determines a plurality of electro-optical characteristics of the plurality of light-emitting diodes 10 according the magnetic field distribution.

For example, in this embodiment, the sensing probe P3 may include a plurality of magnetic sensors. In the embodiment, the illumination light beam L1 whose intensity changes with time irradiate the plurality of light-emitting diodes 10, for example the magnetic sensors are induction coils. If an induction coil of the sensing probe P3 generates an induced current or an induced current exceeding a predetermined current value. The processing device 140 determines that a light-emitting diode 10 corresponding to the induction coil is normal. If an induction coil of the sensing probe P3 doesn't generate an induced current or an induced current exceeding a predetermined current value. The processing device 140 determines that a light-emitting diode 10 corresponding to the induction coil is abnormal.

Figure 24:
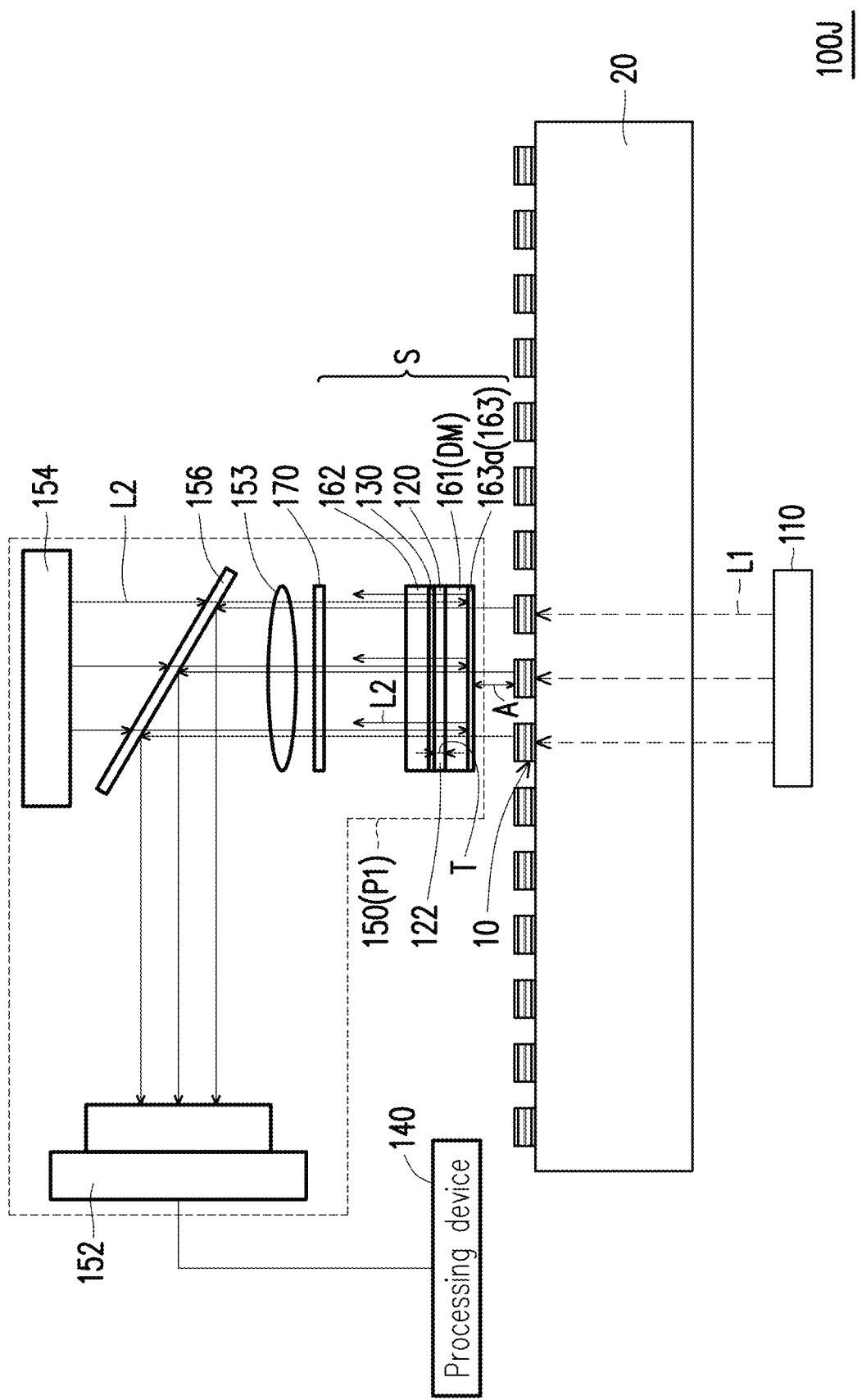
FIG. 24 is a schematic view of an inspection apparatus 100J according to an embodiment of the disclosure.

FIG. 24 is a schematic view of an inspection apparatus 100J according to an embodiment of the disclosure. The inspection apparatus 100J of FIG. 24 is similar to the aforementioned inspection apparatus 100F of FIG. 13, and the difference between the two is that: a photoelectric sensing structure S of the inspection apparatus 100J of FIG. 24 further includes an optical layer 163. Referring to FIG. 24, the first substrate 161 is disposed between the medium layer 120 and the optical layer 163. In this embodiment, the optical layer 163 may be a reflection layer 163a which can reflect the imaging beam L2 (passing through the medium layer 120). For example, a reflectance of optical layer 163 is preferably equal to or larger than 90% or 99%.

Figure 25:
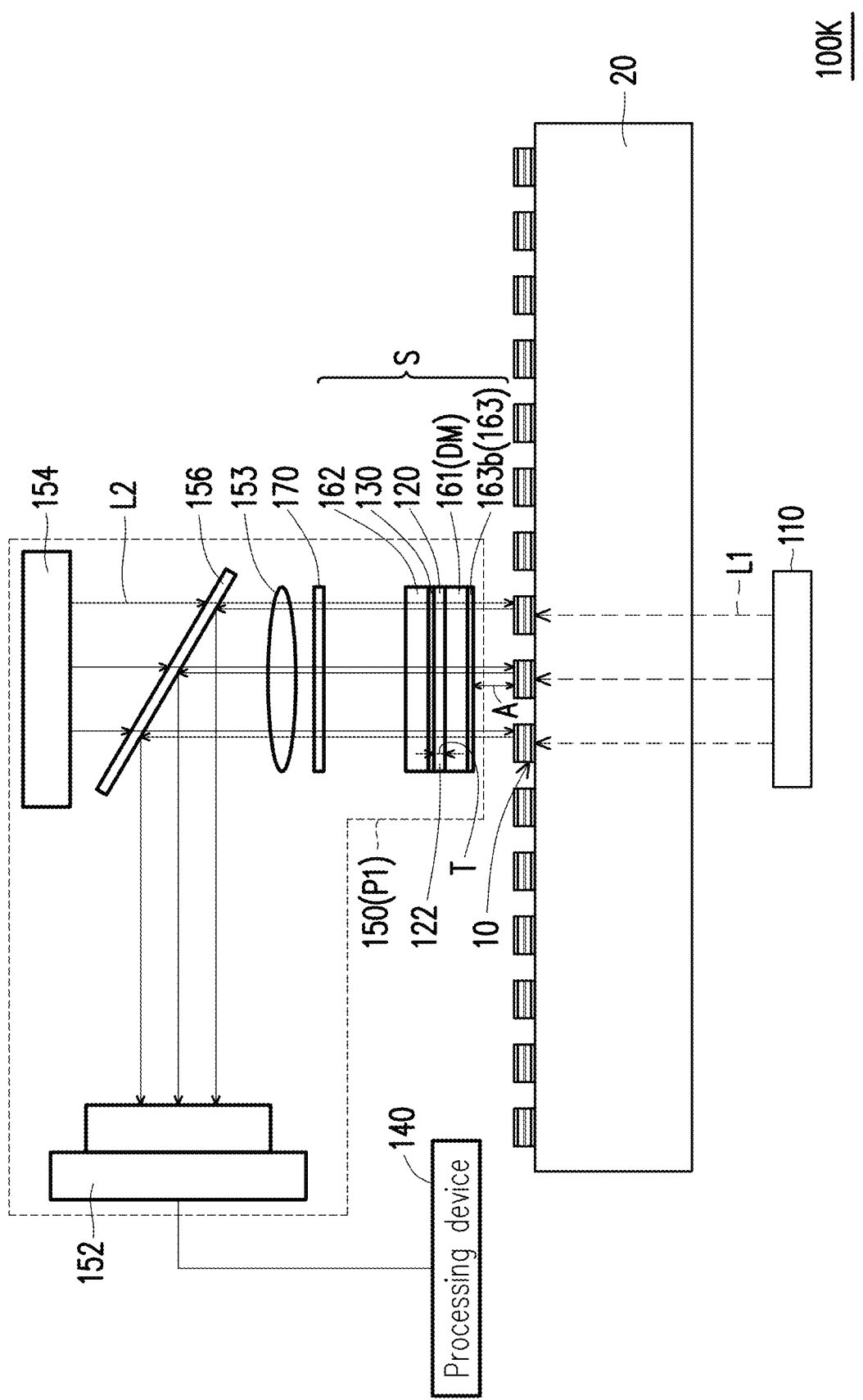
FIG. 25 is a schematic view of an inspection apparatus 100K according to an embodiment of the disclosure.

FIG. 25 is a schematic view of an inspection apparatus 100K according to an embodiment of the disclosure. The inspection apparatus 100K of FIG. 25 is similar to the aforementioned inspection apparatus 100F of FIG. 13, and the difference between the two is that: a photoelectric sensing structure S of the inspection apparatus 100K of FIG. 25 further includes an optical layer 163. Referring to FIG. 25, the first substrate 161 is disposed between the medium layer 120 and the optical layer 163. In this embodiment, the optical layer 163 may be an optical layer 163b having a high transmittance. For example, the transmittance of the optical layer 163b is preferably equal to or larger than 90% or 99%.

The optical layer 163b is disposed below the medium layer 120 and located between the plurality of light-emitting diodes 10 and the medium layer 120. The imaging beam L2 can pass through the optical layer 163b and can be reflected by the electrodes of the plurality of light-emitting diodes 10.

Figure 26A:
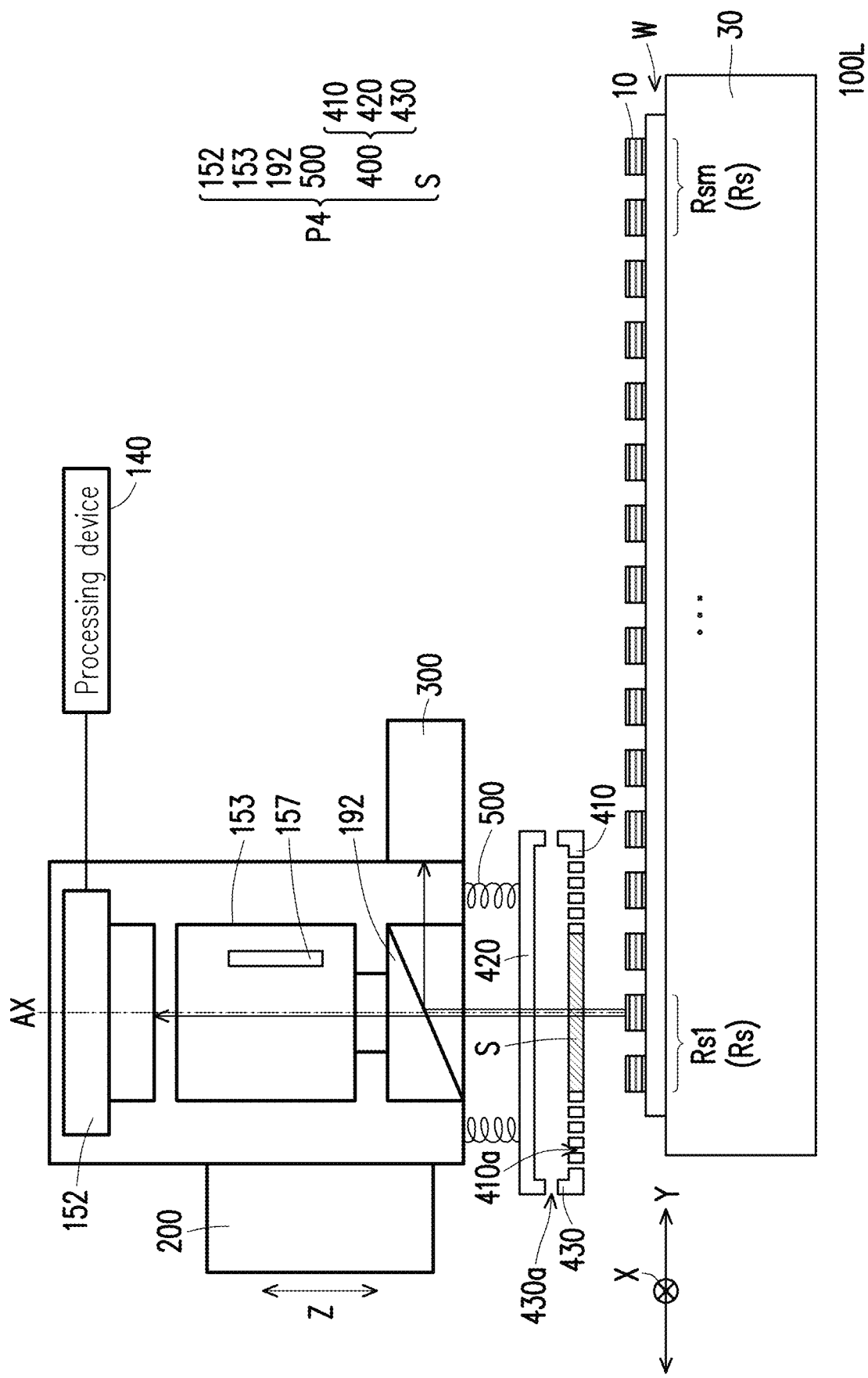
Figure 26B:
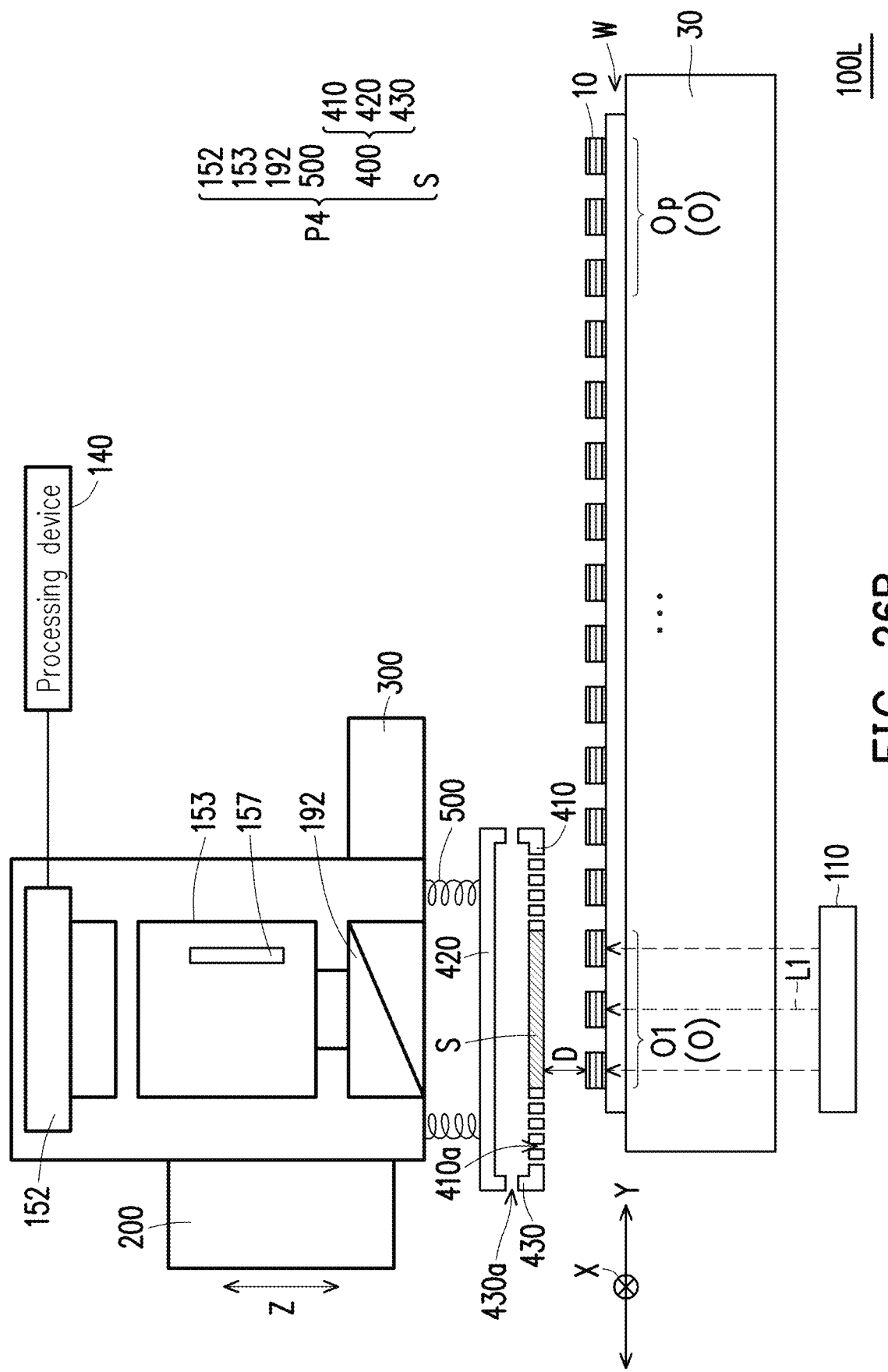

FIG. 26A to FIG. 26C illustrate an inspection apparatus 100L and a process for inspecting a light-emitting diode wafer W according to an exemplary embodiment of the disclosure.

Figure 27:
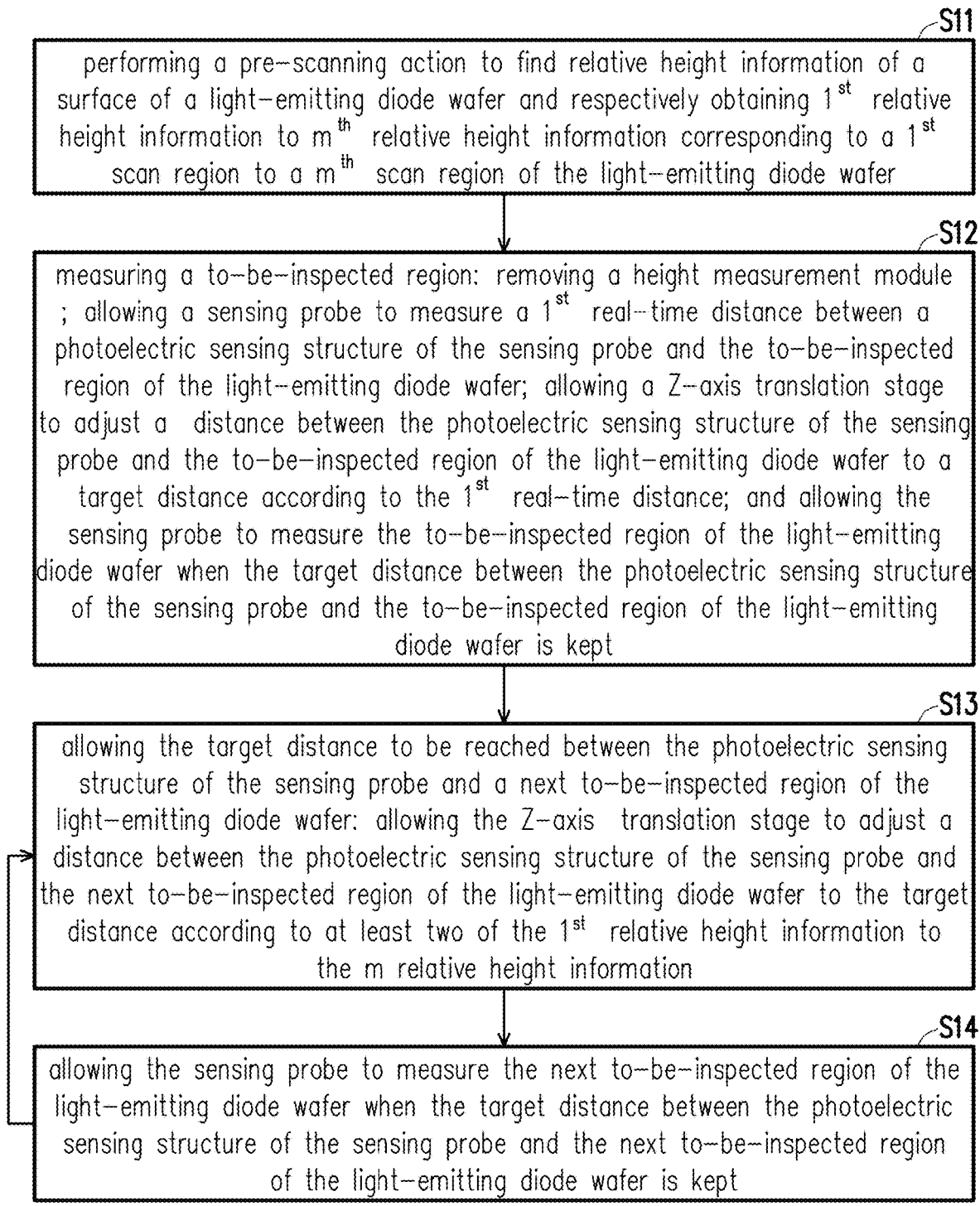
FIG. 27 is a schematic flow chart of an inspection method for inspecting the light-emitting diodes 10 according to an embodiment of the disclosure.

FIG. 27 is a schematic flow chart of an inspection method for inspecting the light-emitting diodes 10 according to an embodiment of the disclosure.

Referring to FIG. 26A, the inspection apparatus 100L is configured to inspect the light-emitting diode wafer W. The light-emitting diode wafer W includes a plurality of scan regions Rs. Each of the scan regions Rs has the plurality of light-emitting diodes 10. The scan regions Rs include a $1^{st}$ scan region Rs1 to a $m^{th}$ scan region Rsm, and m is a positive integer greater than or equal to 2.

Referring to FIG. 26B, the light-emitting diode wafer W includes a plurality of to-be-inspected regions O. Each of the to-be-inspected regions O has the plurality of light-emitting diodes 10. The to-be-inspected regions O include a $1^{st}$ to-be-inspected region O1 to a $p^{th}$ to-be-inspected region Op, and p is a positive integer greater than or equal to 2.

Note that in the disclosure, a number of the scan regions Rs of the light-emitting diode wafer W is not limited to be equal to a number of the to-be-inspected regions O of the light-emitting diode wafer W, and an area of each of the scan regions Rs of the light-emitting diode wafer W is not limited to be equal to an area of each of the to-be-inspected regions O of the light-emitting diode wafer W in the disclosure as well.

For instance, in this embodiment, the number of the scan regions Rs of the light-emitting diode wafer W may selectively be less than the number of the to-be-inspected regions O of the light-emitting diode wafer W, and the area of each of the scan regions Rs of the light-emitting diode wafer W may selectively be less than the area of each of the to-be-inspected regions O of the light-emitting diode wafer W, which should however not be construed as a limitation in the disclosure.

The inspection apparatus 100L provided by this embodiment is similar to the inspection apparatus 100F in FIG. 13, and a main difference therebetween is that: the inspection apparatus 100L provided by this embodiment further includes a Z-axis translation stage 200, a height measurement module 300, and a carrier 30. In addition, a sensing probe P4 of the inspection apparatus 100L provided by this embodiment includes a beam splitter 192.

Referring to FIG. 26A, the sensing probe P4 is integrated with the Z-axis translation stage 200. The Z-axis translation stage 200 is adapted to drive the sensing probe P4 to move in a Z axis. One of the photoelectric sensor 152 of the sensing probe P4 and the height measurement module 300 is adapted to receive a light beam penetrating the beam splitter 192, and the other one of the photoelectric sensor 152 of the sensing probe P4 and the height measurement module 300 is adapted to receive a light beam reflected by the beam splitter 192. For instance, in this embodiment, the photoelectric sensor 152 of the sensing probe P4 is adapted to receive the light beam penetrating the beam splitter 192, and the height measurement module 300 is adapted to receive the light beam reflected by the beam splitter 192, which should however not be construed as a limitation in the disclosure.

In this embodiment, a portion of an optical path of the sensing probe P4 (e.g., an optical path between the to-beinspected light-emitting diodes 10 and the beam splitter 192) and a portion of an optical path of the height measurement module 300 (e.g., the optical path between the to-be-inspected light-emitting diodes 10 and the beam splitter 192) are substantially located on a same reference axis AX. In other words, a portion of the optical path of the sensing probe P4 and a portion of the optical path of the height measurement module 300 are substantially coaxial or parallel. In this way, a measurement error caused by misalignment of the sensing probe P4 and/or the height measurement module 300 is prevented from being introduced.

Referring to FIG. 26A, the carrier 30 is configured to carry the light-emitting diode wafer W and may move on a plane, where an X axis X and a Y axis Y are located on the plane, the X axis X, the Y axis Y, and the Z axis Z are perpendicular to one another, and the plane is the XY plane. The sensing probe P4 may move in the Z axis Z, the carrier 30 may move on the XY plane, and as movement of the two may match each other, the sensing probe P4 may measure the to-be-inspected regions O of the light-emitting diode wafer W disposed on the carrier 30.

In this embodiment, the height measurement module 300 may be fixed on one side of the sensing probe P4, and the Z-axis translation stage 200 may simultaneously drive the sensing probe P4 and the height measurement module 300 to move in the Z axis Z. The height measurement module 300 may move in the Z axis Z, the carrier 30 may move on the XY plane, and as movement of the two may be matched with each other, the height measurement module 300 may scan relative height information of a surface of the light-emitting diode wafer W disposed on the carrier 30.

For instance, in this embodiment, the height measurement module 300 may measure relative height information of a surface of an object by using a chromatic confocal (CC) method, a laser triangulation method, a laser confocal method, an optical coherence tomography (OCT) method, an autofocus method, a Mirau interferometer method, or other methods, which should however not be construed as a limitation in the disclosure.

An example of inspection of the light-emitting diode wafer W performed by the inspection apparatus 100L is provided below together with FIG. 26A to FIG. 26C and FIG. 27 according to an embodiment of the disclosure.

Referring to FIG. 26A and FIG. 27, first, step S11 is performed: a pre-scanning action is performed to find the relative height information of the surface of the light-emitting diode wafer W, and the $1^{st}$ relative height information to the $m^{th}$ relative height information corresponding to the $1^{st}$ scan region Rs1 to the $m^{th}$ scan region Rsm of the light-emitting diode wafer W are respectively obtained. To be specific, in this embodiment, the height measurement module 300 may be allowed to scan the scan regions Rs of the light-emitting diode wafer W to respectively obtain the $1^{st}$ relative height information to the $m^{th}$ relative height information corresponding to the $1^{st}$ scan region Rs1 to the $m^{th}$ scan region Rsm. Alternatively, based on these relative heights, plane warpage and bow information of the entire light-emitting diode wafer W may be obtained by mathematical calculations.

Referring to FIG. 26B and FIG. 27, next, step S12 is performed: one to-be-inspected region O is measured. To be specific, in this embodiment, the height measurement module 300 may be removed first, and next, the sensing probe P4 is allowed to measure a $1^{st}$ real-time distance between the photoelectric sensing structure S of the sensing probe P4 and the to-be-inspected region O (e.g., a $1^{st}$ to-be-inspected region O1) of the light-emitting diode wafer W.

For instance, in this embodiment, the sensing probe P4 has an internal Z-axis translation stage 157, and the internal Z-axis translation stage 157 may drive at least one lens element (not shown) of the lens 153 of the sensing probe P4 to move in the Z axis Z, so that the sensing probe P4 may measure the $1^{st}$ real-time distance between the photoelectric sensing structure S and the to-be-inspected region O of the light-emitting diode wafer W through an autofocus method. Nevertheless, in other embodiments, the sensing probe P4 may measure the $1^{st}$ real-time distance between the photoelectric sensing structure S and the to-be-inspected region O of the light-emitting diode wafer W by using the Mirau interferometer method or other methods as well, which should however not be construed as a limitation in the disclosure.

Next, the Z-axis translation stage 200 is allowed to adjust a distance between the photoelectric sensing structure S of the sensing probe P4 and the to-be-inspected region O of the light-emitting diode wafer W to a target distance D according to the $1^{st}$ real-time distance, where the target distance D is a predetermined value. Finally, when the target distance D between the photoelectric sensing structure S of the sensing probe P4 and the to-be-inspected region O of the light-emitting diode wafer W is kept, the sensing probe P4 is allowed to measure the to-be-inspected regions O of the light-emitting diode wafer W, and step S12 is completed herein.

Note that the process of allowing the sensing probe P4 to measure each of the to-be-inspected regions O of the light-emitting diode wafer W includes the following steps. The illumination beam L1 is allowed to simultaneously irradiate the light-emitting diodes 10 of each of the to-be-inspected regions O to generate a charge distribution, an electric field distribution, or a voltage distribution on the light-emitting diodes 10 of each of the to-be-inspected regions O due to a photovoltaic effect caused by the illumination beam L1. The sensing probe P4 measures the charge distribution, the electric field distribution, or the voltage distribution on the light-emitting diodes 10 of each of the to-be-inspected regions O when the target distance D between the photoelectric sensing structure S of the sensing probe P4 and each of the to-be-inspected regions O of the light-emitting diode wafer W is kept. The processing device 140 determines a plurality of electro-optical characteristics of the light-emitting diodes 10 of each of the to-be-inspected regions O according to the charge distribution, the electric field distribution, or the voltage distribution on the light-emitting diodes 10 of each of the to-be-inspected regions O measured by the sensing probe P4. The process and principle of measurement of each of the to-be-inspected regions O performed by the sensing probe P4 have been described in the previous paragraphs and thus will not be further explained.

Referring to FIG. 26C and FIG. 27, next, step S13 is performed: the target distance D is allowed to be reached between the photoelectric sensing structure S of the sensing probe P4 and the next to-be-inspected region O of the light-emitting diode wafer W. For instance, in this embodiment, the Z-axis translation stage 200 may be allowed to adjust a distance between the photoelectric sensing structure S of the sensing probe P4 and the next to-be-inspected region O of the light-emitting diode wafer W to the target distance D according to at least two of the $1^{st}$ relative height information to the $m^{th}$ relative height information.

Referring to FIG. 26C and FIG. 27, next, step S14 is performed: when the target distance D between the photoelectric sensing structure S of the sensing probe P4 and the next to-be-inspected region O of the light-emitting diode wafer W is kept, the sensing probe P4 is allowed to measure the next to-be-inspected regions O of the light-emitting diode wafer W.

Next, step S13 and step S14 are repeated until measurement of all of the to-be-inspected regions O of the light-emitting diode wafer W is completed.

Note that in this embodiment, the pre-obtained relative height information of the surface of the light-emitting diode wafer W is used to adjust the distance between the photoelectric sensing structure S of the sensing probe P4 and the each of the to-be-inspected regions O of the light-emitting diode wafer W, so that when the sensing probe P4 measures each of the to-be-inspected regions O, the target distance D between the photoelectric sensing structure S and each of the to-be-inspected regions O of the light-emitting diode wafer W is kept all the time. In this way, even though the light-emitting diode wafer W itself is warped or bow or upper and lower mechanisms (e.g., the sensing probe P4 and the carrier 30) are not parallel due to processing or assembly, when each of the to-be-inspected regions O of the light-emitting diode wafer W is inspected, the distance between each of the to-be-inspected regions O of the light-emitting diode wafer W and the sensing probe P4 may still be kept to be identical, and correct and accurate inspection results are thereby obtained.

Figure 28A:
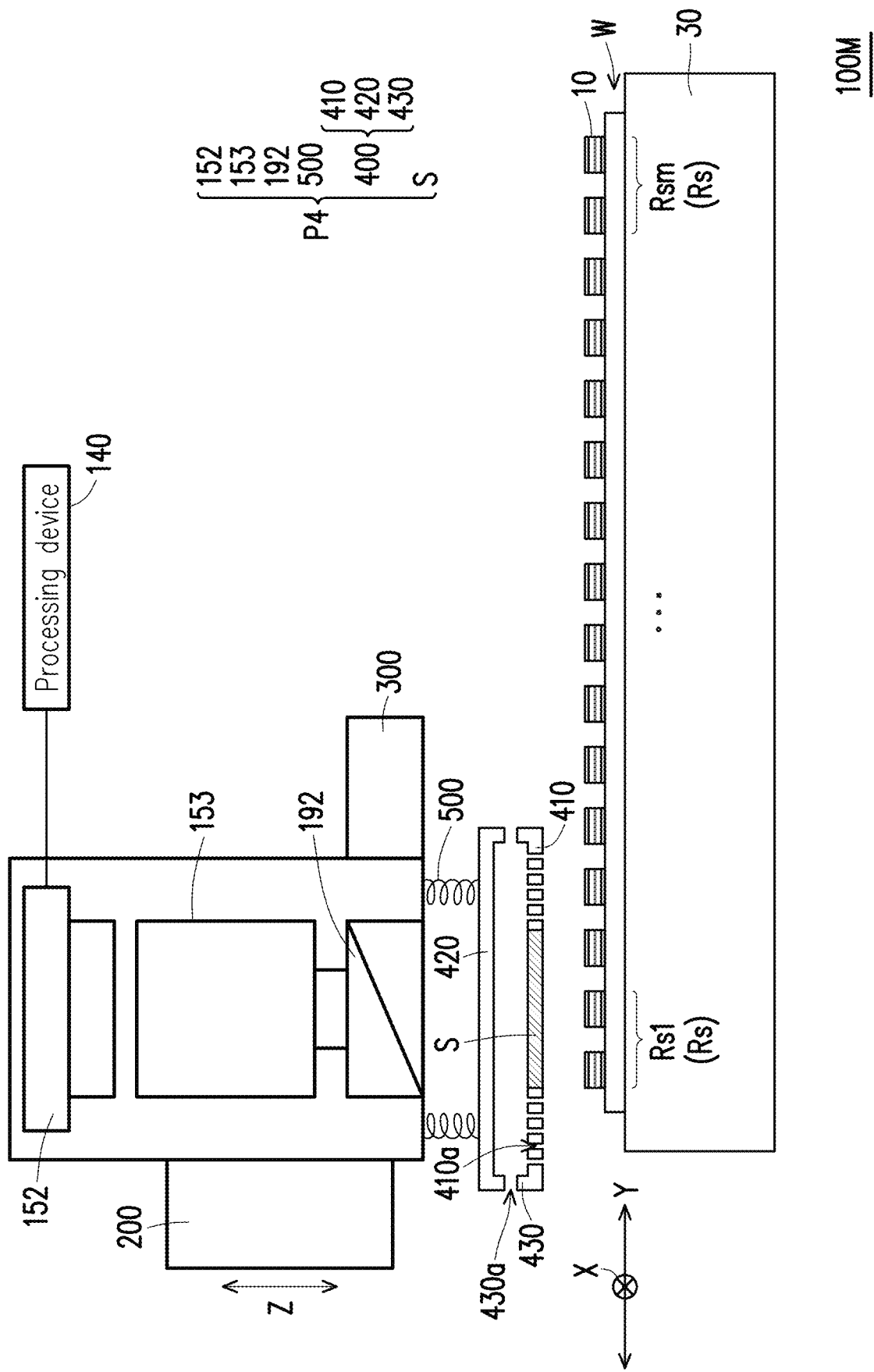
FIG. 28A to FIG. 28C illustrate an inspection apparatus 100M and a process for inspecting the light-emitting diode wafer W according to an embodiment of the disclosure.
Figure 28B:
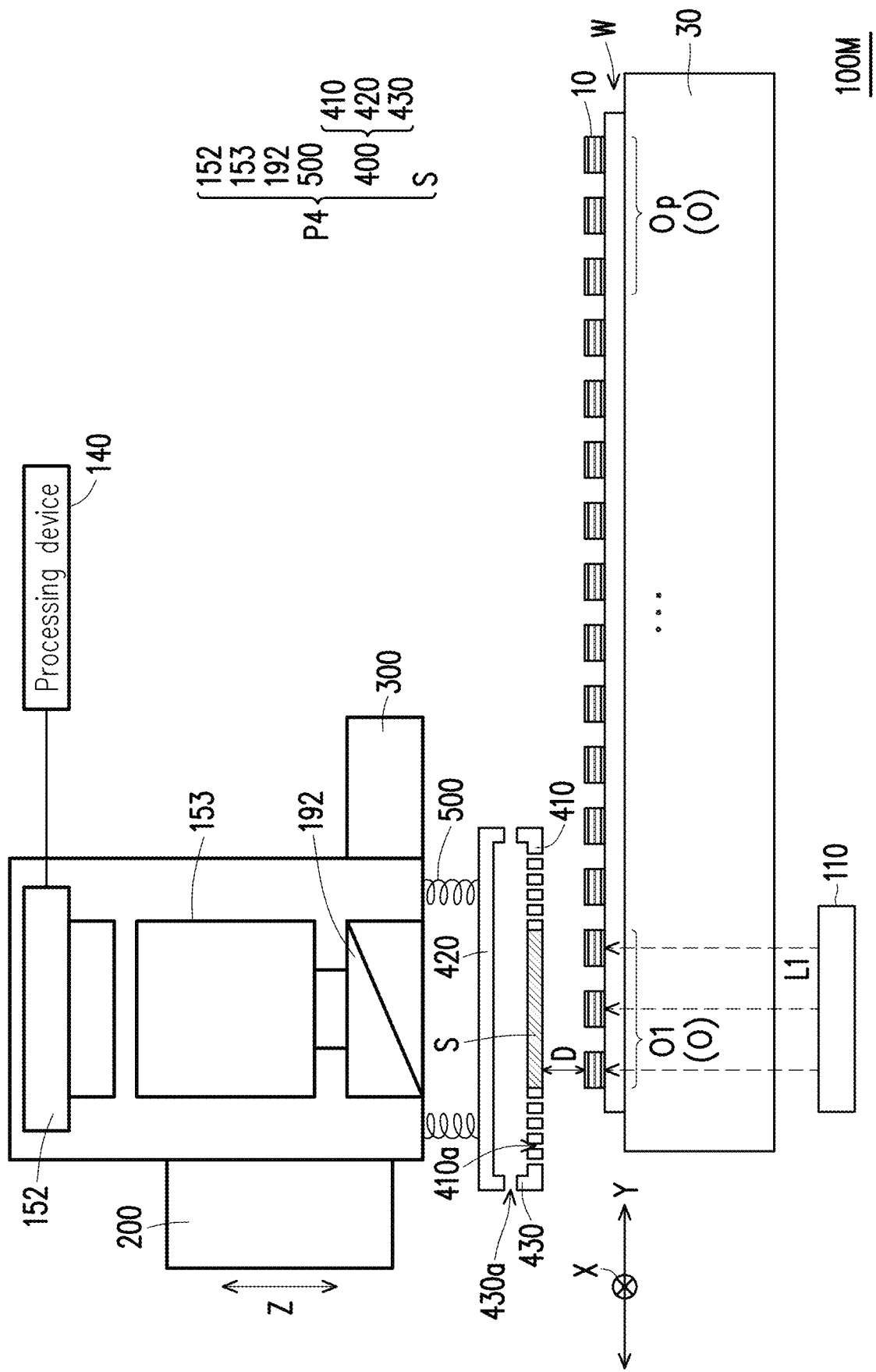
Figure 28C:
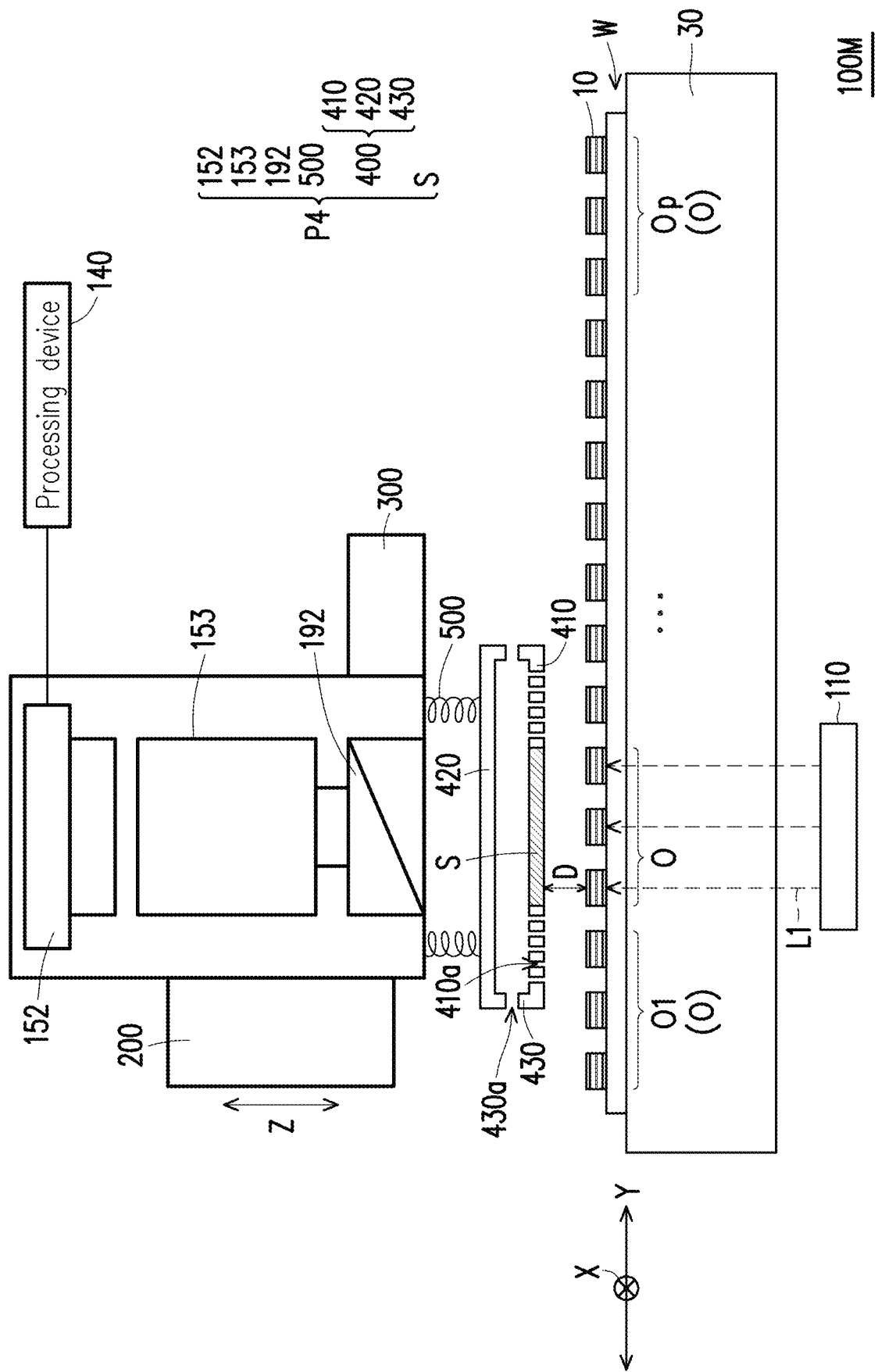

FIG. 28A to FIG. 28C illustrate an inspection apparatus 100M and a process for inspecting the light-emitting diode wafer W according to an embodiment of the disclosure.

FIG. 29 is a schematic flow chart of an inspection method for inspecting the light-emitting diodes 10 according to an embodiment of the disclosure.

The inspection apparatus 100M in FIG. 28A to FIG. 28C is similar to the inspection apparatus 100L in FIG. 26A to FIG. 26C, and description thereof is not repeated herein. A difference between an inspection process in FIG. 29 and the inspection process in FIG. 27 is mainly described as follows together with FIG. 28A to FIG. 28C.

Referring to FIG. 28A and FIG. 29, similarly, first, step S21 is performed: a pre-scanning action is performed to find the relative height information of the surface of the light-emitting diode wafer W, and the $1^{st}$ relative height information to the $m^{th}$ relative height information corresponding to the 1st scan region Rs1 to the $m^{th}$ scan region Rsm of the light-emitting diode wafer W are respectively obtained. To be specific, the height measurement module 300 may be allowed to scan the scan regions Rs of the light-emitting diode wafer W to respectively obtain the $1^{st}$ relative height information to the $m^{th}$ relative height information corresponding to the $1^{st}$ scan region Rs1 to the $m^{th}$ scan region Rsm.

Referring to FIG. 28B and FIG. 29, next, step S22 is performed: one to-be-inspected region O (e.g., the $1^{st}$ to-be-inspected region O1) is measured. The difference between this process and the process of the inspection method of the light-emitting diodes 10 in FIG. 27 is that: in this embodiment, the height measurement module 300 is allowed to measure the $1^{st}$ real-time distance between the photoelectric sensing structure S of the sensing probe P4 and the to-be-inspected region O of the light-emitting diode wafer W. Next, similarly, the Z-axis translation stage 200 is allowed to adjust the distance between the photoelectric sensing structure S of the sensing probe P4 and the to-be-inspected region O of the light-emitting diode wafer W to the target distance D according to the $1^{st}$ real-time distance. Finally, the sensing probe P4 is allowed to measure the light-emitting diodes 10 of one to-be-inspected region O, and step S22 is completed herein.

Referring to FIG. 28C and FIG. 29, next, step S23 is performed: the target distance D is allowed to be reached between the photoelectric sensing structure S of the sensing probe P4 and the next to-be-inspected region O of the light-emitting diode wafer W. For instance, in this embodiment, the Z-axis translation stage 200 may be allowed to adjust the distance between the photoelectric sensing structure S of the sensing probe P4 and the next to-be-inspected region O of the light-emitting diode wafer W to the target distance D according to at least two of the $1^{st}$ relative height information to the $m^{th}$ relative height information.

Referring to FIG. 28C and FIG. 29, next, step S24 is performed: when the target distance D between the photoelectric sensing structure S of the sensing probe P4 and the next to-be-inspected region O of the light-emitting diode wafer W is kept, the sensing probe P4 is allowed to measure the next to-be-inspected region O of the light-emitting diode wafer W.

Next, step S23 and step S24 are repeated until measurement of all of the to-be-inspected regions O of the light-emitting diode wafer W is completed. In the measurement steps of FIG. 27 and FIG. 29, the height measurement module 300 may be removed when the to-be-inspected regions O are measured.

Figure 30A:
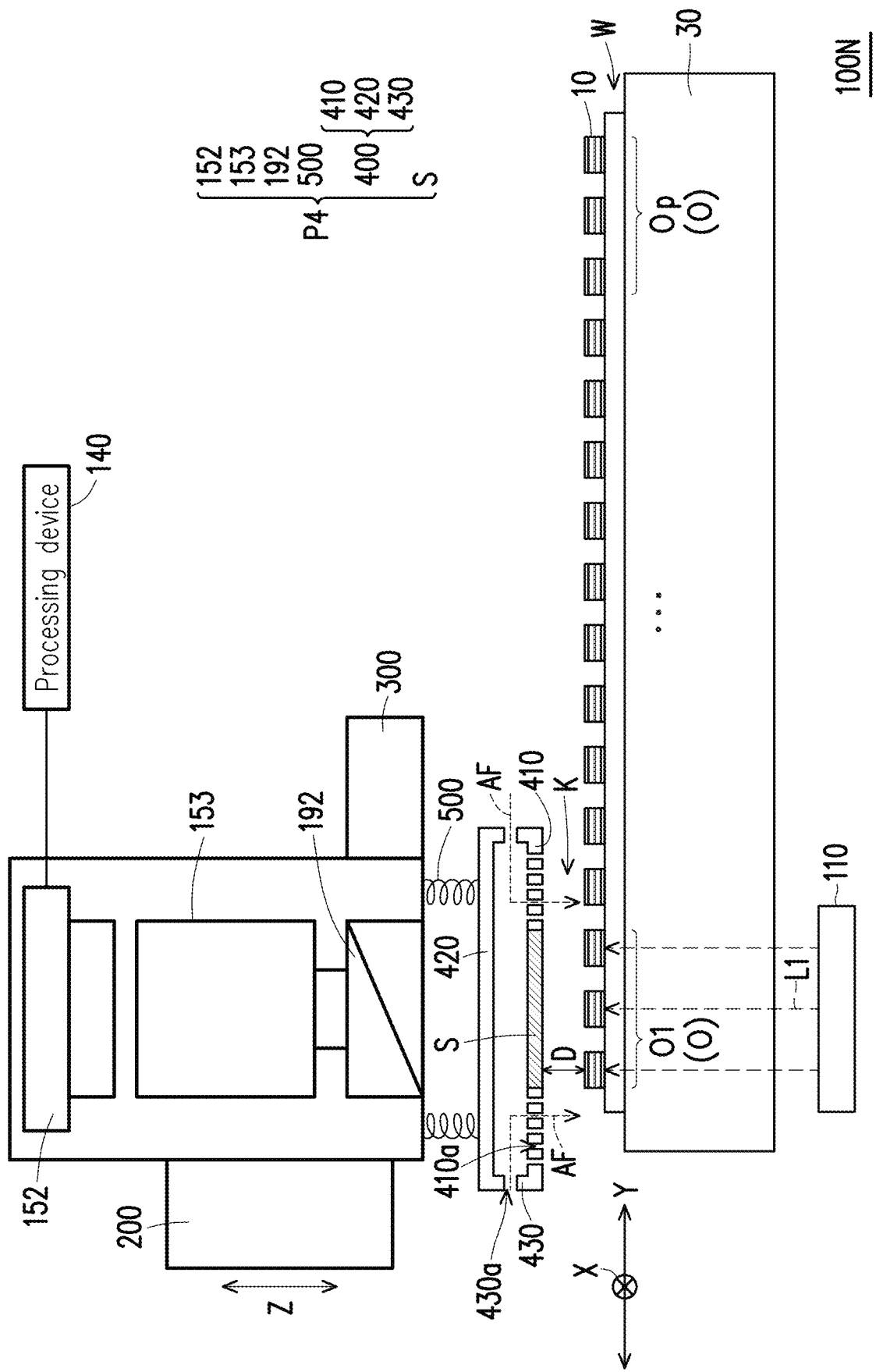
FIG. 30A to FIG. 30B illustrate an inspection apparatus 100N and a process for inspecting the light-emitting diode wafer W according to an embodiment of the disclosure.
Figure 30B:
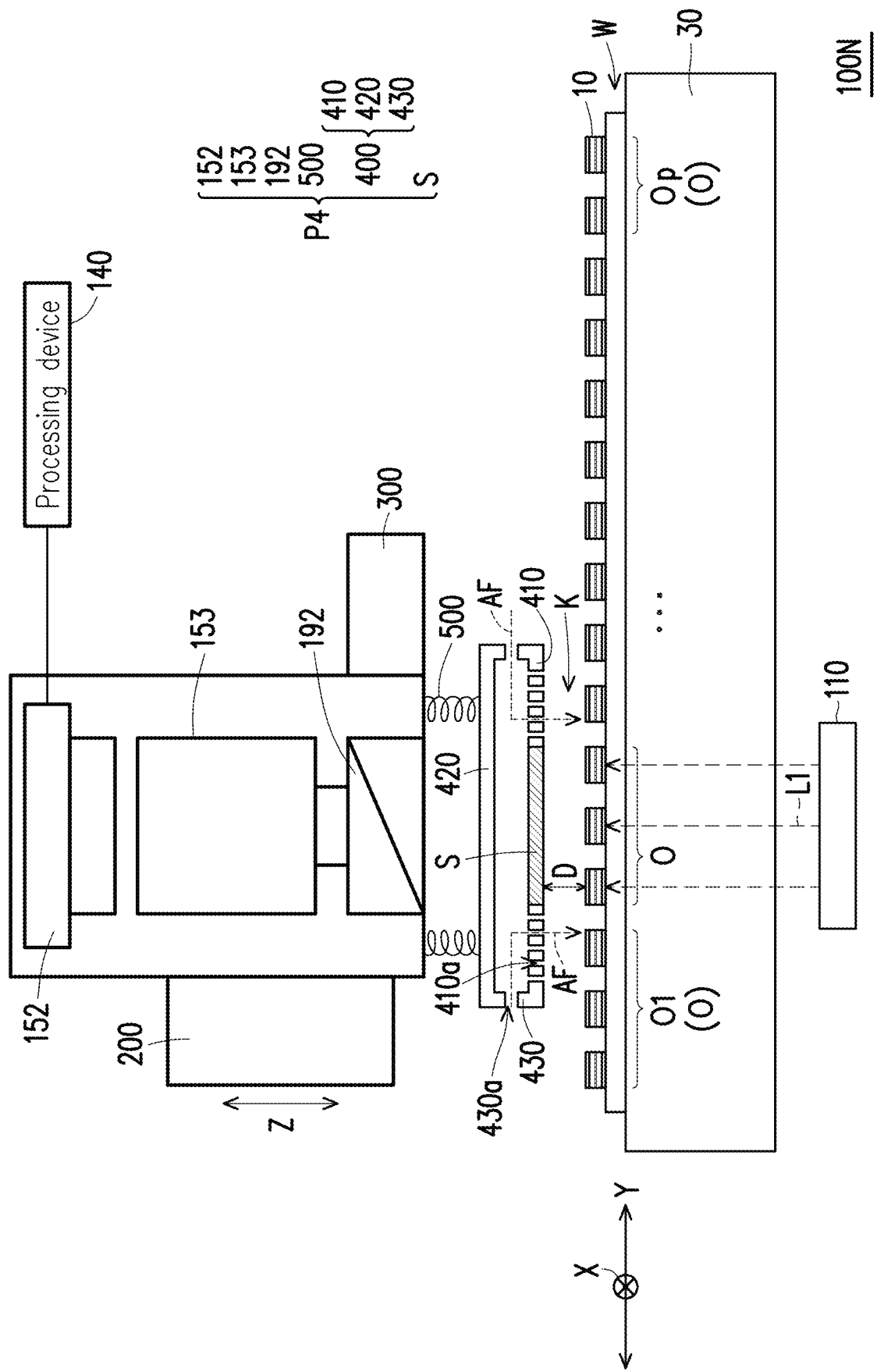

FIG. 30A to FIG. 30B illustrate an inspection apparatus 100N and a process for inspecting the light-emitting diode wafer W according to an embodiment of the disclosure.

FIG. 31 is a schematic flow chart of an inspection method for inspecting the light-emitting diodes 10 according to an embodiment of the disclosure.

The inspection apparatus 100N in FIG. 30A to FIG. 30B is similar to the inspection apparatus 100L in FIG. 26A to FIG. 26C, and description thereof is not repeated herein. A difference between an inspection process in FIG. 31 and the inspection process in FIG. 27 is mainly described as follows together with FIG. 30A to FIG. 30B.

Referring to FIG. 30A and FIG. 31, a difference between this inspection process and the inspection process of FIG. 27 is that: in this embodiment, a pre-scanning action may not be performed, and when each of the to-be-inspected regions O is measured, a real-time distance between each of the to-be-inspected regions O and the photoelectric sensing structure S of the sensing probe P4 is measured in real time. Next, the distance between the photoelectric sensing structure S and each of the to-be-inspected regions O is adjusted to the target distance D according to the real-time distance, and when the target distance D is kept, each of the to-be-inspected regions O is measured.

Referring to FIG. 30A and FIG. 31, to be specific, in this embodiment, step S31 may be directly performed: a first to-be-inspected region O is measured. To be specific, the height measurement module 300 may be allowed to measure the $1^{st}$ real-time distance between the photoelectric sensing structure S of the sensing probe P4 and the $1^{st}$ to-be-inspected region O of the light-emitting diode wafer W first, and the Z-axis translation stage 200 is allowed to adjust the distance between the photoelectric sensing structure S of the sensing probe P4 and the $1^{st}$ to-be-inspected region O of the light-emitting diode wafer W to the target distance D according to the $1^{st}$ real-time distance. Next, when the target distance D between the photoelectric sensing structure S of the sensing probe P4 and the $1^{st}$ to-be-inspected region O of the light-emitting diode wafer W is kept, the sensing probe P4 is allowed to measure the $1^{st}$ to-be-inspected region O of the light-emitting diode wafer W, and step S31 is completed herein.

Referring to FIG. 30B and FIG. 31, next, step S32 is performed: the target distance D is allowed to be reached between the photoelectric sensing structure S of the sensing probe P4 and the next to-be-inspected region O of the light-emitting diode wafer W. For instance, in this embodiment, the height measurement module 300 may be allowed to measure the real-time distance (i.e., an $n^{th}$ real-time distance) between the photoelectric sensing structure S of the sensing probe P4 and the next to-be-inspected region O of the light-emitting diode wafer W, and the Z-axis translation stage 200 is allowed to adjust the distance between the photoelectric sensing structure S of the sensing probe P4 and the next to-be-inspected region O of the light-emitting diode wafer W to the target distance D according to the real-time distance (i.e., the $n^{th}$ real-time distance).

Referring to FIG. 30B and FIG. 31, next, step S33 is performed: when the target distance D between the photoelectric sensing structure S of the sensing probe P4 and the next to-be-inspected region O of the light-emitting diode wafer W is kept, the sensing probe P4 is allowed to measure the next to-be-inspected region O of the light-emitting diode wafer W. Next, step S32 and step S33 are repeated until measurement of all of the to-be-inspected regions O of the light-emitting diode wafer W is completed.

Figure 32:
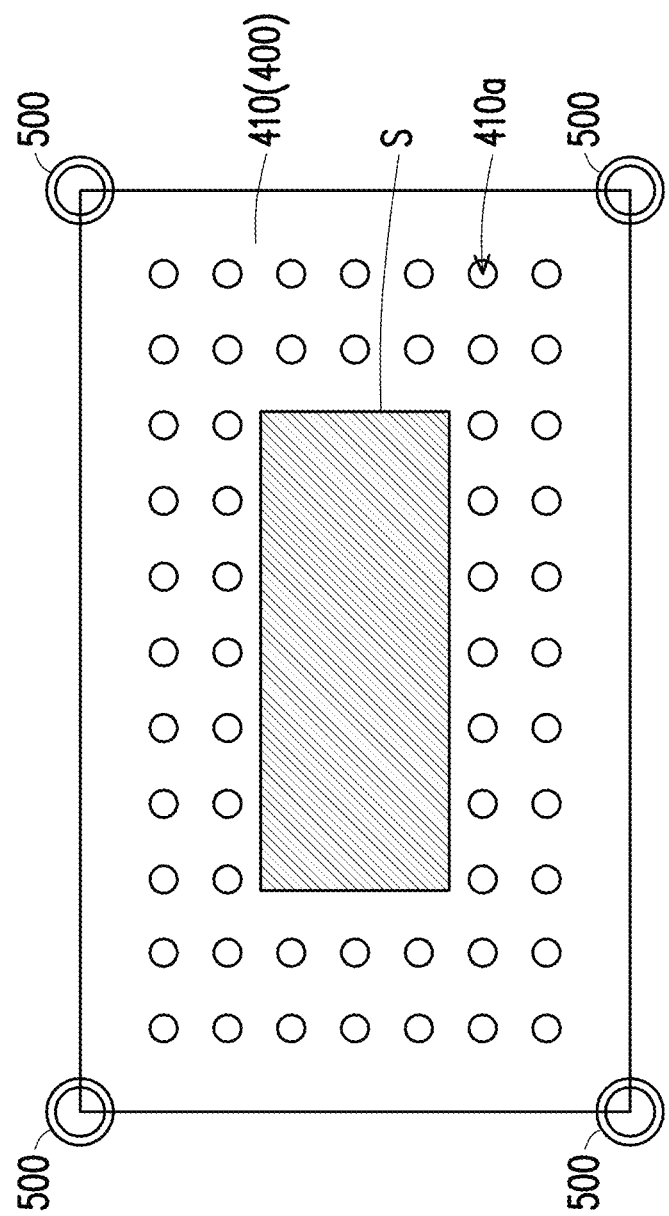
FIG. 32 is a bottom schematic view of a photoelectric sensing structure S, a holder 400, and a force deformation device 500 according to an embodiment of the disclosure.

FIG. 32 is a bottom schematic view of the photoelectric sensing structure S, a holder 400, and a force deformation device 500 according to an embodiment of the disclosure.

With reference to FIG. 30A and FIG. 32, in this embodiment, the sensing probe P4 of the inspection apparatus 100N further includes the holder 400 and the force deformation device 500 (such as but not limited to, a spring). The holder 400 is configured to hold the photoelectric sensing structure S and is provided with a plurality of air outlet holes 410a disposed around the photoelectric sensing structure S. To be more specific, in this embodiment, the holder 400 has a first portion 410 and a second portion 420 opposite to each other, the first portion 410 of the holder 400 is configured to hold the photoelectric sensing structure S and is provided with the plurality of air outlet holes 410a disposed around the photoelectric sensing structure S, and the second portion 420 of the holder 400 is suspended by the force deformation device 500. The holder 400 is further provided with a third portion 430 disposed between the first portion 410 and the second portion 420, and the third portion 430 has at least one air inlet hole 430a. Airflow AF may flow inside the holder 400 from the air inlet hole 430a and then flows towards a space K between the sensing probe P4 and the light-emitting diode wafer W from the air outlet holes 410a of the holder 400.

Note that when the airflow AF flows from the air outlet holes 410a of the holder 400 to the space K between the sensing probe P4 and the light-emitting diode wafer W, a first force is caused on the holder 400, and at the same time, the force deformation device 500 causes a second force on the holder 400. A balance among the first force, the second force, and a gravity may be used to adjust parallelism between the photoelectric sensing structure S of the sensing probe P4 and each of the to-be-inspected regions O of the light-emitting diode wafer W, so that the photoelectric sensing structure S of the sensing probe P4 and the light-emitting diode wafer W are allowed to be substantially parallel.

The method of adjusting the parallelism between the photoelectric sensing structure S and each of the to-be-inspected regions O of the light-emitting diode wafer W may be used in the process of scanning and/or measuring each of the to-be-inspected regions O of the light-emitting diode wafer W in real time to obtain correct and accurate inspection results.

In addition, the holder 400 and the force deformation device 500 may also be installed in the sensing probe P4 of FIG. 26A to FIG. 26C and in the sensing probe P4 of FIG. 28A to FIG. 28C. Further, the method of adjusting the parallelism between the photoelectric sensing structure S and the light-emitting diode wafer W may also be applied in the process of measuring each of the to-be-inspected regions O of the light-emitting diode wafer W in the inspection apparatus 100L and the inspection apparatus 100M, and the method of adjusting the parallelism between the photoelectric sensing structure S and each of the to-be-inspected regions O of the light-emitting diode wafer W may also be applied in the process of pre-scanning, real-time scanning, and/or measuring of each of the to-be-inspected regions O of the light-emitting diode wafer W, and description thereof is not provided herein.

In view of the foregoing, in the inspection method for inspecting the light-emitting diodes according to an embodiment of the disclosure, through pre-scanning or real-time scanning of the light-emitting diode wafer, before each of the to-be-inspected regions of the light-emitting diode wafer is actually measured, the distance between each of the to-be-inspected regions and the photoelectric sensing structure of the sensing probe may be adjusted to a fixed target distance. In this way, even though the light-emitting diode wafer itself is warped or the upper and lower mechanisms are not parallel due to processing or assembly, when each of the to-be-inspected regions of the light-emitting diode wafer is inspected, the distance between each of the to-be-inspected regions of the light-emitting diode wafer and the sensing probe may still be kept to be identical, and correct and accurate inspection results are thereby obtained.

What is claimed is:

1. An inspection method for inspecting light-emitting diodes, comprising
providing a light-emitting diode wafer comprising a plurality of light-emitting diodes, wherein the light-emitting diode wafer comprises a plurality of scan regions, each of the scan regions has a plurality of first light-emitting diodes of the plurality of light-emitting diodes, the scan regions comprise m scan regions, the m scan regions comprise a $1^{st}$ scan region to a $m^{th}$ scan region, and m is a positive integer greater than or equal to 2;
scanning the $1^{st}$ scan region to the $m^{th}$ scan region of the light-emitting diode wafer to respectively obtain $1^{st}$ relative height information to $m^{th}$ relative height information corresponding to the $1^{st}$ scan region to the $m^{th}$ scan region;
the light-emitting diode wafer comprising a plurality of to-be-inspected regions, each of the to-be-inspected regions comprising a plurality of second light-emitting diodes of the plurality of light-emitting diodes, measuring a $1^{st}$ real-time distance between a photoelectric sensing structure of a sensing probe and one of the to-be-inspected regions of the light-emitting diode wafer and adjusting a distance between the photoelectric sensing structure of the sensing probe and the to-be-inspected region of the light-emitting diode wafer to a target distance according to the $1^{st}$ real-time distance;
allowing an illumination beam to simultaneously irradiate the plurality of second light-emitting diodes of the to-be-inspected region to generate a first charge distribution, a first electric field distribution, or a first voltage distribution on the plurality of second light-emitting diodes of the to-be-inspected region due to a photovoltaic effect caused by the illumination beam;

using the sensing probe to measure the first charge distribution, the first electric field distribution, or the first voltage distribution on the plurality of second light-emitting diodes of the to-be-inspected region to determine a plurality of first electro-optical characteristics of the plurality of second light-emitting diodes of the to-be-inspected region when the target distance between the photoelectric sensing structure of the sensing probe and the to-be-inspected region of the light-emitting diode wafer is kept;

adjusting a distance between the photoelectric sensing structure of the sensing probe and a next to-be-inspected region of the light-emitting diode wafer to the target distance according to at least two of the $1^{st}$ relative height information to the $m^{th}$ relative height information;

allowing the illumination beam to simultaneously irradiate the plurality of second light-emitting diodes of the next to-be-inspected region to generate a second charge distribution, a second electric field distribution, or a second voltage distribution on the plurality of second light-emitting diodes of the next to-be-inspected region due to the photovoltaic effect caused by the illumination beam; and using the sensing probe to measure the second charge distribution, the second electric field distribution, or the second voltage distribution on the plurality of second light-emitting diodes of the next to-be-inspected region to determine a plurality of second electro-optical characteristics of the plurality of second light-emitting diodes of the next to-be-inspected region when the target distance between the photoelectric sensing structure of the sensing probe and the next to-be-inspected region of the light-emitting diode wafer is kept.

2. The inspection method for inspecting the light-emitting diodes according to claim 1, wherein the step of scanning the m scan regions of the light-emitting diode wafer to respectively obtain the $1^{st}$ relative height information to the $m^{th}$ relative height information corresponding to the $1^{st}$ scan region to the $m^{th}$ scan region further comprises:

using a height measurement module to scan the m scan regions of the light-emitting diode wafer to respectively obtain the $1^{st}$ relative height information to the $m^{th}$ relative height information corresponding to the $1^{st}$ scan region to the $m^{th}$ scan region.

3. The inspection method for inspecting the light-emitting diodes according to claim 2, wherein a portion of an optical path of the sensing probe and a portion of an optical path of the height measurement module are substantially coaxial or parallel.

4. The inspection method for inspecting the light-emitting diodes according to claim 2, wherein the step of measuring the $1^{st}$ real-time distance between the photoelectric sensing structure of the sensing probe and the to-be-inspected region of the light-emitting diode wafer further comprises:

using the sensing probe to measure the $1^{st}$ real-time distance between the photoelectric sensing structure of the sensing probe and the to-be-inspected region of the light-emitting diode wafer through an autofocus method.

5. The inspection method for inspecting the light-emitting diodes according to claim 2, wherein the step of measuring the $1^{st}$ real-time distance between the photoelectric sensing structure of the sensing probe and the to-be-inspected region of the light-emitting diode wafer further comprises:

using the height measurement module to measure the $1^{st}$ real-time distance between the photoelectric sensing structure of the sensing probe and the to-be-inspected region of the light-emitting diode wafer.

6. The inspection method for inspecting the light-emitting diodes according to claim 1, further comprising:

adjusting parallelism between the photoelectric sensing structure of the sensing probe and each of the to-be-inspected regions of the light-emitting diode wafer.

7. The inspection method for inspecting the light-emitting diodes according to claim 6, wherein the sensing probe further comprises a holder configured to hold the photoelectric sensing structure and provided with a plurality of air outlet holes disposed around the photoelectric sensing structure, and the step of adjusting the parallelism between the photoelectric sensing structure of the sensing probe and each of the to-be-inspected regions of the light-emitting diode wafer further comprises:

allowing airflow to flow from the air outlet holes of the holder to a space between the sensing probe and the light-emitting diode wafer to cause a first force on the holder; and using the first force to adjust the parallelism between the photoelectric sensing structure of the sensing probe and each of the to-be-inspected regions of the light-emitting diode wafer.

8. The inspection method for inspecting the light-emitting diodes according to claim 7, wherein the sensing probe further comprises a force deformation device, the holder has a first portion and a second portion opposite to each other, the first portion of the holder holds the photoelectric sensing structure and has the air outlet holes disposed around the photoelectric sensing structure, the second portion of the holder is suspended on the force deformation device, the force deformation device causes a second force on the holder, and the step of using the first force to adjust the parallelism between the photoelectric sensing structure of the sensing probe and each of the to-be-inspected regions of the light-emitting diode wafer further comprises:

using a balance among the first force, the second force, and a gravity to allow the photoelectric sensing structure of the sensing probe and each of the to-be-inspected regions of the light-emitting diode wafer to be substantially parallel.

9. An inspection apparatus, configured to inspect a light-emitting diode wafer and comprising:

a Z-axis translation stage;

a sensing probe, integrated with the Z-axis translation stage, wherein the Z-axis translation stage is adapted to drive the sensing probe to move in a Z axis, and the sensing probe comprises a photoelectric sensor, a beam splitter, and a photoelectric sensing structure;

a height measurement module, wherein one of the photoelectric sensor of the sensing probe and the height measurement module is adapted to receive a light beam penetrating the beam splitter, and the other one of the photoelectric sensor of the sensing probe and the height measurement module is adapted to receive a light beam reflected by the beam splitter;

a carrier configured to carry the light-emitting diode wafer and capable of moving on a plane, wherein an X axis and a Y axis are located on the plane, and the X axis, the Y axis, and the Z axis are perpendicular to one another;

an illumination light source configured to emit an illumination beam to irradiate the light-emitting diode wafer; and a processing device, wherein the light-emitting diode wafer comprises a plurality of light-emitting diodes, the light-emitting diode wafer comprises a plurality of scan regions, each of the scan regions has a plurality of first light-emitting diodes of the plurality of light-emitting diodes, the scan regions comprise m scan regions, the m scan regions comprise a $1^{st}$ scan region to a $m^{th}$ scan region, and m is a positive integer greater than or equal to 2;

the height measurement module scans the $1^{st}$ scan region to the $m^{th}$ scan region of the light-emitting diode wafer to respectively obtain $1^{st}$ relative height information to $m^{th}$ relative height information corresponding to the $1^{st}$ scan region to the $m^{th}$ scan region;

the light-emitting diode wafer comprises a plurality of to-be-inspected regions, each of the to-be-inspected regions has a plurality of second light-emitting diodes of the plurality of light-emitting diodes, the height measurement module or the sensing probe measures a $1^{st}$ real-time distance between the photoelectric sensing structure of the sensing probe and one of the to-be-inspected regions of the light-emitting diode wafer, and the Z-axis translation stage adjusts a distance between the photoelectric sensing structure of the sensing probe and the to-be-inspected region of the light-emitting diode wafer to a target distance according to the $1^{st}$ real-time distance;

the illumination beam simultaneously irradiates the plurality of second light-emitting diodes of the to-be-inspected region to generate a first charge distribution, a first electric field distribution, or a first voltage distribution on the plurality of second light-emitting diodes of the to-be-inspected region due to a photovoltaic effect caused by the illumination beam;

the sensing probe measures the charge distribution, the electric field distribution, or the voltage distribution on the plurality of second light-emitting diodes of the to-be-inspected region when the target distance between the photoelectric sensing structure of the sensing probe and the to-be-inspected region of the light-emitting diode wafer is kept;

the processing device determines a plurality of first electro-optical characteristics of the plurality of second light-emitting diodes of the to-be-inspected region according to the first charge distribution, the first electric field distribution, or the first voltage distribution on the plurality of second light-emitting diodes of the to-be-inspected region measured by the sensing probe;

the Z-axis translation stage adjusts a distance between the photoelectric sensing structure of the sensing probe and a next to-be-inspected region of the light-emitting diode wafer to the target distance according to at least two of the $1^{st}$ relative height information to the $m^{th}$ relative height information;

the illumination beam simultaneously irradiates the plurality of second light-emitting diodes of the next to-be-inspected region to generate a second charge distribution, a second electric field distribution, or a second voltage distribution on the plurality of second light-emitting diodes of the next to-be-inspected region due to the photovoltaic effect caused by the illumination beam;

the sensing probe measures the second charge distribution, the second electric field distribution, or the second voltage distribution on the plurality of second light-emitting diodes of the next to-be-inspected region when the target distance between the photoelectric sensing structure of the sensing probe and the next to-be-inspected region of the light-emitting diode wafer is kept; and the processing device determines a plurality of second electro-optical characteristics of the plurality of second light-emitting diodes of the next to-be-inspected region according to the second charge distribution, the second electric field distribution, or the second voltage distribution on the plurality of second light-emitting diodes of the next to-be-inspected region measured by the sensing probe.

10. The inspection apparatus according to claim 9, wherein a portion of an optical path of the sensing probe and a portion of an optical path of the height measurement module are substantially coaxial or parallel.

11. The inspection apparatus according to claim 9, wherein the sensing probe measures the $1^{st}$ real-time distance between the photoelectric sensing structure of the sensing probe and the to-be-inspected region of the light-emitting diode wafer through an autofocus method.

12. The inspection apparatus according to claim 9, wherein the sensing probe further comprises:

a holder configured to hold the photoelectric sensing structure and provided with a plurality of air outlet holes disposed around the photoelectric sensing structure.

13. The inspection apparatus according to claim 12, further comprising:

a force deformation device, wherein the holder has a first portion and a second portion opposite to each other, the first portion of the holder holds the photoelectric sensing structure and has the air outlet holes disposed around the photoelectric sensing structure, and the second portion of the holder is suspended on the force deformation device.

14. The inspection apparatus according to claim 13, wherein the holder further comprises a third portion disposed between the first portion and the second portion, and the third portion has at least one air inlet hole.

15. An inspection method for inspecting light-emitting diodes, comprising providing a light-emitting diode wafer comprising a plurality of to-be-inspected regions, wherein each of the to-be-inspected regions has a plurality of light-emitting diodes;

using a height measurement module to measure a $1^{st}$ real-time distance between a photoelectric sensing structure of a sensing probe and one of the to-be-inspected regions of the light-emitting diode wafer and adjusting a distance between the photoelectric sensing structure of the sensing probe and the to-be-inspected region of the light-emitting diode wafer to a target distance according to the $1^{st}$ real-time distance;

allowing an illumination beam to simultaneously irradiate the light-emitting diodes of the to-be-inspected region to generate a first charge distribution, a first electric field distribution, or a first voltage distribution on the light-emitting diodes of the to-be-inspected region due to a photovoltaic effect caused by the illumination beam;

using the sensing probe to measure the first charge distribution, the first electric field distribution, or the first voltage distribution on the light-emitting diodes of the to-be-inspected region to determine a plurality of first electro-optical characteristics of the light-emitting diodes of the to-be-inspected region when the target distance between the photoelectric sensing structure of the sensing probe and the to-be-inspected region of the light-emitting diode wafer is kept;

using the height measurement module to measure a $n^{th}$ real-time distance between the photoelectric sensing structure of the sensing probe and a next to-be-inspected region of the light-emitting diode wafer, adjusting a distance between the photoelectric sensing structure of the sensing probe and the next to-be-inspected region of the light-emitting diode wafer to a target distance according to the $n^{th}$ real-time distance;

allowing the illumination beam to simultaneously irradiate the light-emitting diodes of the next to-be-inspected region to generate a second charge distribution, a second electric field distribution, or a second voltage distribution on the light-emitting diodes of the next to-be-inspected region due to the photovoltaic effect caused by the illumination beam; and using the sensing probe to measure the second charge distribution, the second electric field distribution, or the second voltage distribution on the light-emitting diodes of the next to-be-inspected region to determine a plurality of second electro-optical characteristics of the light-emitting diodes of the next to-be-inspected region when the target distance between the photoelectric sensing structure of the sensing probe and the next to-be-inspected region of the light-emitting diode wafer is kept.

16. The inspection method for inspecting the light-emitting diodes according to claim 15, wherein a portion of an optical path of the sensing probe and a portion of an optical path of the height measurement module are substantially coaxial or parallel.

17. The inspection method for inspecting the light-emitting diodes according to claim 15, further comprising:

adjusting parallelism between the photoelectric sensing structure of the sensing probe and each of the to-be-inspected regions of the light-emitting diode wafer.

18. The inspection method for inspecting the light-emitting diodes according to claim 17, wherein the sensing probe further comprises a holder configured to hold the photoelectric sensing structure and provided with a plurality of air outlet holes disposed around the photoelectric sensing structure, and the step of adjusting the parallelism between the photoelectric sensing structure of the sensing probe and each of the to-be-inspected regions of the light-emitting diode wafer further comprises:

allowing airflow to flow from the air outlet holes of the holder to a space between the sensing probe and the light-emitting diode wafer to cause a first force on the holder; and using the first force to adjust the parallelism between the photoelectric sensing structure of the sensing probe and each of the to-be-inspected regions of the light-emitting diode wafer.

19. The inspection method for inspecting the light-emitting diodes according to claim 18, wherein the sensing probe further comprises a force deformation device, the holder has a first portion and a second portion opposite to each other, the first portion of the holder holds the photoelectric sensing structure and has the air outlet holes disposed around the photoelectric sensing structure, the second portion of the holder is suspended on the force deformation device, the force deformation device causes a second force on the holder, and the step of using the first force to adjust the parallelism between the photoelectric sensing structure of the sensing probe and each of the to-be-inspected regions of the light-emitting diode wafer further comprises:

using a balance among the first force, the second force, and a gravity to allow the photoelectric sensing structure of the sensing probe and each of the to-be-inspected regions of the light-emitting diode wafer to be substantially parallel.

20. An inspection apparatus, configured to inspect a light-emitting diode wafer and comprising:

a Z-axis translation stage;

a sensing probe, integrated with the Z-axis translation stage, wherein the Z-axis translation stage is adapted to drive the sensing probe to move in a Z axis, and the sensing probe comprises a photoelectric sensor, a beam splitter, and a photoelectric sensing structure;

a height measurement module, wherein one of the photoelectric sensor of the sensing probe and the height measurement module is adapted to receive a light beam penetrating the beam splitter, and the other one of the photoelectric sensor of the sensing probe and the height measurement module is adapted to receive a light beam reflected by the beam splitter;

a carrier configured to carry the light-emitting diode wafer and capable of moving on a plane, wherein an X axis and a Y axis are located on the plane, and the X axis, the Y axis, and the Z axis are perpendicular to one another;

an illumination light source configured to emit an illumination beam to irradiate the light-emitting diode wafer; and a processing device, wherein the light-emitting diode wafer comprises a plurality of to-be-inspected region, wherein each of the to-be-inspected regions has a plurality of light-emitting diodes;

the height measurement module measures a $1^{st}$ real-time distance between a photoelectric sensing structure of the sensing probe and one of the to-be-inspected regions of the light-emitting diode wafer, the Z-axis translation stage adjusts a distance between the photoelectric sensing structure of the sensing probe and the to-be-inspected region of the light-emitting diode wafer to a target distance according to the $1^{st}$ real-time distance;

the illumination beam simultaneously irradiates the light-emitting diodes of the to-be-inspected region to generate a fir charge distribution, a first electric field distribution, or a first voltage distribution on the light-emitting diodes of the to-be-inspected region due to a photovoltaic effect caused by the illumination beam;

the sensing probe measures the first charge distribution, the first electric field distribution, or the first voltage distribution on the light-emitting diodes of the to-be-inspected region when the target distance between the sensing probe and the to-be-inspected region of the light-emitting diode wafer is kept;

the processing device determines a plurality of first electro-optical characteristics of the light-emitting diodes of the to-be-inspected region according to the first charge distribution, the first electric field distribution, or the first voltage distribution on the light-emitting diodes of the to-be-inspected region measured by the sensing probe;

the height measurement module measures a $n^{th}$ real-time distance between the photoelectric sensing structure of the sensing probe and a next to-be-inspected region of the light-emitting diode wafer, and the Z-axis translation stage adjusts a distance between the photoelectric sensing structure of the sensing probe and the next to-be-inspected region of the light-emitting diode wafer to the target distance according to the $n^{th}$ real-time distance;

the illumination beam simultaneously irradiates the light-emitting diodes of the next to-be-inspected region to generate a second charge distribution, a second electric field distribution, or a second voltage distribution on the light-emitting diodes of the next to-be-inspected region due to the photovoltaic effect caused by the illumination beam;

the sensing probe measures the second charge distribution, the second electric field distribution, or the second voltage distribution on the light-emitting diodes of the next to-be-inspected region when the target distance between the photoelectric sensing structure of the sensing probe and the next to-be-inspected region of the light-emitting diode wafer is kept; and the processing device determines a plurality of second electro-optical characteristics of the light-emitting diodes of the next to-be-inspected region according to the second charge distribution, the second electric field distribution, or the second voltage distribution on the light-emitting diodes of the next to-be-inspected region measured by the sensing probe.

21. The inspection apparatus according to claim 20, wherein a portion of an optical path of the sensing probe and a portion of an optical path of the height measurement module are substantially coaxial or parallel.

22. The inspection apparatus according to claim 20, further comprising:
a holder configured to hold the photoelectric sensing structure and provided with a plurality of air outlet holes disposed around the photoelectric sensing structure.

23. The inspection apparatus according to claim 22, further comprising:
a force deformation device, wherein the holder has a first portion and a second portion opposite to each other, the first portion of the holder holds the photoelectric sensing structure and has the air outlet holes disposed around the photoelectric sensing structure, and the second portion of the holder is suspended on the force deformation device.

24. The inspection apparatus according to claim 23, wherein the holder further comprises a third portion disposed between the first portion and the second portion, and the third portion has at least one air inlet hole.

* * * * *